United States Patent
Nosaka

(10) Patent No.: US 11,283,428 B2
(45) Date of Patent: Mar. 22, 2022

(54) RADIO FREQUENCY FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/746,996

(22) Filed: Jan. 20, 2020

(65) Prior Publication Data

US 2020/0153412 A1 May 14, 2020

Related U.S. Application Data

(63) Continuation of application No. PCT/JP2018/027433, filed on Jul. 23, 2018.

(30) Foreign Application Priority Data

Jul. 25, 2017 (JP) .............................. JP2017-143985

(51) Int. Cl.
*H03H 9/68* (2006.01)
*H03H 9/70* (2006.01)
(Continued)

(52) U.S. Cl.
CPC ............ *H03H 9/68* (2013.01); *H03H 7/0161* (2013.01); *H03H 9/145* (2013.01); *H03H 9/703* (2013.01); *H03H 9/72* (2013.01); *H03H 7/18* (2013.01)

(58) Field of Classification Search
CPC ................................................ H03H 9/64–725
See application file for complete search history.

(56) References Cited

U.S. PATENT DOCUMENTS 5,926,466 A * 7/1999 Ishida .................... H04B 1/006
370/280
6,242,843 B1 * 6/2001 Pohjonen ................ H01P 1/127
310/313 R (Continued)

FOREIGN PATENT DOCUMENTS

JP          8-321738 A    12/1996
JP    2004-166258 A     6/2004

(Continued)

OTHER PUBLICATIONS

International Search Report and Written Opinion dated Sep. 25, 2018 for PCT/JP2018/027433 filed on Jul. 23, 2018, 10 pages including English Translation of the International Search Report.

(Continued)

*Primary Examiner* — Dean O Takaoka
*Assistant Examiner* — Alan Wong
(74) *Attorney, Agent, or Firm* — Xsensus LLP

(57) ABSTRACT

A radio frequency (RF) filter having a first passband and including a first circuit connected to a first node and a second node disposed on a path that connects a first terminal and a second terminal, and a second circuit connected to the first node and the second node. The first circuit includes a first filter having a second passband that includes a portion of a frequency range of the first passband and a bandwidth narrower than a bandwidth of the first passband. The second circuit includes a second filter having a third passband that includes a portion of a frequency range of the first passband and has a bandwidth narrower than the bandwidth of the first passband. The RF filter also includes a first phase shifter connected to a first terminal of the second filter; and a second phase shifter connected to a second terminal of the second filter.

20 Claims, 37 Drawing Sheets

(51) Int. Cl.
  *H03H 7/01* (2006.01)
  *H03H 9/145* (2006.01)
  *H03H 9/72* (2006.01)
  *H03H 7/18* (2006.01)

(56) References Cited

U.S. PATENT DOCUMENTS

| | | | | |
|---|---|---|---|---|
| 6,724,278 | B1* | 4/2004 | Smith | H04B 1/406 |
| | | | | 333/133 |
| 7,242,268 | B2* | 7/2007 | Hagiwara | H03H 9/0571 |
| | | | | 333/133 |
| 8,742,870 | B2* | 6/2014 | Franzon | H01P 1/20 |
| | | | | 333/174 |
| 9,148,121 | B2* | 9/2015 | Inoue | H03H 9/14538 |
| 9,837,983 | B2* | 12/2017 | Xu | H03H 9/54 |
| 10,256,791 | B2* | 4/2019 | Tsutsumi | H03H 9/171 |
| 2020/0366272 | A1* | 11/2020 | Nosaka | H03H 9/703 |

FOREIGN PATENT DOCUMENTS

| | | |
|---|---|---|
| JP | 2005-184143 A | 7/2005 |
| JP | 2008-160629 A | 7/2008 |
| JP | 2014-039199 A | 2/2014 |
| JP | 2014-502803 A | 2/2014 |

OTHER PUBLICATIONS

English Translation of the Written Opinion of the International Search Authority dated Sep. 25, 2018 for PCT/JP2018/027433, 8 pages.

* cited by examiner

Comparative Example 1

Comparative Example 2

(a)

(b)

(c)

(a) Second band B3Rx SW1, SW2: On SW5, SW6: Off (b) Third band B39 SW1, SW2: Off SW5, SW6: On Example 4: First circuit vs. second-a circuit (when first-a band is selected)

Example 5

(a)
First band
B3Rx & B39
SW1, SW2: On
SW5, SW6: On (b)
Second band
B3Rx
SW1, SW2: On
SW5, SW6: Off (c)
Third band
B39
SW1, SW2: Off
SW5, SW6: On Frequency (GHz)

Example 6: First circuit vs. second circuit (when first-b band is selected)

RADIO FREQUENCY FILTER, MULTIPLEXER, RADIO FREQUENCY FRONT-END CIRCUIT, AND COMMUNICATION DEVICE

CROSS REFERENCE TO RELATED APPLICATIONS

This is a continuation application of PCT International Application No. PCT/JP2018/027433 filed on Jul. 23, 2018, designating the United States of America, which is based on and claims priority of Japanese Patent Application No. 2017-143985 filed on Jul. 25, 2017. The entire disclosures of the above-identified applications, including the specifications, drawings and claims are incorporated herein by reference in their entirety.

FIELD

The present disclosure relates to a radio frequency filter, a multiplexer, a radio frequency front-end circuit, and a communication device.

BACKGROUND

As a radio frequency filter having a wide bandwidth, a radio receiving circuit that includes a plurality of band-pass filters connected in parallel to one another and having different passbands, and switch elements connected to the plurality of band-pass filters connected in parallel has been known (for example, Japanese Unexamined Patent Application Publication No. 2008-160629). According to the configuration of the radio receiving circuit, when the switch elements are conducting (on), the plurality of band-pass filters whose passbands have different frequencies are allowed to be connected in parallel to form a circuit, thus achieving a filter having a wider bandwidth.

SUMMARY

Technical Problem

However, in the configuration disclosed in Japanese Unexamined Patent Application Publication No. 2008-160629, when a filter having a wide bandwidth and consisting of the plurality of band-pass filters is selected by making the switch elements conducting, a passband includes a noticeable ripple (insertion loss deviation), which raises a problem that insertion loss in the passband increases.

In view of this, the present disclosure is to provide a radio frequency filter having a low-loss wide passband in which a ripple (insertion loss deviation) is decreased, a multiplexer, a radio frequency front-end circuit, and a communication device.

Solution to Problem

In order to provide such a filter, a radio frequency filter according to an aspect of the present disclosure is a radio frequency filter having a first passband. The radio frequency filter includes a first circuit connected to a first node disposed on a path that connects a first input/output terminal and a second input/output terminal, and a second node disposed between the first node on the path and the second input/output terminal; and a second circuit connected to the first node and the second node. The first circuit includes a first filter having a second passband that includes a portion of a frequency range of the first passband and a bandwidth narrower than a bandwidth of the first passband. The second circuit includes a second filter having a third passband that includes a portion of a frequency range of the first passband and has a bandwidth narrower than the bandwidth of the first passband; a first phase shifter connected to a first terminal of the second filter; and a second phase shifter connected to a second terminal of the second filter.

When the first filter and the second filter are disposed in parallel between the first node and the second node, and a combined circuit of the first filter and the second filter achieves a radio frequency filter having a passband that is a first band having a wide width, a ripple is assumed to occur in the first band due to an amplitude difference, a phase shift difference, and an impedance difference of the two filters.

To address this, according to the above configuration, the first phase shifter and the second phase shifter are disposed at the sides of the second filter, and thus a phase shift difference and impedance can be adjusted in accordance with the amplitude difference between the two filters. Accordingly, while the first band is used as a passband, a radio frequency filter having a low-loss wide passband in which a ripple is decreased can be achieved.

When the second circuit alone is viewed from at least one of the first node or the second node, a phase shift caused by the first phase shifter and a phase shift caused by the second phase shifter may be adjusted to include, in a range from a lower edge frequency of the second band to a lower cutoff frequency of the passband of the second filter, a frequency at which impedance is highest out of frequencies at singular points at each of which the second circuit has local maximum impedance.

Accordingly, a radio frequency filter having a low-loss wide first band in which a ripple is decreased can be achieved.

When the second circuit alone is viewed from at least one of the first node or the second node, the second band may include at least one frequency at which a phase shift caused by the first circuit and a phase shift caused by the second circuit are identical, and the third band may include at least one frequency at which a phase shift caused by the first circuit and a phase shift caused by the second circuit are identical.

Accordingly, a radio frequency filter having a low-loss wide first band in which a ripple is decreased can be achieved.

A phase shift caused by the first phase shifter and a phase shift caused by the second phase shifter may be adjusted to cause a sum total to be at least 312° and at most 362° at a lower edge frequency of the third band, the sum total being a total of (i) a difference between a phase shift caused by the first filter and a phase shift caused by the second filter and (ii) a sum of the phase shift caused by the first phase shifter and the phase shift caused by the second phase shifter.

Accordingly, a radio frequency filter having a low-loss wide first band in which a ripple is decreased can be achieved.

The path may include: a first path that extends through the first node, the first circuit, and the second node; and a second path that extends through the first node, the second circuit, and the second node. The first filter may include: a first series-arm circuit disposed on the first path; and a first parallel-arm circuit connected to a node on the first path and a ground. The second filter may include: a second series-arm circuit disposed on a portion of the second path that connects the first phase shifter and the second phase shifter; and a second parallel-arm circuit connected to a node on the portion of the second path and the ground. One or more of the first series-arm circuit, the first parallel-arm circuit, the second series-arm circuit, and the second parallel-arm circuit may include one or more acoustic wave resonators. At least one of the one or more acoustic wave resonators may include: an interdigital transducer (IDT) electrode formed on a piezoelectric substrate; and a reflector. When λ denotes a wavelength of an acoustic wave determined by a cyclic pattern of the IDT electrode in the at least one of the one or more acoustic wave resonators, a pitch between the IDT electrode and the reflector may be at least 0.42λ and less than 0.50λ.

The acoustic wave resonator that includes an IDT electrode and a reflector has a cyclic structure in which electrode fingers are arranged cyclically, and a frequency band in which surface acoustic waves in a specific frequency region are reflected with a high reflection coefficient. This frequency band is generally referred to as a stopband, and is determined by a repeating cycle of the cyclic structure, for instance. At this time, a ripple that is a locally increasing reflection coefficient occurs at the higher edge of the stopband. Furthermore, if the pitch between the IDT electrode and the reflector (I-R pitch) is at least 0.5λ, a ripple at the higher edge of the stopband increases, a ripple in the passband of the filter increases, and insertion loss increases. On the other hand, a ripple at the higher edge of the stopband can be decreased by setting the I-R pitch to at least 0.42λ and less than 0.50λ. From the above viewpoint, insertion loss in the passband of the radio frequency filter can be decreased by setting the I-R pitch to at least 0.42λ and less than 0.50λ.

The first circuit further may include: a first switch element connected between the first node and the first filter; and a second switch element connected between the second node and the first filter. The first band and the third band may be switched by switching between conducting and non-conducting states of the first switch element and the second switch element.

Accordingly, a frequency-tunable radio frequency filter (tunable filter) that can switch between the first band and the third band can be achieved by switching between the conducting and non-conducting states of the first switch element and the second switch element.

The first circuit may further include: a third switch element connected between a ground and a connection node between the first switch element and the first filter; and a fourth switch element connected between the ground and a connection node between the second switch element and the first filter. The first switch element and the third switch element may be switched between conducting and non-conducting states mutually exclusively from each other. The second switch element and the fourth switch element may be switched between conducting and non-conducting states mutually exclusively from each other.

Accordingly, a ripple in the passband (third band) can be decreased when the band is switched to the third band, and also attenuation characteristics on the passband low-frequency side can be improved.

The second circuit may further include: a fifth switch element connected between the first node and the first phase shifter; and a sixth switch element connected between the second node and the second phase shifter. The first band and the second band may be switched by switching between conducting and non-conducting states of the fifth switch element and the sixth switch element.

Accordingly, a frequency-tunable radio frequency filter (tunable filter) that can switch between the first band and the second band can be achieved by switching between the conducting and non-conducting states of the fifth switch element and the sixth switch element.

The second circuit further may include: a seventh switch element connected between a ground and a connection node between the fifth switch element and the first phase shifter; and an eighth switch element connected between the ground and a connection node between the sixth switch element and the second phase shifter. The fifth switch element and the seventh switch element may be switched between conducting and non-conducting states mutually exclusively from each other. The sixth switch element and the eighth switch element may be switched between conducting and non-conducting states mutually exclusively from each other.

Accordingly, a ripple in the passband (second band) can be decreased when the band is switched to the second band, and also attenuation characteristics on the passband low-frequency side can be improved.

The radio frequency filter may further include: a third circuit connected to the first node and the second node. The third circuit may include: a third filter having a passband that is a fifth band, the fifth band including a portion of a frequency range of a fourth band that is different from the first band, having a bandwidth narrower than a bandwidth of the fourth band, having a higher frequency range than a center frequency of the second band, and being different from the third band; a third phase shifter connected to one terminal of the third filter; and a fourth phase shifter connected to an other terminal of the third filter.

Accordingly, this increases variations of switching between passbands.

The first phase shifter may be one of: a low-pass filter circuit that includes one or more inductors disposed on a series-arm path that connects the first node and the one terminal of the second filter, and a capacitor connected between a node on the series-arm path and a ground; and a high-pass filter circuit that includes one or more capacitors disposed on the series-arm path, and an inductor connected to a node on the series-arm path and the ground.

Thus, according to the attenuation characteristics that the filter is to have, a circuit configuration of the first phase shifter can be selected as appropriate from among a low-pass filter circuit and a high-pass filter circuit.

The second phase shifter may be one of: a low-pass filter circuit that includes one or more inductors disposed on a series-arm path that connects the second node and the other terminal of the second filter, and a capacitor connected to a node on the series-arm path and a ground; and a high-pass filter circuit that includes one or more capacitors disposed on the series-arm path, and an inductor connected to a node on the series-arm path and the ground.

Accordingly, according to the attenuation characteristics that the filter is to have, a circuit configuration of the second phase shifter can be selected as appropriate from among a low-pass filter circuit and a high-pass filter circuit.

The first phase shifter and the second phase shifter may be impedance elements each including at least one of a capacitor or an inductor.

Accordingly, the circuit configuration of a radio frequency filter can be simplified and miniaturized.

At least one of the first filter or the second filter may include: a series-arm circuit disposed on a portion of the path that connects the first node and the second node; and a parallel-arm circuit connected to a node on the portion of the path and a ground. At least one of the series-arm circuit or the parallel-arm circuit may include a resonator and a ninth switch element. At least one of a resonant frequency or an antiresonant frequency of at least one of the series-arm circuit or the parallel-arm circuit may be switched to another frequency by switching between conducting and non-conducting states of the ninth switch element.

Accordingly, this increases variations of switching between passbands.

At least one of the first filter or the second filter may be one of a surface acoustic wave filter, a boundary acoustic wave filter, and an acoustic wave filter that uses a bulk acoustic wave (BAW).

Accordingly, a radio frequency filter with high selectivity can be achieved.

At least one of the first filter or the second filter may include a longitudinally coupled resonator.

Accordingly, steepness increases and also the attenuation can be increased on the passband low-frequency side.

A phase shift caused by the first phase shifter may be different from a phase shift caused by the second phase shifter.

A multiplexer according to an aspect of the present disclosure includes: a plurality of filters that include the radio frequency filter described above, and input terminals or output terminals of the plurality of filters are directly or indirectly connected to a common terminal.

Accordingly, a multiplexer that includes a radio frequency filter having a low-loss wide passband in which a ripple is decreased can be achieved.

A radio frequency front-end circuit according to an aspect of the present disclosure includes: the radio frequency filter described above or the multiplexer described above; and an amplifier circuit directly or indirectly connected to the radio frequency filter or the multiplexer.

Accordingly, a radio frequency front-end circuit that includes a radio frequency filter having a low-loss wide passband in which a ripple is decreased can be achieved.

A communication device according to an aspect of the present disclosure includes: a radio frequency (RF) signal processing circuit that processes a radio frequency signal to be transmitted by an antenna element and a radio frequency signal received by the antenna element; and the above-described radio frequency front-end circuit that conveys the radio frequency signals between the antenna element and the RF signal processing circuit.

Accordingly, a radio frequency filter having a low-loss wide passband in which a ripple is decreased can be achieved.

Advantageous Effects

According to the present disclosure, a radio frequency filter having a low-loss wide passband in which a ripple (insertion loss deviation) is decreased, a multiplexer, a radio frequency front-end circuit, and a communication device can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
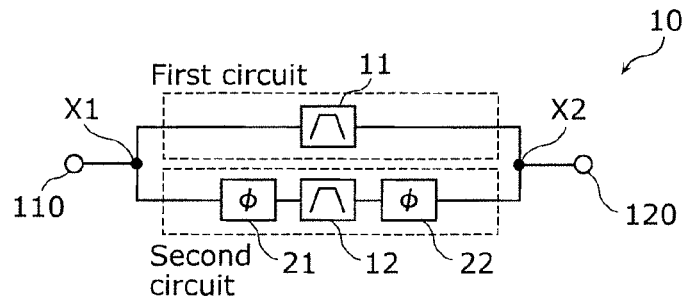
FIG. 1A is a circuit block diagram illustrating a radio frequency filter according to Embodiment 1.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any of the independent claims are described as arbitrary elements. In addition, the sizes of elements and the ratios of the sizes illustrated in the drawings are not necessarily accurate. Throughout the drawings, the same numeral is given to substantially the same element, and redundant description is omitted or simplified. Constants of circuit elements such as resonators may be adjusted as appropriate according to, for instance, requirement specification. Accordingly, even if circuit elements have the same reference numeral, constants thereof may be different.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm (resonant) circuit and a parallel-arm (resonant) circuit in the following embodiments are defined as follows.

A parallel-arm (resonant) circuit is disposed between the ground and a node on a path that connects a first input/output terminal and a second input/output terminal.

A series-arm (resonant) circuit is disposed between the first input/output terminal or the second input/output terminal and a node on the path connected with the parallel-arm (resonant) circuit, or between a node on the path connected with one parallel-arm (resonant) circuit and another node on the path connected with another parallel-arm (resonant) circuit.

In the following, a "passband low-frequency edge" means "the lowest frequency in a passband". A "passband high-frequency edge" means "the highest frequency in a passband". In the following, a "passband low-frequency side" means "a lower-frequency side relative to a passband, which is outside the passband". A "passband high-frequency side" means "a higher-frequency side relative to a passband, which is outside the passband".

Embodiment 1

[1.1 Basic Configuration of Radio Frequency Filter 10 According to Embodiment 1]

FIG. 1A is a circuit block diagram illustrating radio frequency filter 10 according to Embodiment 1. Radio frequency filter 10 illustrated in FIG. 1A includes filters 11 and 12, phase shifters 21 and 22, and input/output terminals 110 and 120.

Filter 11 is a first filter included in a first circuit. The first circuit is connected to node X1 (first node) disposed on a path that connects input/output terminal 110 (first input/output terminal) and input/output terminal 120 (second input/output terminal), and to node X2 (second node) disposed between node X1 and input/output terminal 120.

Filter 12 is a second filter that constitutes a second circuit, together with, for instance, phase shifters 21 and 22. The second circuit is connected to nodes X1 and X2.

Phase shifter 21 is a first phase shifter connected to one terminal of filter 12. Phase shifter 22 is a second phase shifter connected to another terminal of filter 12. Stated differently, phase shifter 21, filter 12, and phase shifter 22 are connected in series in the stated order between nodes X1 and X2.

Figure 1B:
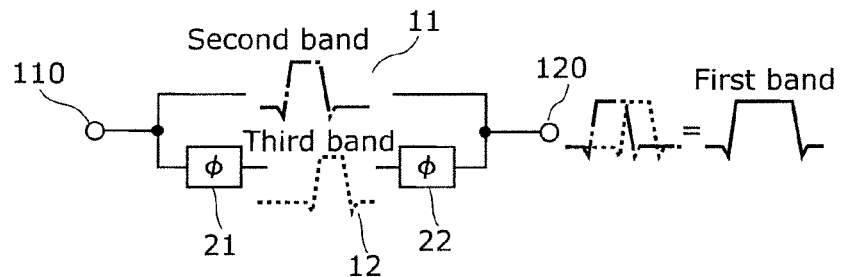
FIG. 1B illustrates a concept of increasing a bandwidth of the radio frequency filter according to Embodiment 1.

FIG. 1B illustrates a concept of increasing a bandwidth of radio frequency filter 10 according to Embodiment 1. FIG. 1B conceptually illustrates passbands of filters 11 and 12 and radio frequency filter 10. The passband of radio frequency filter 10 is a first band having a wide width. The passband of filter 11 is a second band that includes a portion of a frequency range of the first band, and has a narrower bandwidth than that of the first band. The passband of filter 12 is a third band that includes a portion of a frequency range of the first band, having a narrower bandwidth than that of the first band, and having a higher frequency range than the center frequency of the second band.

Note that the first band is defined to be a single band having continuous frequencies, rather than a band made up of discrete bands.

[1.2 Configuration of Radio Frequency Filter 10A According to Example 1]

Figure 2:
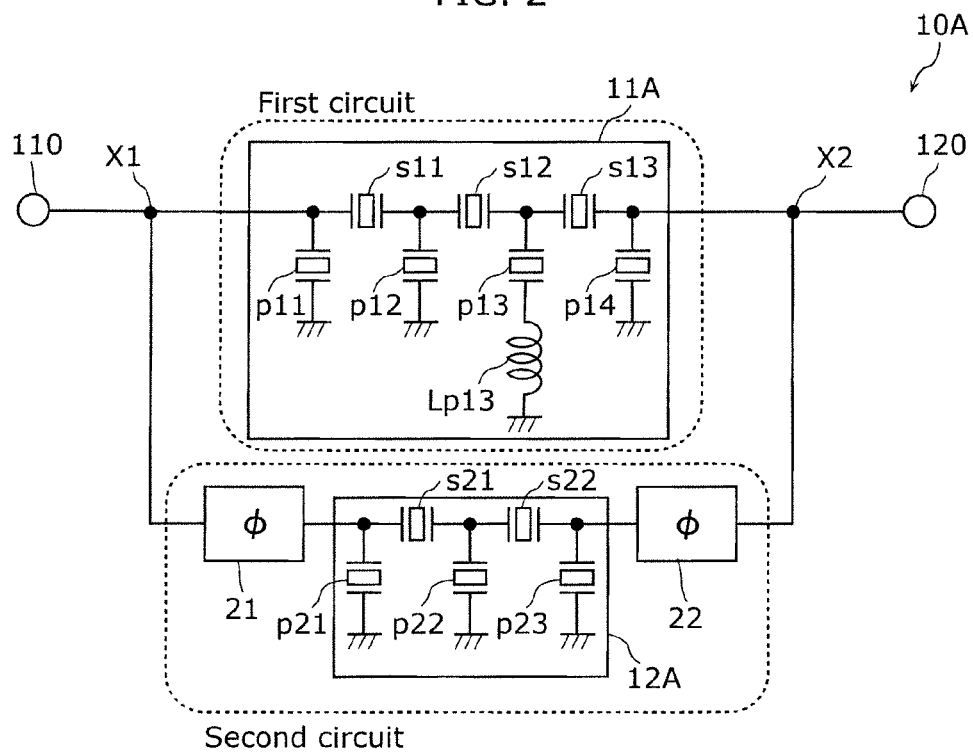
FIG. 2 illustrates a circuit configuration of a radio frequency filter according to Example 1.

FIG. 2 illustrates a circuit configuration of radio frequency filter 10A according to Example 1. Radio frequency filter 10A illustrated in FIG. 2 includes filters 11A and 12A, phase shifters 21 and 22, and input/output terminals 110 and 120. Radio frequency filter 10A is a specific example of a circuit configuration of radio frequency filter 10 according to Embodiment 1, filter 11A is a specific example of a circuit configuration of filter 11, and filter 12A is a specific example of a circuit configuration of filter 12.

Filter 11A includes series-arm resonators s11, s12, and s13 disposed on a first path that connects nodes X1 and X2, parallel-arm resonators p11, p12, p13, and p14 each disposed between a node on the first path and the ground, and inductor Lp13 connected to parallel-arm resonator p13 and the ground. Accordingly, this makes filter 11A a ladder bandpass filter.

Filter 12A includes series-arm resonators s21 and s22 disposed on a second path that connects nodes X1 and X2, and parallel-arm resonators p21, p22, and p23 each disposed between a node on the second path and the ground. Accordingly, this makes filter 12A a ladder bandpass filter.

Table 1 shows circuit parameters of radio frequency filter 10A according to Example 1.

TABLE 1

| Example 1 | | Resonant frequency (MHz) | Antiresonant frequency fa (MHz) | Resonance fractional BW (%) | Electrostatic cap C0 (pF) | L (nH) | Phase shift (°) |
|---|---|---|---|---|---|---|---|
| Filter 11A | s11 | 1848.2 | 1912.9 | 3.5 | 1.45 | | |
| | s12 | 1862.0 | 1927.2 | 3.5 | 1.59 | | |
| | s13 | 1855.1 | 1920.0 | 3.5 | 0.74 | | |
| | p11 | 1784.2 | 1846.6 | 3.5 | 0.85 | | |
| | p12 | 1771.4 | 1833.4 | 3.5 | 1.24 | | |
| | p13 | 1793.0 | 1855.7 | 3.5 | 3.29 | | |
| | p14 | 1782.4 | 1844.7 | 3.5 | 1.15 | | |
| | Lp13 | | | | | 1.50 | |
| Filter 12A | s21 | 1879.1 | 1944.8 | 3.5 | 2.67 | | |
| | s22 | 1890.6 | 1956.8 | 3.5 | 2.49 | | |
| | p21 | 1821.2 | 1885.0 | 3.5 | 6.60 | | |
| | p22 | 1827.0 | 1891.0 | 3.5 | 3.64 | | |
| | p23 | 1820.3 | 1884.0 | 3.5 | 6.16 | | |
| Phase shifter 21 | | | | | | | 98.9 |
| Phase shifter 22 | | | | | | | 98.1 |

Radio frequency filter 10 according to Embodiment 1 and radio frequency filter 10A according to Example 1 have a configuration in which phase shifter 21 is disposed at one side of the second filter, and phase shifter 22 is disposed at the other side of the second filter. In the following, a feature and a problem of a radio frequency filter according to a comparative example are to be described first, in order to describe features and advantageous effects of the configuration of the present disclosure.

[1.3 Circuit Configuration and Filter-Characteristics of Radio Frequency Filter According to Comparative Example]

Figure 3A:
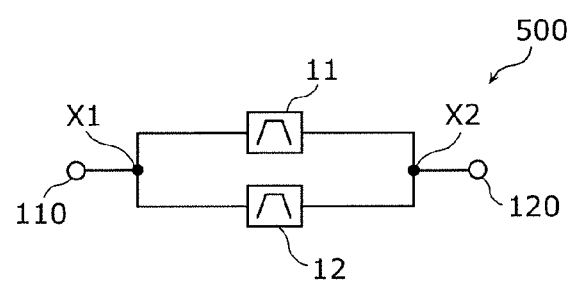
FIG. 3A is a circuit block diagram of a radio frequency filter according to Comparative Example 1.
Figure 3B:
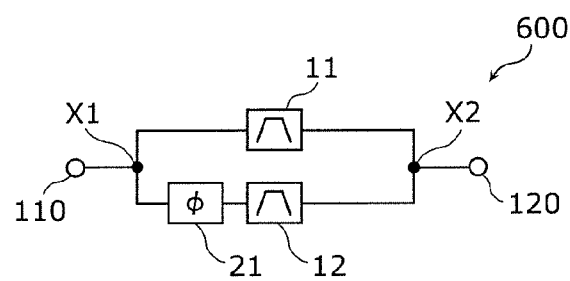
FIG. 3B is a circuit block diagram of a radio frequency filter according to Comparative Example 2.

FIG. 3A is a circuit block diagram of radio frequency filter 500 according to Comparative Example 1. FIG. 3B is a circuit block diagram of radio frequency filter 600 according to Comparative Example 2.

Radio frequency filter 500 according to Comparative Example 1 illustrated in FIG. 3A includes filters 11 and 12, and input/output terminals 110 and 120. Radio frequency filter 500 illustrated in FIG. 3A is different from radio frequency filter 10 according to the embodiment only in that phase shifters 21 and 22 are not disposed in the configuration. Note that filters 11 and 12 included in radio frequency filter 500 have the same configuration as those of filters 11 and 12 included in radio frequency filter 10. The passband of filter 11 of radio frequency filter 500 is the second band, and the passband of filter 12 of radio frequency filter 500 is the third band.

Radio frequency filter 600 according to Comparative Example 2 illustrated in FIG. 3B includes filters 11 and 12, phase shifter 21, and input/output terminals 110 and 120. Radio frequency filter 600 according to Comparative Example 2 illustrated in FIG. 3B is different from radio frequency filter 10 according to the embodiment only in that phase shifter 22 is not disposed in the configuration. Note that filters 11 and 12 included in radio frequency filter 600 have the same configuration as those of filters 11 and 12 included in radio frequency filter 10. The passband of filter 11 of radio frequency filter 500 is the second band, and the passband of filter 12 of radio frequency filter 500 is the third band.

In the following, the radio frequency filters according to Example 1, Comparative Example 1, and Comparative Example 2 have the second band that is the long term evolution (LTE) Band 3 receiving passband (1805 to 1880 MHz), the third band that is the LTE Band 39 passband (1880 to 1920 MHz), and the first band that is a combination of the Band 3 receiving passband and the Band 39 passband (1805 to 1920 MHz).

Figure 4A:
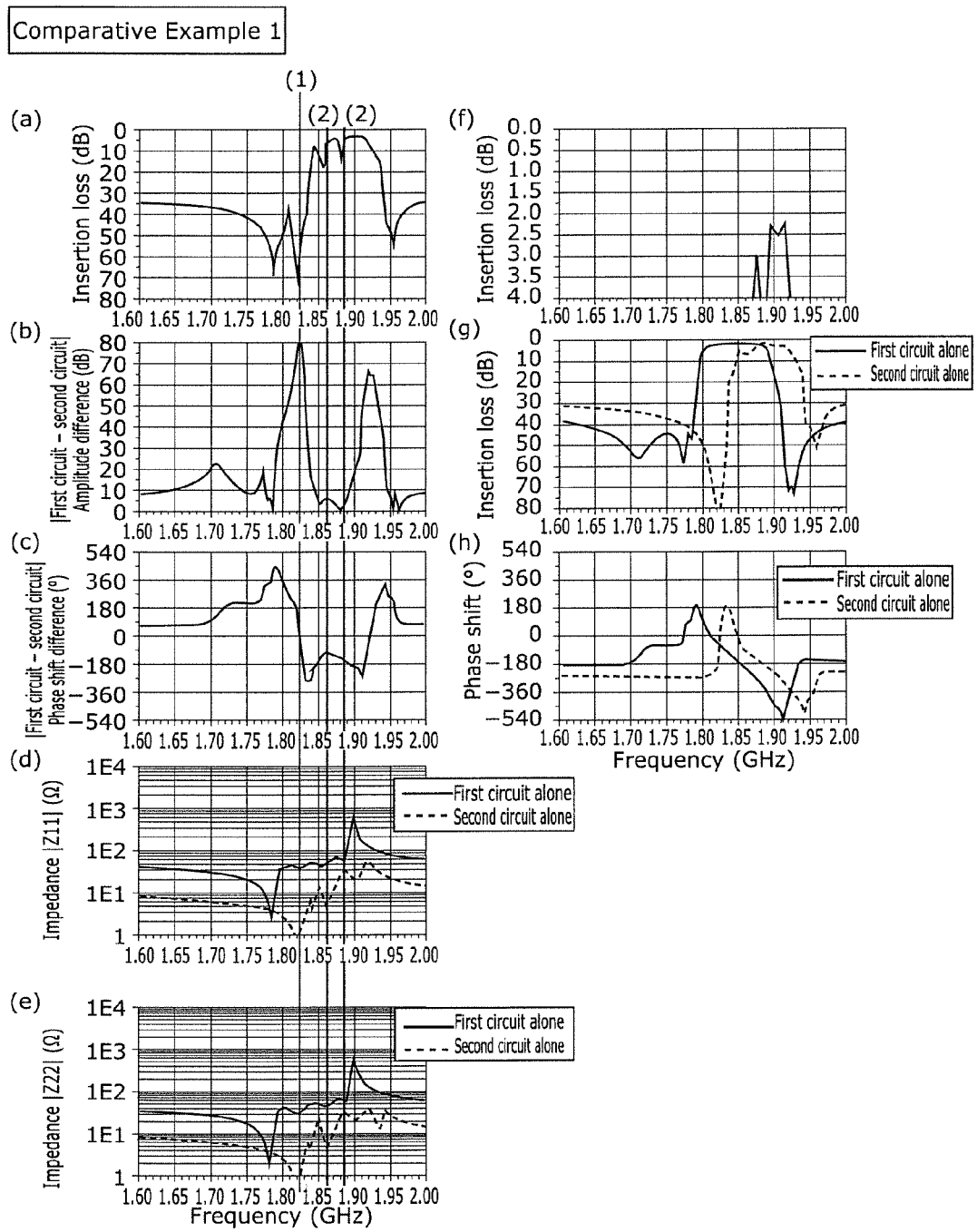
FIG. 4A illustrates graphs showing passing characteristics, amplitude characteristics, phase shift characteristics, and impedance characteristics of the radio frequency filter according to Comparative Example 1.

FIG. 4A illustrates graphs showing passing characteristics, amplitude characteristics, phase shift characteristics, and impedance characteristics of radio frequency filter 500 according to Comparative Example 1. Parts (a) and (f) of FIG. 4A illustrate passing characteristics of radio frequency filter 500. Parts (b) and (c) of FIG. 4A illustrate an amplitude difference between and a difference between phase shifts caused by the first circuit alone between nodes X1 and X2 and the second circuit alone between nodes X1 and X2, respectively. Part (d) of FIG. 4A illustrates impedance characteristics when the first circuit alone and the second circuit alone are viewed from node X1. Part (e) of FIG. 4A illustrates impedance characteristics when the first circuit alone and the second circuit alone are viewed from node X2. Part (g) of FIG. 4A illustrates passing characteristics of the first circuit alone and the second circuit alone between nodes X1 and X2. Part (h) of FIG. 4A illustrates phase shift characteristics of the first circuit alone and the second circuit alone between nodes X1 and X2.

Note that in the present embodiment and subsequent embodiments, "impedance" of a circuit indicates impedance when a signal is reflected, and a "phase shift" caused by a circuit represents the amount of phase shift when a signal passes through the circuit.

First, as illustrated in (a) of FIG. 4A, in radio frequency filter 500 according to Comparative Example 1, a great ripple (insertion loss deviation) appears in the first band that is the passband, resulting in an increase in insertion loss in the first band. The main causes of such a ripple include the following two.

(1) At the frequency ((1) in FIG. 4A) at which the attenuation pole on the passband low-frequency side of filter 12A appears, the impedance of filter 12A (second circuit) is lower than the impedance of filter 11A, as illustrated in (d) and (e) of FIG. 4A. At the frequency at which the attenuation pole appears, amplitudes of the first circuit and the second circuit are greatly different as illustrated in (b) of FIG. 4A. Due to these, a radio frequency signal having such a frequency at which the attenuation pole appears flows from filter 12A of the second circuit (through a parallel-arm resonator) into the ground. Accordingly, a ripple is caused to occur in the first band at the frequency which is included in the first band of radio frequency filter 500 and at which the attenuation pole appears.

(2) At two frequencies ((2) in FIG. 4A) included in the first band, the difference between the phase shifts caused by filter 11A (first circuit) and filter 12A (second circuit) is −180° as illustrated in (c) of FIG. 4A. As illustrated in (b) of FIG. 4A, at the two frequencies, the amplitude difference between filter 11A (first circuit) and filter 12A (second circuit) is substantially 0 dB. Thus, at the two frequencies included in the first band, filter 11A (first circuit) and filter 12A (second circuit) have opposite phase shifts and the same amplitude. Accordingly, radio frequency signals having the above two frequencies included in the first band cancel each other out after passing through the first circuit and the second circuit. Accordingly, ripples are caused to occur in the first band at the two frequencies included in the first band of radio frequency filter 500.

Figure 4B:
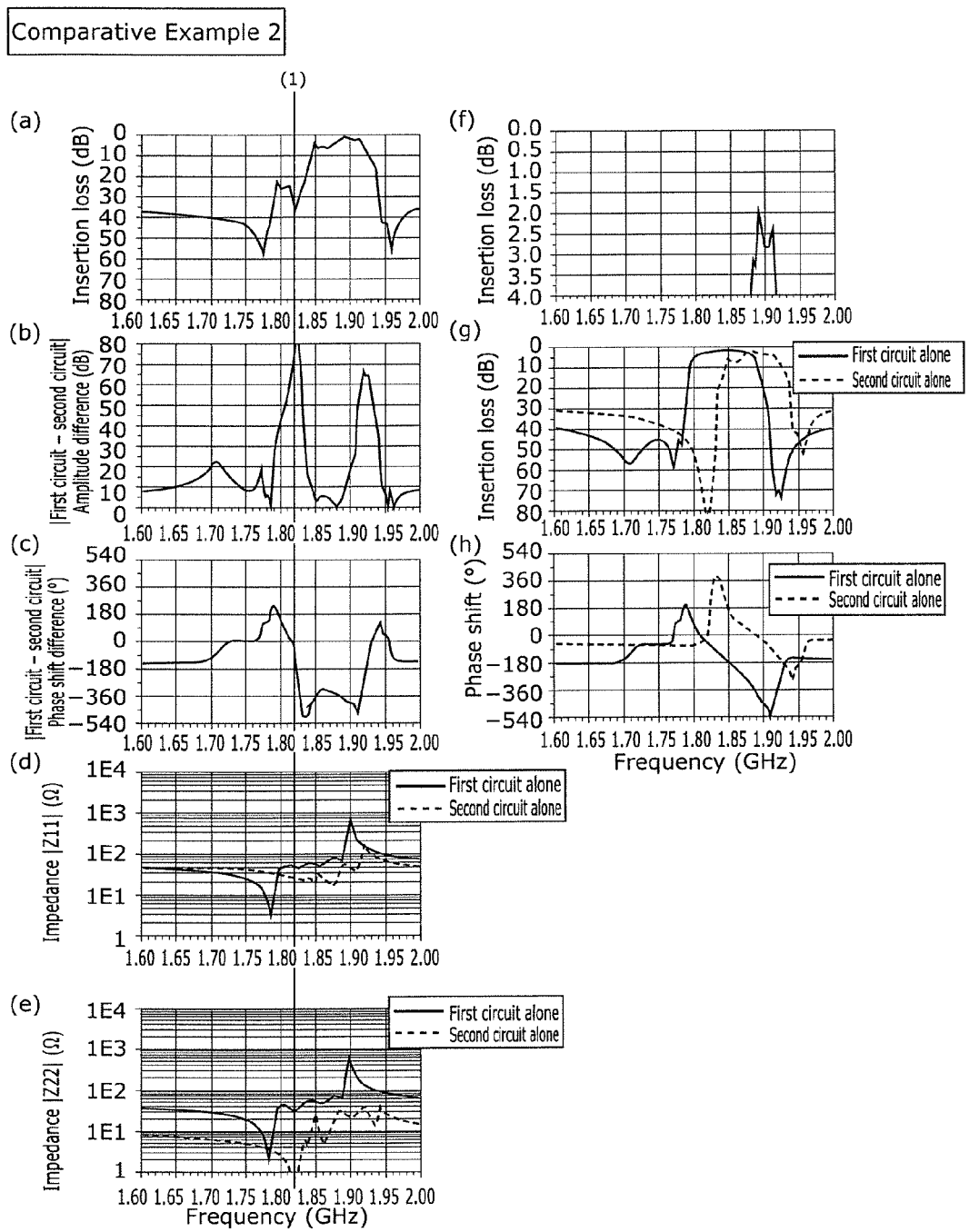
FIG. 4B illustrates graphs showing passing characteristics, amplitude characteristics, phase shift characteristics, and impedance characteristics of the radio frequency filter according to Comparative Example 2.

FIG. 4B illustrates graphs showing passing characteristics, amplitude characteristics, phase shift characteristics, and impedance characteristics of radio frequency filter 600 according to Comparative Example 2. Parts (a) and (f) of FIG. 4B illustrate passing characteristics of radio frequency filter 600. Parts (b) and (c) of FIG. 4B illustrate an amplitude difference between and a difference between phase shifts caused by the first circuit alone between nodes X1 and X2 and the second circuit alone between nodes X1 and X2, respectively. Part (d) of FIG. 4B illustrates impedance characteristics when the first circuit alone and the second circuit alone are viewed from node X1. Part (e) of FIG. 4B illustrates impedance characteristics when the first circuit alone and the second circuit alone are viewed from node X2. Part (g) of FIG. 4B illustrates passing characteristics of the first circuit alone and the second circuit alone between nodes X1 and X2. Part (h) of FIG. 4B illustrates phase shift characteristics of the first circuit alone and the second circuit alone between nodes X1 and X2.

As illustrated in (a) of FIG. 4B, in radio frequency filter 600 according to Comparative Example 2, a great ripple (insertion loss deviation) appears in the first band that is a passband, resulting in an increase in insertion loss in the first band. In radio frequency filter 600 according to Comparative Example 2, phase shifter 21 is disposed, and thus the ripples as seen in radio frequency filter 500 according to Comparative Example 1 due to (2) above are decreased, yet a ripple due to (1) below has occurred.

(1) At a frequency ((1) in FIG. 4B) at which the attenuation pole on the passband low-frequency side of filter 12A appears, impedance |Z22| viewed from node X2 of filter 12A (second circuit) is low as illustrated in (e) of FIG. 4B. At the frequency at which the attenuation pole appears, the first circuit and the second circuit have a great amplitude difference as illustrated in (b) of FIG. 4B. Due to these, a radio frequency signal having the frequency at which the attenuation pole appears flows from filter 12A of the second circuit (through a parallel-arm resonator) into the ground. Accordingly, a ripple is caused to occur in the first band at the frequency in the first band of radio frequency filter 600 at which the attenuation pole appears.

[1.4 Filter Characteristics of Radio Frequency Filter 10A According to Example 1]

Figure 5:
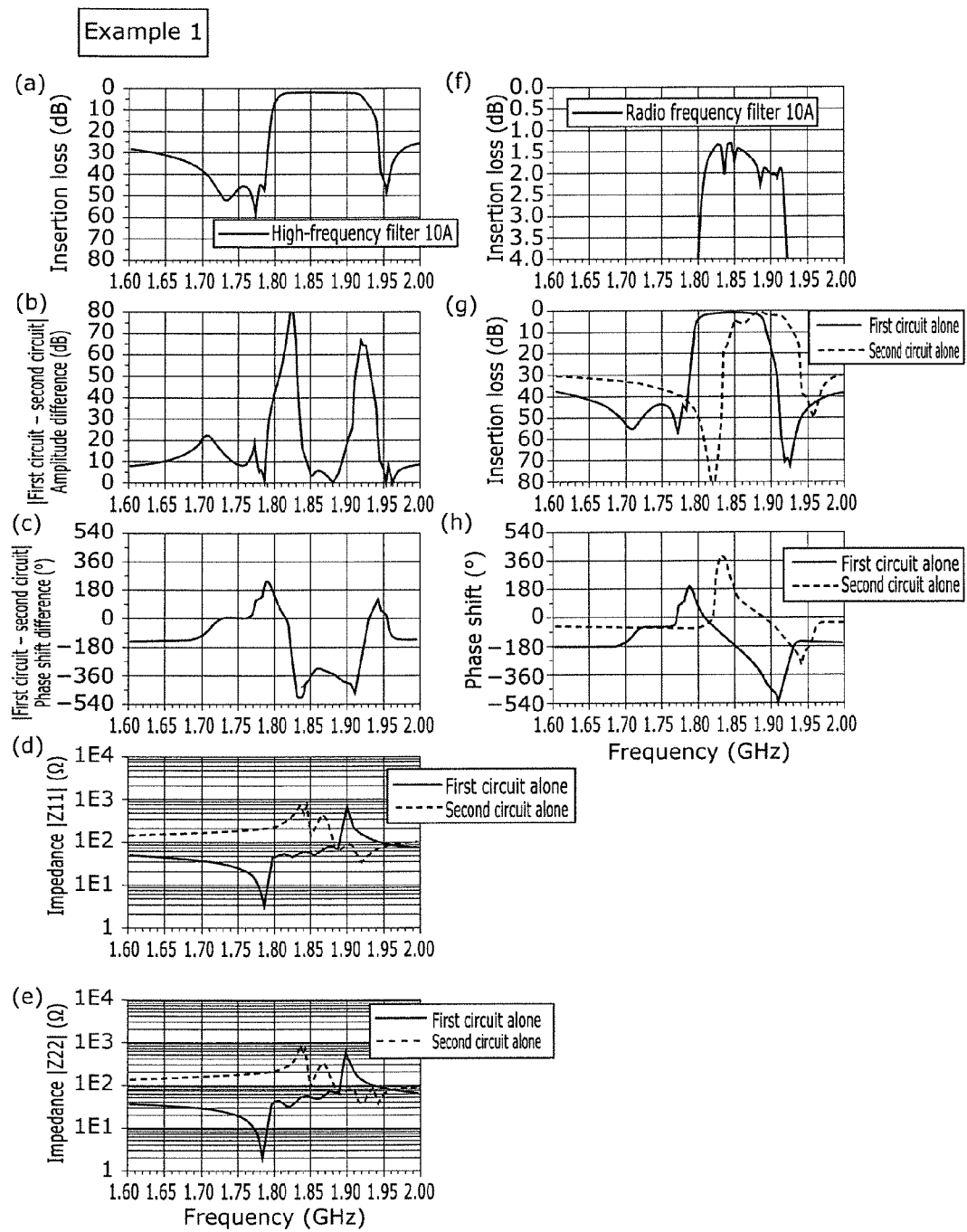
FIG. 5 illustrates graphs showing passing characteristics, amplitude characteristics, phase shift characteristics, and impedance characteristics of the radio frequency filter according to Example 1.

FIG. 5 illustrates graphs showing passing characteristics, amplitude characteristics, phase shift characteristics, and impedance characteristics of radio frequency filter 10A according to Example 1. Parts (a) and (f) of FIG. 5 illustrate passing characteristics of radio frequency filter 10A. Parts (b) and (c) of FIG. 5 illustrate an amplitude difference between and a difference between phase shifts caused by the first circuit alone between nodes X1 and X2 and the second circuit alone between nodes X1 and X2, respectively. Part (d) of FIG. 5 illustrates impedance characteristics when the first circuit alone and the second circuit alone are viewed from node X1. Part (e) of FIG. 5 illustrates impedance characteristics when the first circuit alone and the second circuit alone are viewed from node X2. Part (g) of FIG. 5 illustrates passing characteristics of the first circuit alone and the second circuit alone between nodes X1 and X2. Part (h) of FIG. 5 illustrates phase shift characteristics of the first circuit alone and the second circuit alone between nodes X1 and X2.

Phase shifters 21 and 22 are connected to the input/output terminals of filter 12A (located upstream and downstream) as in radio frequency filter 10A according to Example 1, and thus a ripple is decreased in the first band that is a passband of radio frequency filter 10A as illustrated in (a) and (f) of FIG. 5, so that insertion loss decreases.

The following describes a factor that radio frequency filter 10A according to Example 1 decreases a ripple in the passband and insertion loss in the passband, as compared with radio frequency filter 500 according to Comparative Example 1 and radio frequency filter 600 according to Comparative Example 2.

Figure 6:
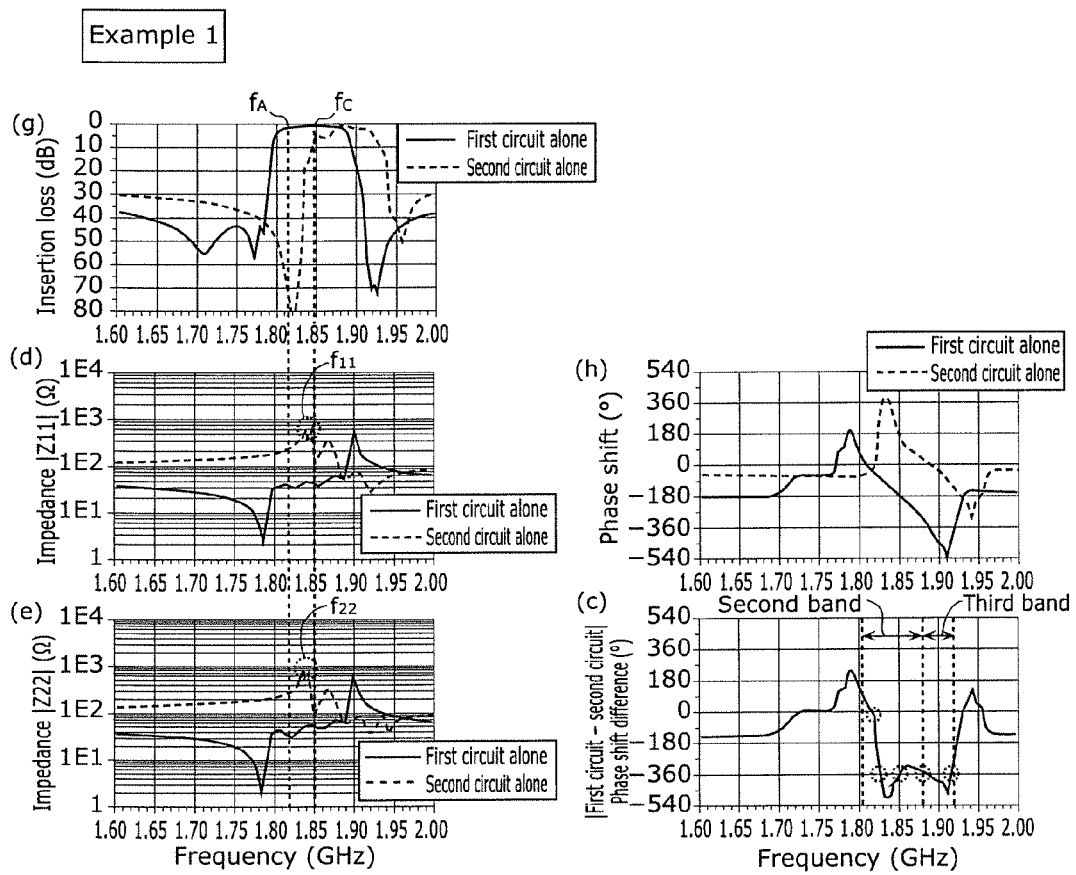
FIG. 6 illustrates graphs for describing a factor of increasing the bandwidth of the radio frequency filter according to Example 1.

FIG. 6 illustrates graphs for describing a factor of increasing the bandwidth of radio frequency filter 10A according to Example 1. In order to describe the factor, FIG. 6 illustrates (c), (d), (e), (g), and (h) of FIG. 5.

In radio frequency filter 10A according to Example 1, the phase shifts caused by phase shifters 21 and 22 are adjusted to include, in a frequency range from lower edge frequency $f_A$ of the second band to lower cutoff frequency $f_C$ of the passband of filter 12A, frequency $f_{11}$ at which impedance $|Z11|$ when the second circuit alone is viewed from node X1 is highest out of frequencies at singular points at each of which impedance $|Z11|$ has a local maximum value. Further, the phase shifts caused by phase shifters 21 and 22 are adjusted to include, in a frequency range from lower edge frequency $f_A$ of the second band to lower cutoff frequency $f_C$ of the passband of filter 12A, frequency $f_{22}$ at which impedance $|Z22|$ when the second circuit alone is viewed from node X2 is highest out of frequencies at singular points at each of which impedance $|Z22|$ has a local maximum value.

Note that a lower cutoff frequency of the passband of a filter is a frequency closest to the passband low-frequency edge of the filter, out of frequencies on the passband low-frequency side, at each of which insertion loss is a result of increasing insertion loss at the passband low-frequency edge by predetermined insertion loss. In the present embodiment and subsequent embodiments, a lower cutoff frequency of a passband is defined to be a frequency on the passband low-frequency side, at which insertion loss is a result of increasing the insertion loss at the passband low-frequency edge by 10 dB.

A change in phase shift is great at frequency $f_A$ of the attenuation pole of filter 12A, and an amplitude difference between filters 11A and 12A increases with an increase in a difference between phase shifts caused thereby. Accordingly, by adjusting phase shifts caused by phase shifters 21 and 22, a frequency at a singular point at which the second circuit has local maximum impedance is adjusted within a frequency range from lower edge frequency $f_A$ of the second band to lower cutoff frequency $f_C$ of the passband of filter 12A, thus preventing, as much as possible, a radio frequency signal having a frequency in the frequency range from flowing into filter 12A of the second circuit. Specifically, a signal can be prevented, as much as possible, from sneaking into the second circuit in a frequency band in which a signal passing through a signal passing through the second circuit is attenuated. Accordingly, the factor in (1) above seen in Comparative Examples 1 and 2 can be eliminated, and thus a ripple in the first band of radio frequency filter 10A can be decreased.

Note that similarly, the amplitude difference and the phase shift difference between filter 11A and the second circuit are great also at the frequency of the attenuation pole on the passband (second band) high-frequency side of filter 11A, yet the attenuation pole is achieved by the antiresonant frequency of a series-arm circuit included in filter 11A. Accordingly, the impedance of filter 11A has a local maximum value, and thus even if a phase shifter is not provided, a ripple does not occur in the passband (first band) of radio frequency filter 10A.

Note that in the present embodiment and subsequent embodiments, a resonant frequency is a frequency at which impedance $|Z|$ of a series-arm resonator, a parallel-arm resonator, a series-arm circuit, and a parallel-arm circuit has a local minimum value, and an antiresonant frequency is a frequency at which impedance $|Z|$ thereof has a local maximum value.

Furthermore, with regard to the factor in (2) above in Comparative Example 1, by adjusting phase shifts caused by phase shifters 21 and 22 to be the same in a frequency range in which an amplitude difference between the first circuit and the second circuit is small, radio frequency signals each having a frequency in the first band do not cancel out each other after passing through the first circuit and the second circuit. Accordingly, a ripple in the first band can be decreased at a frequency included in the first band of radio frequency filter 10A.

In this example, as illustrated in (c) of FIG. 6, when the second circuit alone is viewed from nodes X1 and X2, the second band may include at least one frequency (dashed-line circles in (c) of FIG. 6: three frequencies) at which phase shifts caused by the first circuit and the second circuit are the same (0° or −360°), and the third band may include at least one frequency (dashed-line circles in (c) of FIG. 6: two frequencies) at which phase shifts caused by the first circuit and the second circuit are the same (0° or −360°).

Figure 7:
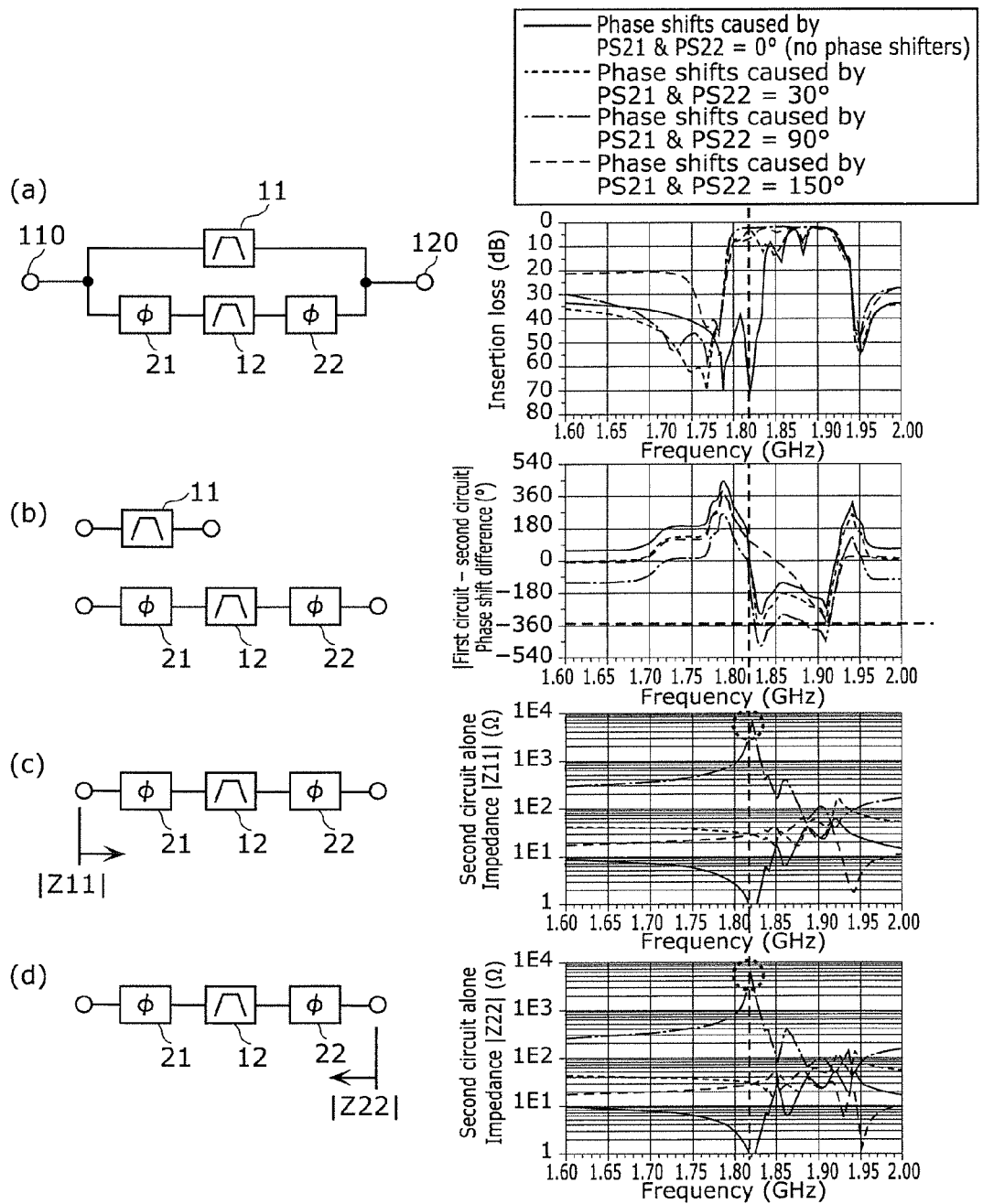
FIG. 7 illustrates graphs showing passing characteristics, phase shift characteristics, and impedance characteristics when phase shifts caused by phase shifters of the radio frequency filter according to Example 1 are changed.
Figure 8:
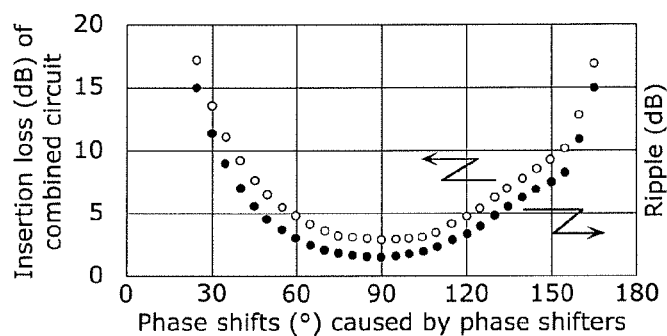
FIG. 8 illustrates graphs showing relations between (i) phase shifts caused by phase shifters of the radio frequency filter according to Example 1 and (ii) insertion loss and a frequency at which impedance is highest.
Figure 8:
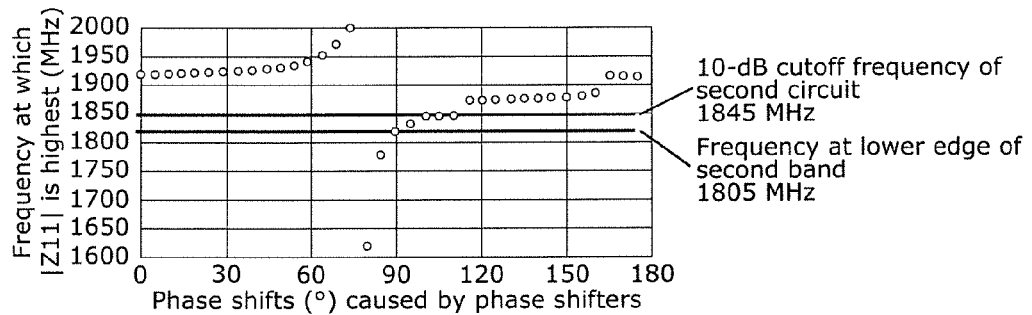
Figure 8:
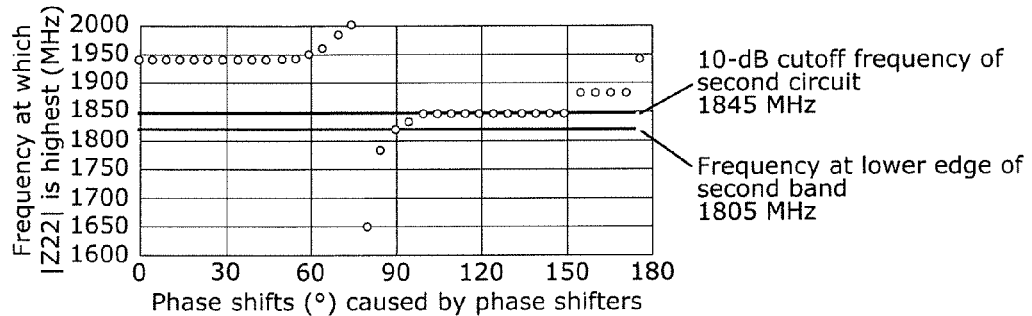

FIG. 7 illustrates graphs showing passing characteristics, phase shift characteristics, and impedance characteristics when the phase shifts caused by phase shifters 21 and 22 of radio frequency filter 10A according to Example 1 are changed. FIG. 8 illustrates graphs showing relations between (i) the phase shifts caused by phase shifters 21 and 22 of radio frequency filter 10A according to Example 1 and (ii) insertion loss and a frequency at which impedance is highest. Note that the frequency at which impedance is highest is a frequency at which impedance is highest out of frequencies at singular points at each of which impedance has a local maximum value. More specifically, FIG. 7 illustrates change in passing characteristics, phase shift characteristics, and impedance characteristics when the phase shifts caused by phase shifters 21 and 22 are changed in a range from 0° to 150° (synonymous with 180° to 330°).

FIG. 8 illustrates change in insertion loss and change in highest impedance when the phase shifts caused by phase shifters 21 and 22 are changed 5° stepwise from 0° to 175° (synonymous with 180° to 355°).

First, as a matter of course, the phase shift caused by the second circuit is changed at all frequencies by changing the phase shifts caused by phase shifters 21 and 22. Accordingly, as illustrated in (a) and (b) of FIG. 7, a ripple increases when the phase shifts caused by the first circuit and the second circuit are opposite (a 180° difference between phase shifts) in a frequency range in which the amplitude difference is small in the first band that is a passband, whereas a ripple decreases when the phase shifts caused thereby are the same (a 0° or 360° difference between phase shifts). Accordingly, by eliminating the difference between phase shifts caused by the first circuit and the second circuit in a frequency range in which the amplitude difference is small and which is included in the first band that is a passband, a ripple in the first band of radio frequency filter 10A decreases, and passband insertion loss can be reduced.

In radio frequency filter 10A according to Example 1, a phase shift difference (A) between filters 11A and 12A is 152.2° from (h) of FIG. 4A at a lower edge frequency of the passband (third band) of filter 12A. On the other hand, a phase shift difference (B) between the first circuit and the second circuit is 349.2° from (h) of FIG. 5. From Table 1, the phase shifts caused by phase shifters 21 and 22 are 98.9° and 98.1°, respectively, and thus the sum (C) of the phase shifts caused by phase shifters 21 and 22 is 197°.

Here, the relation of (A)+(C)=(B) is satisfied.

In contrast, (a) of FIG. 8 shows that a ripple of radio frequency filter 10A is 3 dB or less is when the phase shifts caused by phase shifters 21 and 22 are in a range from 80° to 105°. The range of phase shift difference (B) between the first circuit and the second circuit is defined by substituting the range of phase shifts caused by phase shifters 21 and 22 for (C) above. Accordingly, phase shifters 21 and 22 are adjusted to cause the phase shift difference (B) between the first circuit and the second circuit to fall within a range from 312.2° (152.2°+80°×2) to 362.2° (152.2°+105°×2).

On the other hand, frequencies at which impedance |Z11| on the node X1 side of the second circuit and impedance |Z22| on the node X2 side of the second circuit are the highest are changed by changing the phase shifts caused by phase shifters 21 and 22. Accordingly, if out of frequencies at singular points at each of which impedance of the second circuit has a local maximum value, a frequency at which impedance is highest falls out of a frequency range from the lower edge frequency of the second band to a lower cutoff frequency of the passband of filter 12A, the impedance of the second circuit decreases, and a signal sneaks toward the second circuit in a lower-frequency attenuation band of the second circuit, which causes a ripple in the first band of the radio frequency filter, and increases passband insertion loss. On the other hand, if the lower-frequency attenuation band has a frequency at which impedance is highest, the impedance of the second circuit increases and a signal does not sneak toward the second circuit in the lower-frequency attenuation band of the second circuit, and thus a ripple in the passband of the radio frequency filter is decreased and passband insertion loss is decreased, or a ripple in the passband of a communication device is decreased and insertion loss is decreased.

From the above, the phase shifts caused by phase shifters 21 and 22 are desirably adjusted to include, in a frequency range from a lower edge frequency of the second band to a lower cutoff frequency of the passband of filter 12A, a frequency at which impedance is highest out of frequencies at singular points at each of which impedance of the second circuit has a local maximum value, when the second circuit alone is viewed from at least one input/output terminal of the second circuit. In particular, in this example, a ripple of radio frequency filter 10A can be made 3 dB or lower by adjusting the phase shifts caused by phase shifters 21 and 22 in a frequency range on the passband low-frequency side of filter 12A.

[1.5 Configuration of Radio Frequency Filter 10B According to Examples 1a to 1e]

Figure 9:
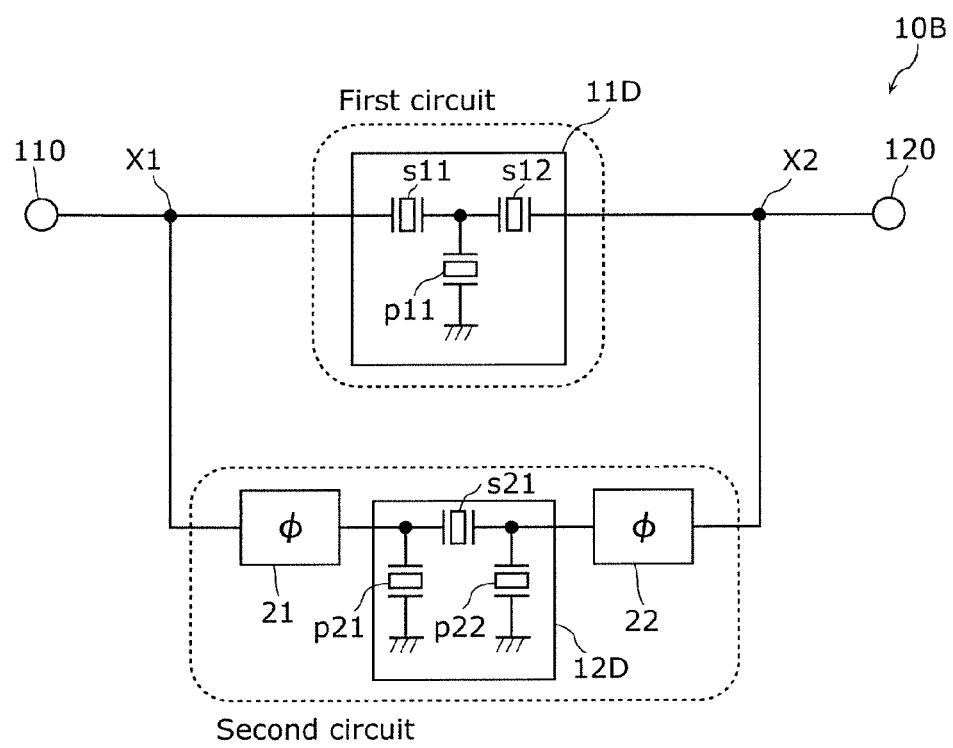
FIG. 9 illustrates a circuit configuration of a radio frequency filter according to Examples 1a, 1b, 1c, 1d, and 1e.

FIG. 9 illustrates a circuit configuration of radio frequency filter 10B according to Examples 1a, 1b, 1c, 1d, and 1e. Radio frequency filter 10B illustrated in FIG. 9 includes filters 11D and 12D, phase shifters 21 and 22, and input/output terminals 110 and 120. Radio frequency filter 10B is a specific example of a circuit configuration of radio frequency filter 10 according to Embodiment 1, filter 11D is a specific example of a circuit configuration of filter 11, and filter 12D is a specific example of a circuit configuration of filter 12.

Filter 11D includes series-arm resonators s11 and s12 disposed on the first path that connects nodes X1 and X2, and parallel-arm resonator p11 disposed between the ground and a node on a path that connects series-arm resonators s11 and s12. Accordingly, this makes filter 11D a ladder bandpass filter.

Filter 12D includes series-arm resonator s21 disposed on a second path that connects nodes X1 and X2, and parallel-arm resonators p21 and p22 each disposed between a node on the second path and the ground. Accordingly, this makes filter 12D a ladder bandpass filter.

The following describes in more detail the structures of resonators included in radio frequency filter 10B, focusing on parallel-arm resonator p11. Note that the other resonators have substantially the same structure as that of parallel-arm resonator p11, except that the I-R pitch is about 0.5 times wavelength $\lambda$ of an acoustic wave, and thus a detailed description thereof is omitted.

Figure 10:
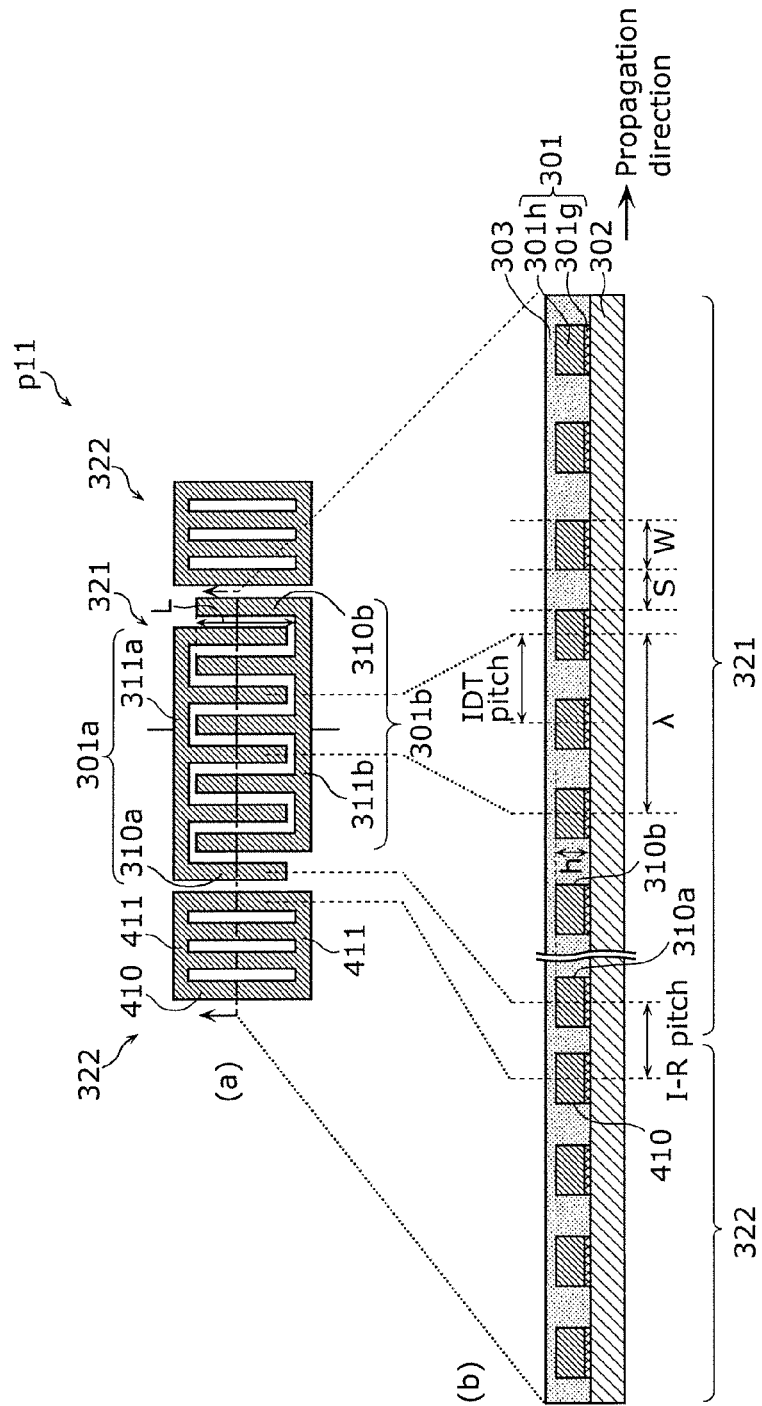
FIG. 10 illustrates an example of a drawing schematically showing a structure of a parallel-arm resonator in Embodiment 1.

FIG. 10 illustrates an example of a drawing schematically showing the structure of parallel-arm resonator p11 in Embodiment 1, where (a) is a plan view and (b) is a cross-sectional view of (a). Note that parallel-arm resonator p11 illustrated in FIG. 10 is for describing a typical structure of the resonators included in radio frequency filter 10B. Accordingly, the number and the length of electrode fingers included in an interdigital transducer (IDT) electrode of each resonator of radio frequency filter 10B, for instance, are not limited to the number and the length of electrode fingers of the IDT electrode illustrated in FIG. 10.

As illustrated in (a) and (b) of FIG. 10, parallel-arm resonator p11 includes electrode film 301 included in IDT electrode 321 and reflectors 322, piezoelectric substrate 302 on which electrode film 301 is formed, and protective layer 303 that covers electrode film 301. The following describes in detail these elements.

As illustrated in (a) of FIG. 10, a pair of comb-shaped electrodes 301a and 301b facing each other and included in IDT electrode 321 are formed on piezoelectric substrate 302. Comb-shaped electrode 301a includes electrode fingers 310a parallel to each other, and bus bar electrode 311a that connects electrode fingers 310a. Comb-shaped electrode 301b includes electrode fingers 310b parallel to each other, and bus bar electrode 311b that connects electrode fingers 310b. Electrode fingers 310a and 310b are formed in the direction orthogonal to the direction in which acoustic waves propagate, and cyclically formed in the propagation direction.

IDT electrode 321 having such a configuration excites surface acoustic waves in a specific frequency region determined by the electrode pitch of electrode fingers 310a and 310b included in IDT electrode 321.

Note that comb-shaped electrodes 301a and 301b may each be referred to as an IDT electrode. Note that the following gives description assuming that, for convenience, one IDT electrode 321 includes one pair of comb-shaped electrodes 301a and 301b.

Reflectors 322 are disposed adjacent to IDT electrode 321 in the direction in which acoustic waves propagate. Specifically, a pair of reflectors 322 are disposed at the sides of IDT electrode 321 in the direction in which acoustic waves propagate. Reflectors 322 each include electrode fingers 410 parallel to each other, and a pair of bus bar electrodes 411 consisting of bus bar electrode 411 that connects ends of electrode fingers 410 on one side, and bus bar electrode 411 that connects ends of electrode fingers 410 on the other side. Electrode fingers 410 are formed in the direction orthogonal to the direction in which acoustic waves propagate, and are cyclically formed in the propagating direction, similarly to electrode fingers 310a and 310b included in IDT electrode 321.

Reflectors 322 having such a configuration reflect surface acoustic waves with a high reflection coefficient in a frequency band (stopband) determined by, for example, the electrode pitch of electrode fingers 410 included in reflectors 322. Thus, when the electrode pitch of IDT electrode 321 and the electrode pitch of each reflector 322 are equal, reflector 322 reflects surface acoustic waves excited by IDT electrode 321 with a high reflection coefficient.

Since such reflectors 322 are included, parallel-arm resonator p11 can keep the excited surface acoustic waves inside, and reduces leakage of the waves to the outside. Accordingly, parallel-arm resonator p11 can improve Q at a resonance point and an antiresonance point determined by, for instance, an electrode pitch, a pair count, a cross width of IDT electrode 321.

Note that it is sufficient if reflectors 322 include electrode fingers 410, and thus reflectors 322 may not have bus bar electrodes 411. The number of electrode fingers 410 may be at least one, and is not limited in particular. Note that if there are too few electrode fingers 410, leakage of acoustic waves increases, and thus filter characteristics may deteriorate. On the other hand, if there are too many electrode fingers 410, the size of reflectors 322 is increased, and thus the entire size of radio frequency filter 10B may be increased. Accordingly, the number of electrode fingers 410 may be determined as appropriate, taking into consideration filter characteristics and the size, for instance, that radio frequency filter 10B is to have.

Such IDT electrode 321 and reflectors 322 are included in electrode film 301 illustrated in (b) of FIG. 10. In this example, electrode film 301 has a structure in which adhesive layer 301g and main electrode layer 301h are stacked, as illustrated in (b) of FIG. 10. Note that in this example, IDT electrode 321 and reflectors 322 are included in single electrode film 301, but may be included in electrode films having different structures and different compositions.

Adhesive layer 301g is for improving the adhesion of piezoelectric substrate 302 and main electrode layer 301h, and Ti is used as a material, for example. The thickness of adhesive layer 301g is 12 nm, for example.

The material of main electrode layer 301h is Al that contains 1% of Cu, for example. The thickness of main electrode layer 301h is 162 nm, for example.

Piezoelectric substrate 302 is a substrate on which electrode film 301 (namely, IDT electrode 321 and reflectors 322) is formed, and is made of, for example, a $LiTaO_3$ piezoelectric single crystal, a $LiNbO_3$ piezoelectric single crystal, a $KNbO_3$ piezoelectric single crystal, a quartz crystal, or piezoelectric ceramics.

Protective layer 303 is formed so as to cover comb-shaped electrodes 301a and 301b. Protective layer 303 is intended to, for instance, protect main electrode layer 301h from the outside environment, adjust frequency temperature characteristics, and increase moisture resistance, and is a film that contains silicon dioxide as a principal component, for example.

Note that the structure of each resonator included in radio frequency filter 10B is not limited to the structure illustrated in FIG. 10. For example, electrode film 301 may be a metal single layer, rather than a stacked structure of metal films. The materials of adhesive layer 301g, main electrode layer 301h, and protective layer 303 are not limited to the above described materials. Electrode film 301 may include metal such as, for example, Ti, Al, Cu, Pt, Au, Ag, or Pd or an alloy of such metals, or may have a structure in which a plurality of layers made of such metals or an alloy of such metals are stacked. Protective layer 303 may not be formed.

In parallel-arm resonator p11 having such a configuration, the design parameter of IDT electrode 321, for instance, determines the wavelength of acoustic waves to be excited. The following describes the design parameters of IDT electrode 321, namely the design parameters of comb-shaped electrode 301a and comb-shaped electrode 301b.

The wavelength of acoustic waves determined by repeating cycle λ of electrode fingers 310a included in comb-shaped electrode 301a or electrode fingers 310b included in comb-shaped electrode 301b illustrated in FIG. 10. The electrode pitch (cyclic pattern) is ½ of repeating cycle λ, and is defined to be (W+S), where W denotes the line width of electrode fingers 310a and 310b included in comb-shaped electrodes 301a and 301b, and S denotes the space width between adjacent electrode fingers 310a and adjacent electrode fingers 310b. Cross width L of IDT electrode 321 is the length of overlapping electrodes when electrode fingers 310a of comb-shaped electrode 301a and electrode fingers 310b of comb-shaped electrode 301b are viewed in the direction in which acoustic waves propagate, as illustrated in (a) of FIG. 10. The electrode duty cycle (duty cycle) indicates a percentage made up by the line width of each of electrode fingers 310a and 310b, that is, a proportion of the line width to a value obtained by adding a line width of each of electrode fingers 310a and 310b to a space width, and thus is defined to be W/(W+S). The pair count is the number of electrode fingers 310a and 310b that form a pair within comb-shaped electrodes 301a and 301b, and is substantially half the total number of electrode fingers 310a and 310b. For example, M=2N+1 is satisfied, where N denotes the pair count, and M denotes a total number of electrode fingers 310a and 310b. The thickness of IDT electrode 321 indicates thickness h of electrode fingers 310a and 310b.

Next, the design parameter of reflectors 322 is to be described.

The electrode pitch (cyclic pattern) of reflectors 322 is defined to be $(W_{REF}+S_{REF})$, where $W_{REF}$ denotes the line width of electrode finger 410, and $S_{REF}$ denotes the space width between adjacent electrode fingers 410. The electrode duty cycle (duty cycle) of reflectors 322 indicates a percentage made up by the line width of each of electrode fingers 410, that is, a proportion of the line width to a value obtained by adding a line width of each of electrode fingers 410 to a space width, and thus is defined to be $W_{REF}/(W_{REF}+S_{REF})$. The thickness of reflectors 322 is the thickness of electrode fingers 410.

In this example, the electrode pitch and the electrode duty cycle of reflectors 322 is equivalent to the electrode pitch and the electrode duty cycle of IDT electrode 321. In each reflector 322, the pair of bus bar electrodes 411 are disposed so as to overlap bus bar electrodes 311a and 311b of IDT electrode 321 when viewed in the direction in which acoustic waves propagate.

Note that reflectors 322 preferably have the above configuration from the viewpoint of reducing leakage of acoustic waves, but may have a configuration different from the above configuration.

Next, the design parameter regarding relative arrangement of IDT electrode 321 and reflectors 322 is to be described.

The pitch (I-R pitch) between IDT electrode 321 and each reflector 322 is defined by the center-to-center distance between (i) an electrode finger closest to reflector 322 out of electrode fingers 310a and 310b included in IDT electrode 321 and (ii) electrode finger 410 closest to IDT electrode 321 out of electrode fingers 410 included in reflector 322. This I-R pitch can be expressed using repeating cycle $\lambda$ of electrode fingers 310a included in comb-shaped electrode 301a or electrode fingers 310b included in comb-shaped electrode 301b (that is, wavelength $\lambda$ of acoustic waves determined by the electrode pitch of IDT electrode 321) and, for example, when the pitch is 0.50 times repeating cycle $\lambda$, the pitch is expressed as $0.50\lambda$.

Radio frequency filter 10B according to this example includes filters 11D and 12D. Filter 11D includes a first series-arm circuit (series-arm resonator s11 or s12) disposed on a first path that connects node X1 and node X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. One or more of the first series-arm circuit, the first parallel-arm circuit, the second series-arm circuit, and the second parallel-arm circuit include one or more acoustic wave resonators, and at least one of the one or more acoustic wave resonators includes an IDT electrode formed on a piezoelectric substrate, and a reflector. Here, when $\lambda$ denotes a wavelength of acoustic waves determined by a cyclic pattern of the IDT electrode in the at least one of the one or more acoustic wave resonators, a pitch between the IDT electrode and the reflector is desirably at least $0.42\lambda$ and less than $0.50\lambda$.

As described above, an acoustic wave resonator that includes IDT electrode 321 and reflectors 322 has a cyclic structure that includes electrode fingers cyclically arranged, and has a frequency region in which surface acoustic waves each having a frequency in a specific frequency region is reflected with a high reflection coefficient. This frequency region is generally called a stopband, and is defined by the repeating cycle of the cyclic structure, for instance. At this time, a ripple that is a locally increasing reflection coefficient occurs at the higher edge of the stopband. Furthermore, if the pitch (I-R pitch) between IDT electrode 321 and each reflector 322 is set to at least $0.5\lambda$, a ripple at the higher edge of the stopband is increased, a ripple in the passband of the filter is increased, and insertion loss is increased. On the other hand, if the I-R pitch is set to at least $0.42\lambda$ and less than $0.50\lambda$, a ripple at the higher edge of the stopband can be decreased. From the above viewpoint, in filters 11D and 12D included in radio frequency filter 10B, insertion loss in the passband of radio frequency filter 10B can be further decreased by setting the I-R pitch to at least $0.42\lambda$ and less than $0.50\lambda$.

In the following, radio frequency filter 10B according to Examples 1a to 1d is to be compared with a radio frequency filter according to Example 1e.

Note that radio frequency filter 10B according to Examples 1a to 1d and radio frequency filter 10B according to Example 1e all have the circuit configuration illustrated in FIG. 9, but nevertheless I-R pitches are configured as follows.

(1) Example 1e: The I-R pitch of all the acoustic wave resonators (series-arm resonators s11, s12, and s21 and parallel-arm resonators p11, p21, and p22) is $0.50\lambda$.

(2) Example 1a: The I-R pitch of series-arm resonators s11 and s12 is $0.44\lambda$, and the I-R pitch of the other acoustic wave resonators is $0.50\lambda$.

(3) Example 1b: The I-R pitch of parallel-arm resonator p11 is $0.44\lambda$, and the I-R pitch of the other acoustic wave resonators is $0.50\lambda$.

(4) Example 1c: The I-R pitch of parallel-arm resonators p21 and p22 is $0.44\lambda$, and the I-R pitch of the other acoustic wave resonators is $0.50\lambda$.

(5) Example 1d: The I-R pitch of all the acoustic wave resonators (series-arm resonators s11, s12, and s21, and parallel-arm resonators p11, p21, and p22) is $0.44\lambda$.

[1.6 Filter Characteristics of Radio Frequency Filter 10B According to Examples 1a to 1e]

Figure 11A:
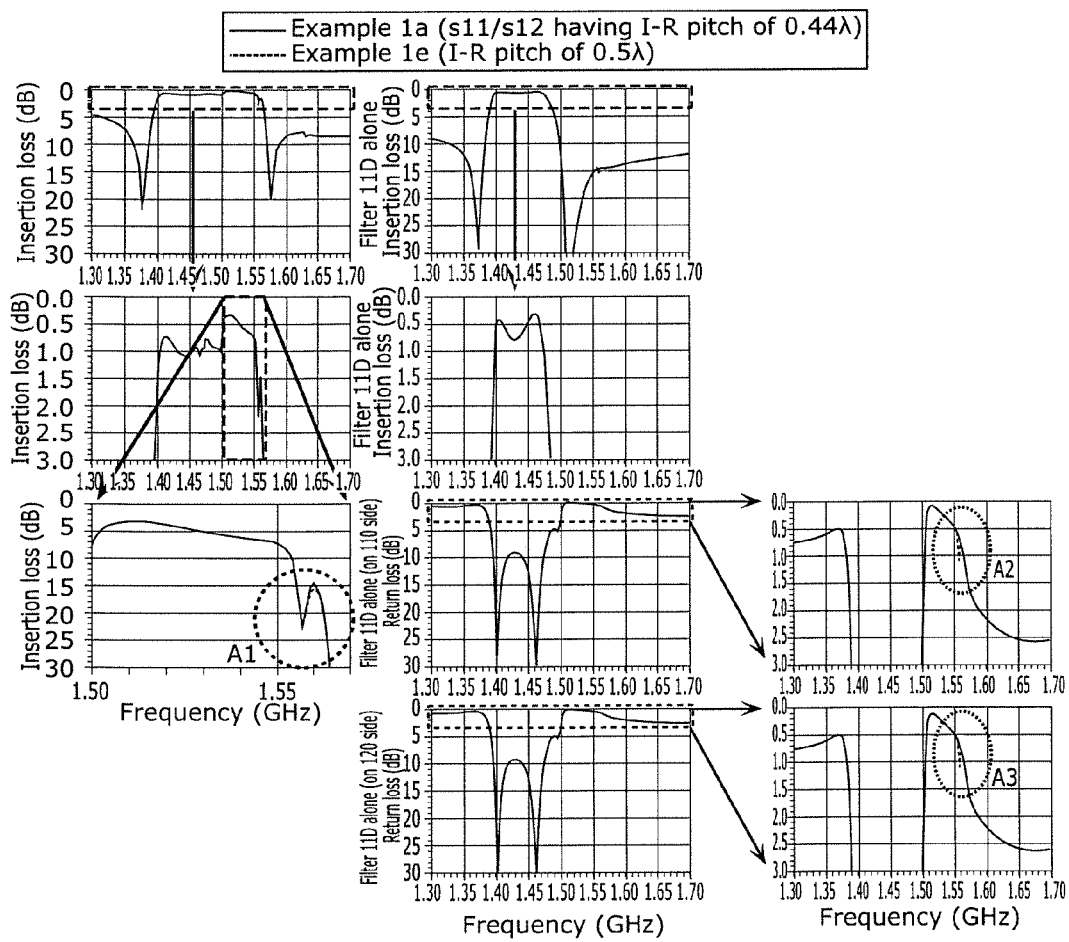
FIG. 11A illustrates graphs showing comparisons of passing characteristics and return characteristics of the radio frequency filter according to Examples 1a and 1e.
Figure 11B:
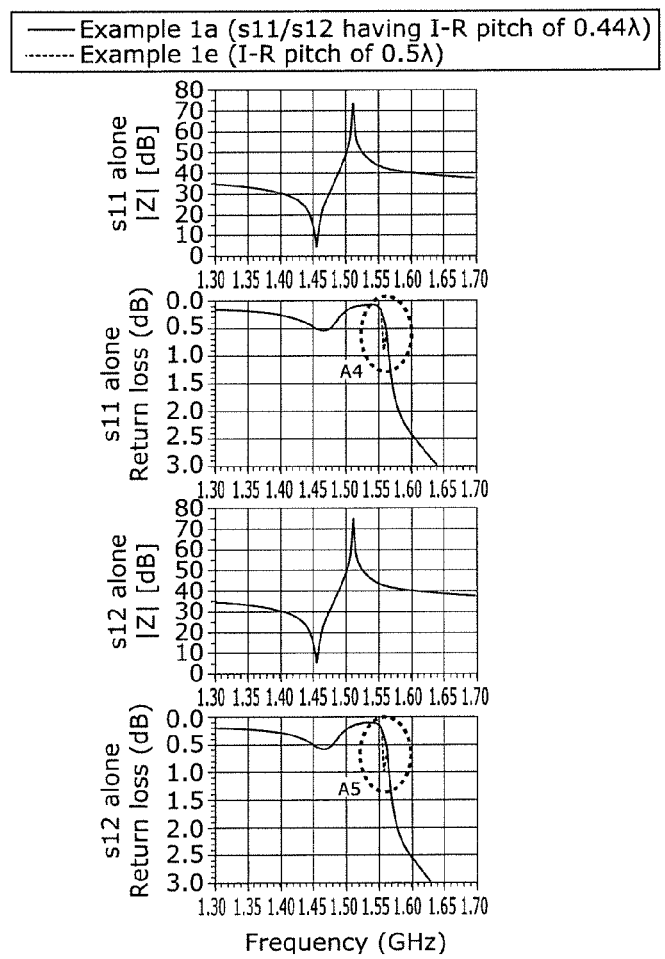
FIG. 11B illustrates graphs showing comparisons of impedance characteristics and return characteristics of series-arm resonators according to Examples 1a and 1e.

FIG. 11A illustrates graphs showing comparisons of passing characteristics and the return characteristics of the radio frequency filter according to Examples 1a and 1e. FIG. 11B illustrates graphs showing comparisons of impedance characteristics and return characteristics of series-arm resonators s11 and s12 alone according to Examples 1a and 1e. Note that the left graphs in FIG. 11A illustrate passing characteristics of the radio frequency filter according to Examples 1a and 1e. The center and right graphs in FIG. 11A illustrate passing characteristics and return characteristics of filter 11D alone according to Examples 1a and 1e.

First, as illustrated in FIG. 11B, in series-arm resonators s11 and s12 of the radio frequency filter according to Example 1e, a ripple that is locally increasing return loss occurs at the higher edge of the stopband. In contrast, in series-arm resonators s11 and s12 of radio frequency filter 10B according to Example 1a, such a ripple of return loss is decreased at the higher edge of the stopband (regions A4 and A5 in FIG. 11B).

Along with this, as illustrated in the right enlarged graphs in FIG. 11A, in filter 11D according to Example 1e, a ripple that is locally increasing return loss occurs at the higher edge of the stopband. In contrast, in filter 11D according to Example 1a, such a ripple of return loss is decreased at the higher edge of the stopband (regions A2 and A3 in FIG. 11A).

As a result, in radio frequency filter 10B according to Example 1e, a ripple that is locally increasing insertion loss occurs at the passband high-frequency edge, as illustrated in the left graphs in FIG. 11A. In contrast, in radio frequency filter 10B according to Example 1a, insertion loss is decreased at the passband high-frequency edge (region A1 in FIG. 11A).

As stated above, radio frequency filter 10B according to Example 1a includes filters 11D and 12D. Filter 11D includes a first series-arm circuit (series-arm resonator s11 or s12) disposed on a first path that connects node X1 and node X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. The first series-arm circuit includes an acoustic wave resonator, and the acoustic wave resonator includes an IDT electrode formed on a piezoelectric substrate, and a reflector. Here, the pitch of the IDT electrode of the acoustic wave resonator and the reflector is at least 0.42λ and less than 0.50λ.

Series-arm resonators s11 and s12 in the series-arm circuit of filter 11D each have a resonant frequency in the passband of filter 11D, and an antiresonant frequency in the passband of filter 12D on the passband high-frequency side of filter 11D. Then, the stopbands of series-arm resonators s11 and s12 form a passband of filter 12D. In contrast, the I-R pitch is set to at least 0.42λ and less than 0.50λ, and thus a ripple at the higher edge of the stopband can be decreased. Accordingly, since the I-R pitch is set to at least 0.42λ and less than 0.50λ, insertion loss in the passband of radio frequency filter 10B can be further decreased.

Figure 12A:
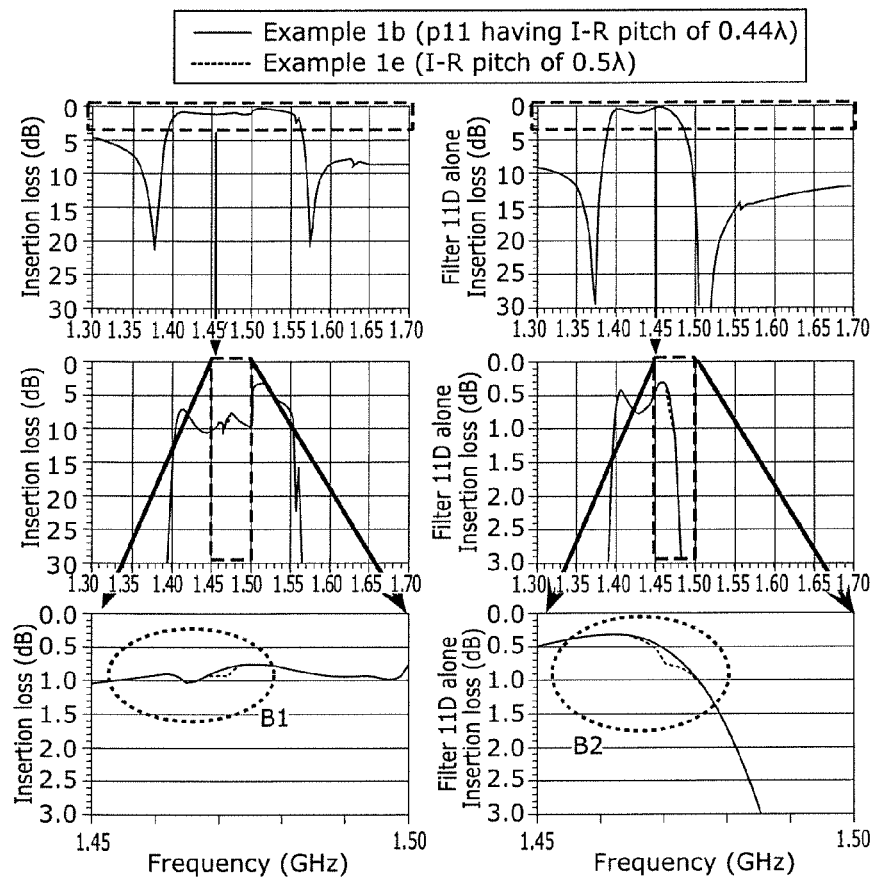
FIG. 12A illustrates graphs showing comparisons of passing characteristics of the radio frequency filter according to Examples 1b and 1e.
Figure 12B:
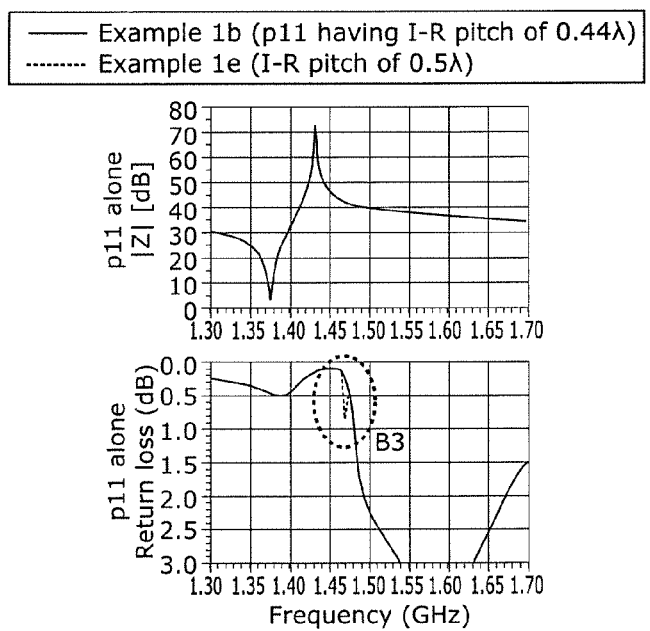
FIG. 12B illustrates graphs showing comparisons of impedance characteristics and return characteristics of a parallel-arm resonator according to Examples 1b and 1e.

FIG. 12A illustrates graphs showing comparisons of passing characteristics of the radio frequency filter according to Examples 1b and 1e. FIG. 12B illustrates graphs showing comparisons of impedance characteristics and return characteristics of parallel-arm resonator p11 alone according to Examples 1b and 1e. Note that the left graphs in FIG. 12A illustrate passing characteristics of the radio frequency filter according to Examples 1b and 1e. The right graphs in FIG. 12A illustrate passing characteristics of filter 11D alone according to Examples 1b and 1e.

First, as illustrated in FIG. 12B, in parallel-arm resonator p11 of radio frequency filter 10B according to Example 1e, a ripple that is locally increasing return loss occurs at the higher edge of the stopband. In contrast, in parallel-arm resonator p11 of radio frequency filter 10B according to Example 1b, such a ripple of return loss is decreased at the higher edge of the stopband (region B3 in FIG. 12B).

With this, as illustrated in the right graphs in FIG. 12A, in filter 11D according to Example 1e, a ripple that is locally increasing insertion loss occurs in the passband corresponding to the higher edge of the stopband. In contrast, filter 11D according to Example 1b, such a ripple of insertion loss is decreased in the passband corresponding to the higher edge of the stopband (region B2 in FIG. 12A).

As a result, as illustrated in the left graphs in FIG. 12A, in radio frequency filter 10B according to Example 1e, a ripple that is locally increasing insertion loss occurs in the passband. In contrast, in radio frequency filter 10B according to Example 1b, insertion loss is decreased in the passband (region B1 in FIG. 12A).

Thus, radio frequency filter 10B according to Example 1b includes filters 11D and 12D. Filter 11D includes a first series-arm circuit (series-arm resonator s11 or s12) disposed on a first path that connects node X1 and node X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. The first parallel-arm circuit includes an acoustic wave resonator, and the acoustic wave resonator includes an IDT electrode formed on a piezoelectric substrate, and a reflector. Here, the pitch between the IDT electrode and the reflector of the acoustic wave resonator is at least 0.42λ and less than 0.50λ.

Parallel-arm resonator p11 in the parallel-arm circuit of filter 11D has a resonant frequency on the passband low-frequency side of filter 11D, and has an antiresonant frequency in the passband of filter 11D. Then, the stopband of parallel-arm resonator p11 is located in the passband of filter 11D or on the passband high-frequency side of filter 11D. In this configuration, a ripple at the higher edge of the stopband can be decreased by setting the I-R pitch to at least 0.42λ and less than 0.50λ. Accordingly, insertion loss in the passband of radio frequency filter 10B can be further decreased by setting the I-R pitch to at least 0.42λ and less than 0.50λ.

Figure 13A:
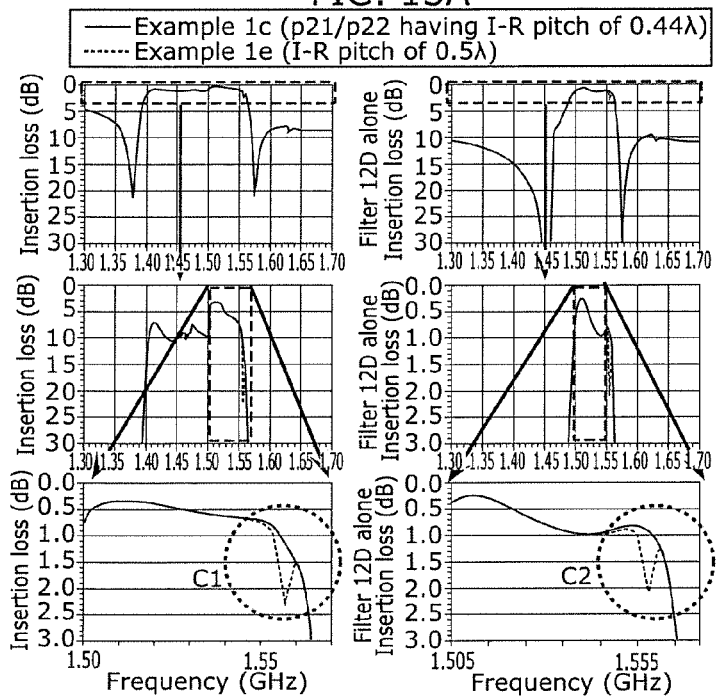
FIG. 13A illustrates graphs showing comparisons of passing characteristics of the radio frequency filter according to Examples 1c and 1e.
Figure 13B:
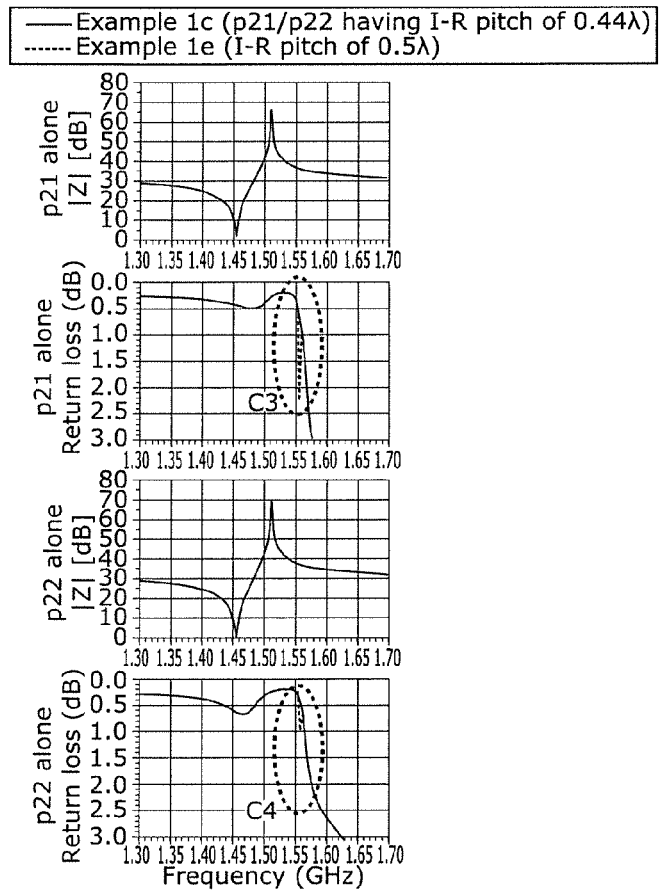
FIG. 13B illustrates graphs showing comparisons of impedance characteristics and return characteristics of parallel-arm resonators according to Examples 1c and 1e.

FIG. 13A illustrates graphs showing comparisons of passing characteristics and return characteristics of the radio frequency filter according to Examples 1c and 1e. FIG. 13B illustrates graphs showing comparisons of impedance characteristics and return characteristics of parallel-arm resonators p21 and p22 alone according to Examples 1c and 1e. Note that the left graphs in FIG. 13A illustrate passing characteristics of the radio frequency filter according to Examples 1c and 1e. The right graphs in FIG. 13A illustrate passing characteristics of filter 12D alone according to Examples 1c and 1e.

First, as illustrated in FIG. 13B, in parallel-arm resonators p21 and p22 of the radio frequency filter according to Example 1e, a ripple that is locally increasing return loss occurs at the higher edge of the stopband. In contrast, in parallel-arm resonators p21 and p22 of radio frequency filter 10B according to Example 1c, such a ripple of return loss is decreased at the higher edge of the stopband (regions C3 and C4 in FIG. 13B).

With this, in filter 12D according to Example 1e, a ripple that is locally increasing insertion loss occurs in the passband corresponding to the higher edge of the stopband, as illustrated in the right graphs in FIG. 13A. In contrast, in filter 12D according to Example 1c, such a ripple of insertion loss is decreased in the passband corresponding to the higher edge of the stopband (region C2 in FIG. 13A).

As a result, in radio frequency filter 10B according to Example 1e, a ripple that is locally increasing insertion loss occurs in the passband, as illustrated in the left graphs in FIG. 13A. In contrast, in radio frequency filter 10B according to Example 1c, insertion loss is decreased in the passband (region C1 in FIG. 13A).

Thus, radio frequency filter 10B according to Example 1c includes filters 11D and 12D. Filter 11D includes a first series-arm circuit (series-arm resonator s11 or s12) disposed on a first path that connects node X1 and node X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. The second parallel-arm circuit includes an acoustic wave resonator, and the acoustic wave resonator includes an IDT electrode formed on a piezoelectric substrate, and a reflector. Here, the pitch between the IDT electrode and the reflector of the acoustic wave resonator is at least 0.42λ and less than 0.50λ.

Parallel-arm resonators p21 and p22 in the parallel-arm circuit of filter 12D each have a resonant frequency on the passband low-frequency side of filter 12D, and an antiresonant frequency in the passband of filter 12D. Then, the stopbands of parallel-arm resonators p21 and p22 are located in the passband of filter 12D or on the passband high-frequency side of filter 12D. In this configuration, a ripple at the higher edge of the stopband can be decreased by setting the I-R pitch to at least 0.42λ and less than 0.50λ. Accordingly, insertion loss in the passband of radio frequency filter 10B can be decreased by setting the I-R pitch to at least 0.42λ and less than 0.50λ.

Figure 14:
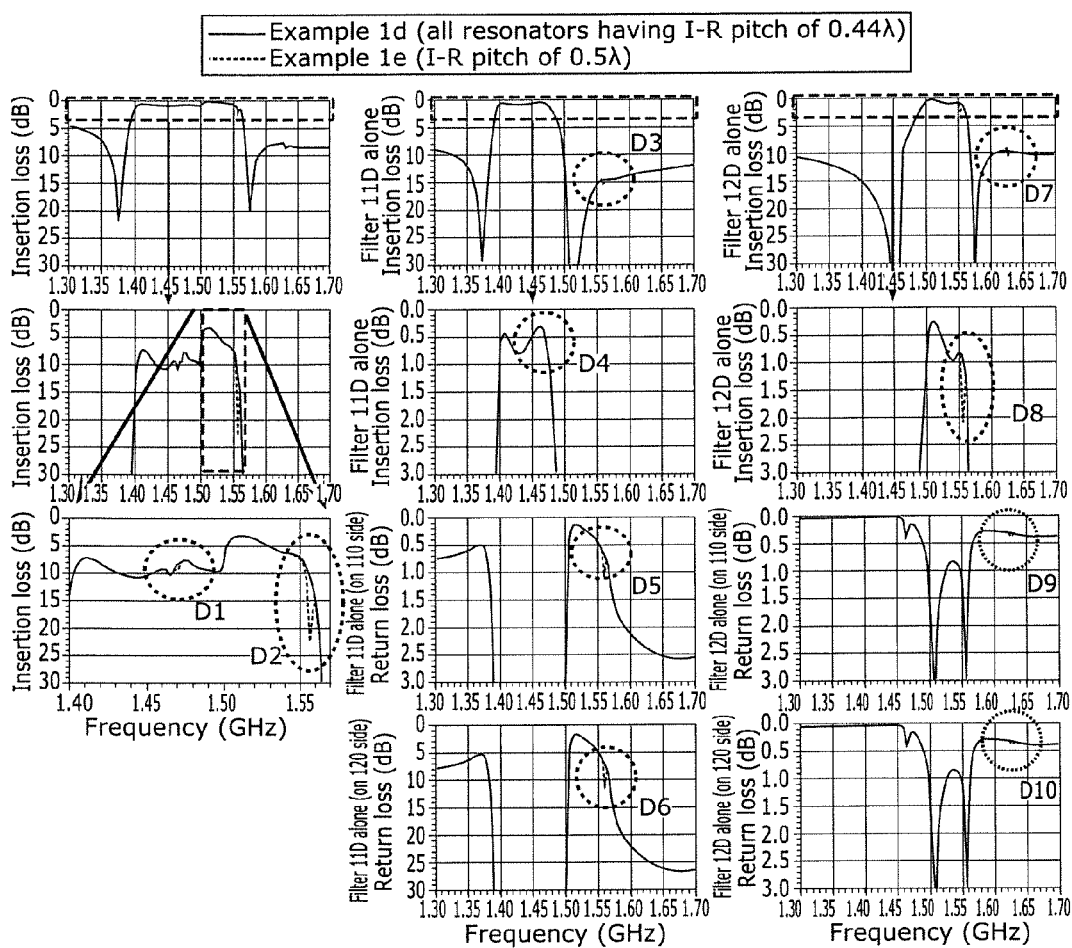
FIG. 14 illustrates graphs showing comparisons of passing characteristics and return characteristics of the radio frequency filter according to Examples 1d and 1e.

FIG. 14 illustrates graphs showing comparisons of passing characteristics and return characteristics of the radio frequency filter according to Examples 1d and 1e. Note that the left graphs in FIG. 14 illustrate passing characteristics of the radio frequency filter according to Examples 1d and 1e. The center graphs in FIG. 14 illustrate passing characteristics and return characteristics of filter 11D alone according to Examples 1d and 1e. The right graphs in FIG. 14 illustrate passing characteristics and return characteristics of filter 12D alone according to Examples 1d and 1e.

First, as illustrated in the center graphs in FIG. 14, in the series-arm resonator and the parallel-arm resonator of filter 11D according to Example 1e, a ripple that is locally increasing return loss occurs at the higher edge of the stopband. In contrast, in the series-arm resonator and the parallel-arm resonator of radio frequency filter 10B according to Example 1d, such a ripple of return loss is decreased at the higher edge of the stopband (regions D5 and D6 in FIG. 14).

As illustrated in the right graphs in FIG. 14, in the series-arm resonator and the parallel-arm resonator of filter 12D according to Example 1e, a ripple that is locally increasing return loss occurs at the higher edge of the stopband. In contrast, in the series-arm resonator and the parallel-arm resonator of radio frequency filter 10B according to Example 1d, such a ripple of return loss is decreased at the higher edge of the stopband (regions D9 and D10 in FIG. 14).

As a result, in the radio frequency filter according to Example 1e, a ripple that is locally increasing insertion loss occurs in the passband and at the higher edge of the passband, as illustrated in the left graphs in FIG. 14. In contrast, in radio frequency filter 10B according to Example 1d, insertion loss is decreased in the passband and at the higher edge of the passband (regions D1 and D2 in FIG. 14).

As stated above, radio frequency filter 10B according to Example 1d includes filters 11D and 12D. Filter 11D includes a first series-arm circuit (series-arm resonator s11 or s12) disposed on a first path that connects node X1 and node X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. The first series-arm circuit, the second series-arm circuit, the first parallel-arm circuit, and the second parallel-arm circuit each include an acoustic wave resonator, and the acoustic wave resonators each include an IDT electrode formed on a piezoelectric substrate, and a reflector. Here, the pitch between the IDT electrode and the reflector of the acoustic wave resonator is at least 0.42λ and less than 0.50λ. A ripple at the higher edge of the stopband can be decreased by setting the I-R pitch of all the acoustic wave resonators included in radio frequency filter 10B to at least 0.42λ and less than 0.50λ. Accordingly, insertion loss in the passband of radio frequency filter 10B can be further decreased by setting the I-R pitch to at least 0.42λ and less than 0.50λ.

Note that the I-R pitch of series-arm resonator s21 of filter 12D does not directly affect insertion loss of radio frequency filter 10B, yet when a multiplexer includes radio frequency filter 10B, and a filter having a passband that has a higher frequency range than that of radio frequency filter 10B (a filter having a passband that includes a frequency overlapping a frequency at which a ripple occurs in the stopband of radio frequency filter 10B), insertion loss of the filter can be decreased.

Here, a relation between the I-R pitch and characteristics of an acoustic wave resonator is to be described in detail.

Figure 15A:
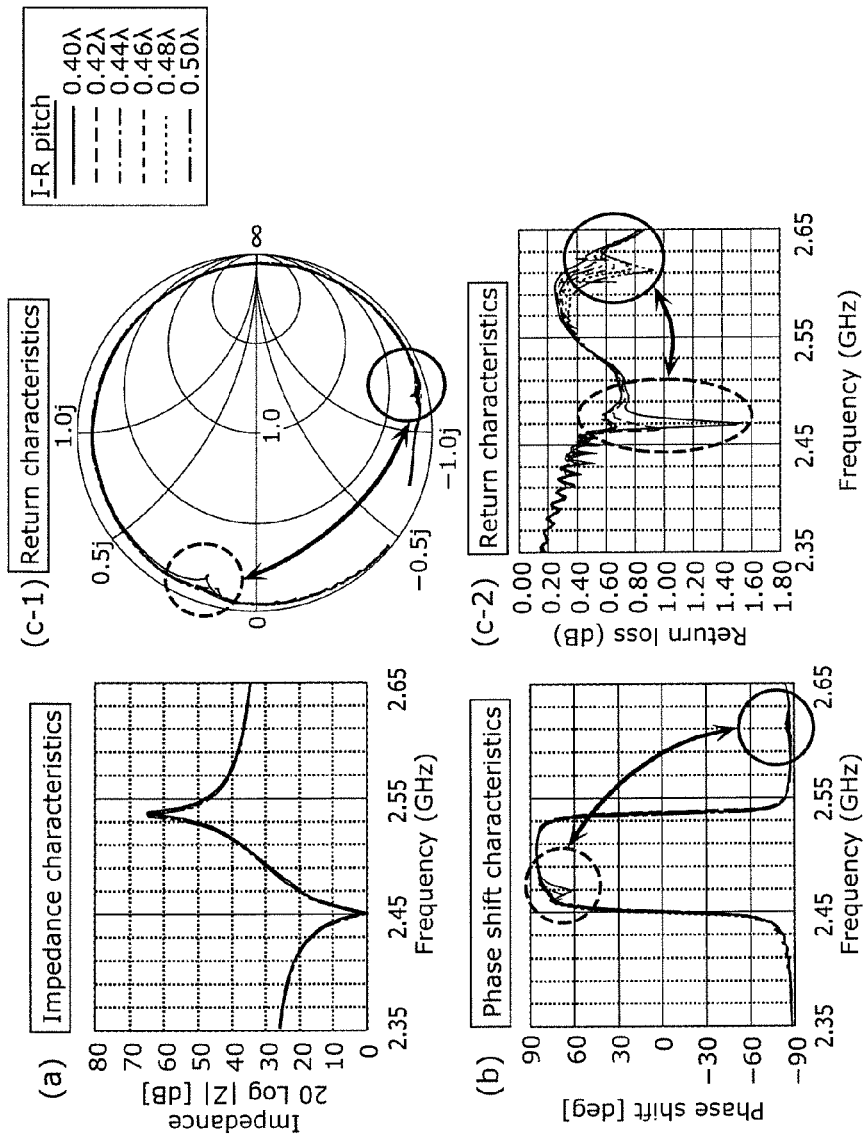
FIG. 15A illustrates graphs showing change in characteristics when the I-R pitch is changed in a range from 0.40λ to 0.50λ in a resonator of a typical example.
Figure 15B:
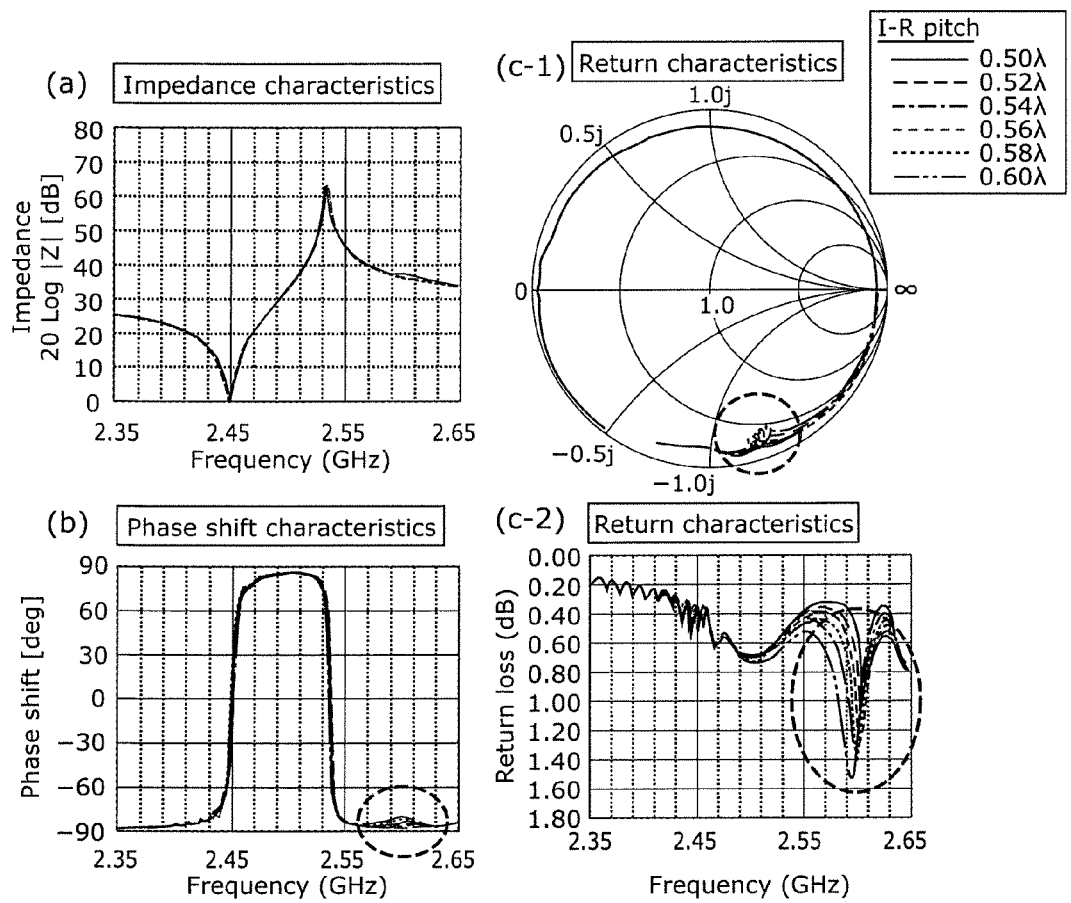
FIG. 15B illustrates graphs showing change in characteristics when the I-R pitch is changed in a range from 0.50λ to 0.60λ in the resonator of a typical example.

FIG. 15A illustrates graphs showing change in characteristics when the I-R pitch is changed in a range from 0.40λ to 0.50λ in a typical example of a resonator. FIG. 15B illustrates graphs showing change in characteristics when the I-R pitch is changed in a range from 0.50λ to 0.60λ in a typical example of a resonator.

In both of FIGS. 15A and 15B, (a) is a graph showing the absolute value of impedance, (b) is a graph showing phase shift characteristics, (c-1) is a graph showing impedance in Smith-chart form, (c-2) is a graph showing return loss. Specifically, FIG. 15A illustrates characteristics of a resonator when the I-R pitch is changed in a range from 0.40λ to 0.50λ in 0.02λ increments, as illustrated in the graph legend. FIG. 15B illustrates characteristics of a resonator when the I-R pitch is changed in a range from 0.50λ to 0.60λ in 0.02λ increments, as illustrated in the graph legend.

As can be seen from FIG. 15B, ripples at the higher edge of the stopband (specifically, on a higher frequency side relative to the antiresonant frequency) (in the portions enclosed by dashed lines in (b), (c-1), and (c-2) in FIG. 15B) increase with an increase in the I-R pitch from 0.5λ.

In contrast, as can be seen from FIG. 15A, the more the I-R pitch decreases from 0.5λ, the more ripples at the higher edge of the stopband (specifically, on a higher frequency side relative to the antiresonant frequency) (in the portions enclosed by solid lines in (b), (c-1), and (c-2) in FIG. 15A) are decreased. However, on the other hand, if the I-R pitch is decreased, new ripples occur (in the portions enclosed by dashed lines in (b), (c-1), and (c-2) in FIG. 15A) on a higher frequency side relative to the resonant frequency (specifically, between the resonant frequency and the antiresonant frequency), and increase with a decrease in the I-R pitch.

Specifically, a ripple that may occur in a higher frequency range than the resonant frequency of a resonator can be decreased by setting the I-R pitch of a resonator to at least 0.42λ and at most 0.50λ, and thus increase in insertion loss in the passband due to the ripple can be decreased.

By setting the I-R pitch of a resonator to at least 0.44λ and at most 0.46λ, (i) a ripple at the higher edge of a stopband, and (ii) a ripple that may occur in a higher frequency range than the resonant frequency can be both decreased, and thus insertion loss in the passband due to both such ripples can be decreased.

Embodiment 2

The present embodiment describes a radio frequency filter having an additional function of changing a passband by switching between the conducting state (on) and the non-conducting state (off) of switch elements, as compared with radio frequency filter 10 according to Embodiment 1.

[2.1 Basic Configuration of Radio Frequency Filter 20 According to Embodiment 2]

Figure 16:
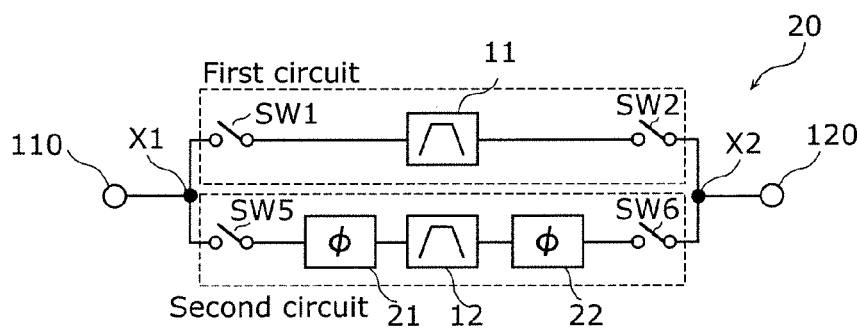
FIG. 16 is a circuit block diagram illustrating a radio frequency filter according to Embodiment 2.

FIG. 16 is a circuit block diagram illustrating radio frequency filter 20 according to Embodiment 2. Radio frequency filter 20 illustrated in FIG. 16 includes filters 11 and 12, phase shifters 21 and 22, switches SW1, SW2, SW5 and SW6, and input/output terminals 110 and 120. Radio frequency filter 20 according to the present embodiment is different from radio frequency filter 10 according to Embodiment 1 in that the first circuit and the second circuit have switch elements in the configuration. In the following, description of common points of radio frequency filter 20 according to the present embodiment to those of radio frequency filter 10 according to Embodiment 1 is omitted, and different points are mainly described.

The first circuit further includes switches SW1 and SW2.

The second circuit further includes switches SW5 and SW6.

Switch SW1 is a first switch element connected between node X1 and filter 11. Switch SW2 is a second switch element connected between node X2 and filter 11. Switch SW5 is a fifth switch element connected between node X1 and phase shifter 21. Switch SW6 is a sixth switch element connected between node X2 and phase shifter 22.

[2.2 Configuration of Radio Frequency Filter 20A According to Example 2]

Figure 17A:
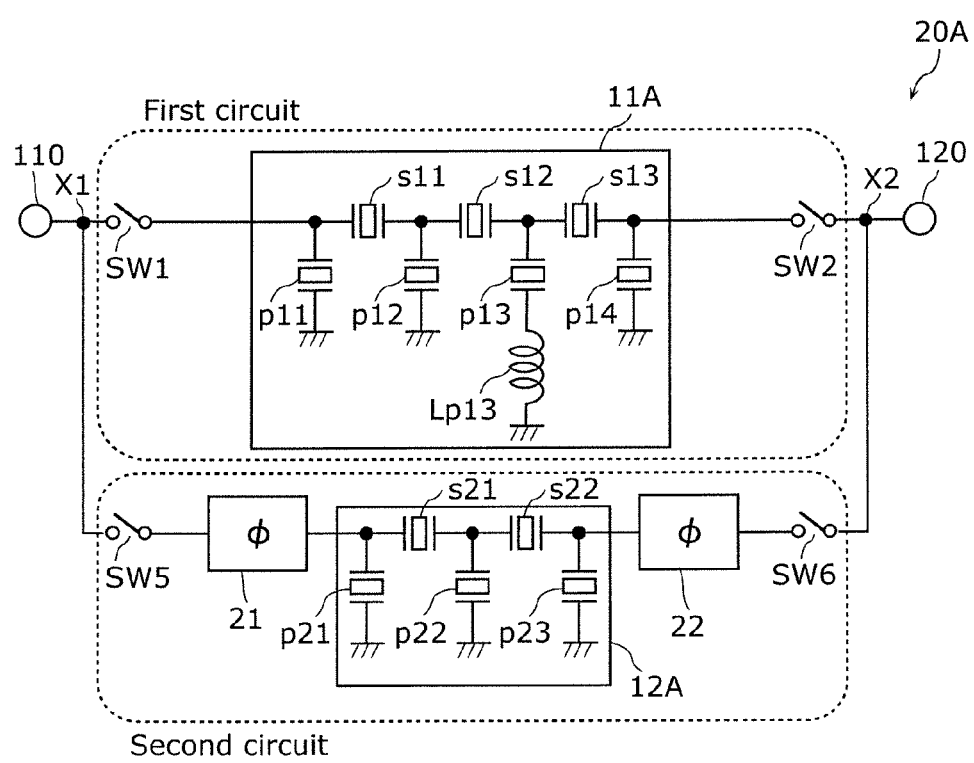
FIG. 17A illustrates a circuit configuration of a radio frequency filter according to Example 2.

FIG. 17A illustrates a circuit configuration of radio frequency filter 20A according to Example 2. Radio frequency filter 20A illustrated in FIG. 17A includes filters 11A and 12A, phase shifters 21 and 22, switches SW1, SW2, SW5 and SW6, and input/output terminals 110 and 120. Radio frequency filter 20A is a specific example of a circuit configuration of radio frequency filter 20 according to Embodiment 2, filter 11A is a specific example of a circuit configuration of filter 11, and filter 12A is a specific example of a circuit configuration of filter 12. Radio frequency filter 20A according to this example has a different configuration from that of radio frequency filter 10A according to Example 1 in that switch elements are disposed between the first circuit and nodes X1 and X2 and between the second circuit and nodes X1 and X2. In the following, description of the common points of radio frequency filter 20A according to this example to those of radio frequency filter 10A according to Example 1 is omitted, and different points are mainly described.

The first circuit further includes switches SW1 and SW2. The second circuit further includes switches SW5 and SW6.

Switch SW1 is a first switch element connected between node X1 and filter 11. Switch SW2 is a second switch element connected between node X2 and filter 11. Switch SW5 is a fifth switch element connected between node X1 and phase shifter 21. Switch SW6 is a sixth switch element connected between node X2 and phase shifter 22.

Table 2 shows circuit parameters of radio frequency filter 20A according to Example 2.

TABLE 2

| Example 2 | | Resonant frequency fr (MHz) | Antiresonant frequency fa (MHz) | Resonance fractional BW (%) | Electrostatic cap C0 (pF) | L (nH) | Phase shift (°) |
|---|---|---|---|---|---|---|---|
| Filter 11A | s11 | 1854.5 | 1919.4 | 3.5 | 3.04 | | |
| | s12 | 1861.1 | 1926.2 | 3.5 | 0.94 | | |
| | s13 | 1863.6 | 1928.9 | 3.5 | 0.77 | | |
| | p11 | 1777.3 | 1839.5 | 3.5 | 1.41 | | |
| | p12 | 1785.4 | 1847.9 | 3.5 | 0.26 | | |
| | p13 | 1800.7 | 1863.7 | 3.5 | 2.95 | | |
| | p14 | 1781.2 | 1843.6 | 3.5 | 1.38 | | |
| | Lp13 | | | | | 1.50 | |
| Filter 12A | s21 | 1897.4 | 1963.8 | 3.5 | 1.20 | | |
| | s22 | 1894.4 | 1960.7 | 3.5 | 0.69 | | |
| | p21 | 1850.1 | 1914.8 | 3.5 | 0.88 | | |
| | p22 | 1823.5 | 1887.3 | 3.5 | 6.15 | | |
| | p23 | 1830.9 | 1894.9 | 3.5 | 4.73 | | |
| Phase shifter 21 | | | | | | | 95.5 |
| Phase shifter 22 | | | | | | | 108.2 |

In the following, in the radio frequency filters according to Examples 2 and 3 described below, the second band is the LTE Band 3 receiving passband (1805 to 1880 MHz), the third band is the LTE Band 39 passband (1880 to 1920 MHz), and the first band is a combination of the Band 3 receiving passband and the Band 39 passband (1805 to 1920 MHz).

Specifically, radio frequency filter 20A includes two filters, namely filter 11A having the second band that is the Band 3 receiving passband, and filter 12A having the third band that is the Band 39 passband. Phase shifter 21 is disposed between filter 12A and node X1, and phase shifter 22 is disposed between filter 12A and node X2.

[2.3 Filter Characteristics of Radio Frequency Filter 20A According to Example 2]

Figure 17B:
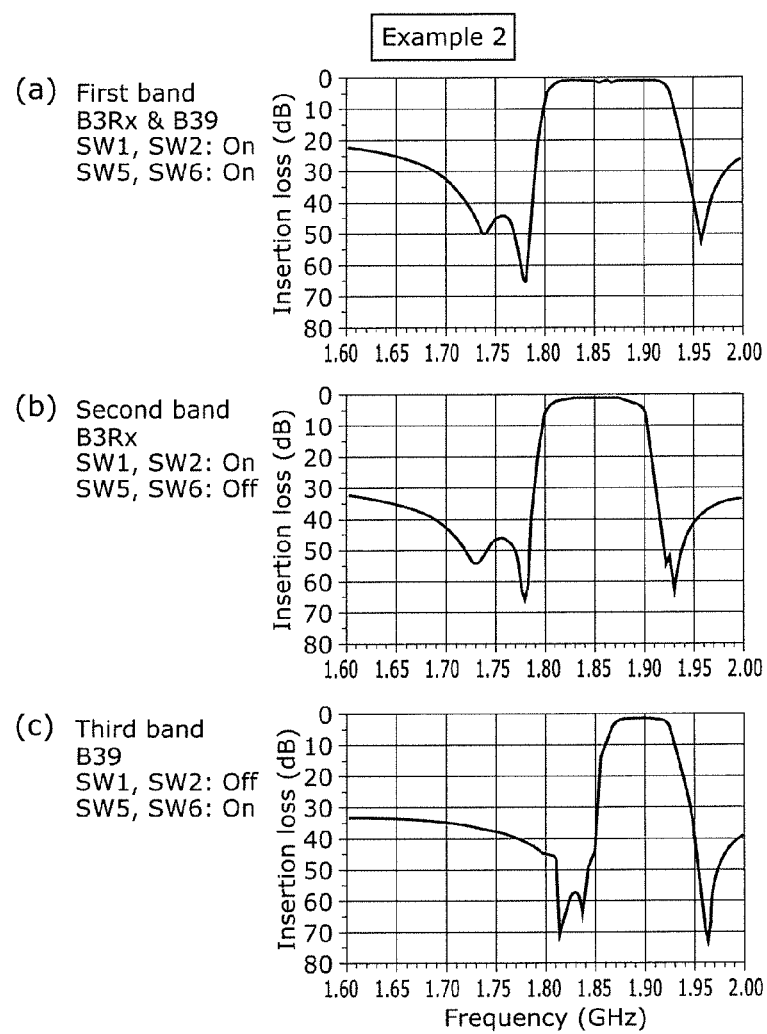
FIG. 17B illustrates graphs showing change in passing characteristics caused by switching between on and off of switches of the radio frequency filter according to Example 2.

FIG. 17B illustrates graphs showing change in passing characteristics by switching between on and off of the switches of radio frequency filter 20A according to Example 2. As illustrated in (a) of FIG. 17B, when all of switches SW1, SW2, SW5, and SW6 are conducting, radio frequency filter 20A is a filter whose passband is the first band (a combination of the Band 3 receiving passband and the Band 39 passband). As illustrated in (b) of FIG. 17B, when switches SW1 and SW2 are conducting, and SW5 and SW6 are non-conducting, radio frequency filter 20A is a filter whose passband is the second band (Band 3 receiving passband). As illustrated in (c) of FIG. 17B, when switches SW1 and SW2 are non-conducting, and SW5 and SW6 are conducting, radio frequency filter 20A is a filter whose passband is the third band (Band 39 passband).

Note that in this example, a circuit configuration in which switches SW1 and SW2 are disposed in the first circuit, and switches SW5 and SW6 are disposed in the second circuit is adopted, yet a configuration in which switches are connected only in the first circuit or a configuration in which switches are connected only in the second circuit may be adopted. In the case of the configuration in which switches are connected only in the first circuit, the radio frequency filter is a filter that switches between the first band and the third band. In the case of the configuration in which switches are connected only in the second circuit, the radio frequency filter is a filter that switches between the first band and the second band.

Also in radio frequency filter 20A according to Example 2, similarly to radio frequency filter 10A according to Example 1, phase shifters 21 and 22 are connected to the input/output terminals of filter 12A, so that a ripple is decreased in the first band of radio frequency filter 20A, thus decreasing insertion loss.

The following describes a factor that allows radio frequency filter 20A according to Example 2 to decrease a ripple in the passband and passband insertion loss.

Figure 18:
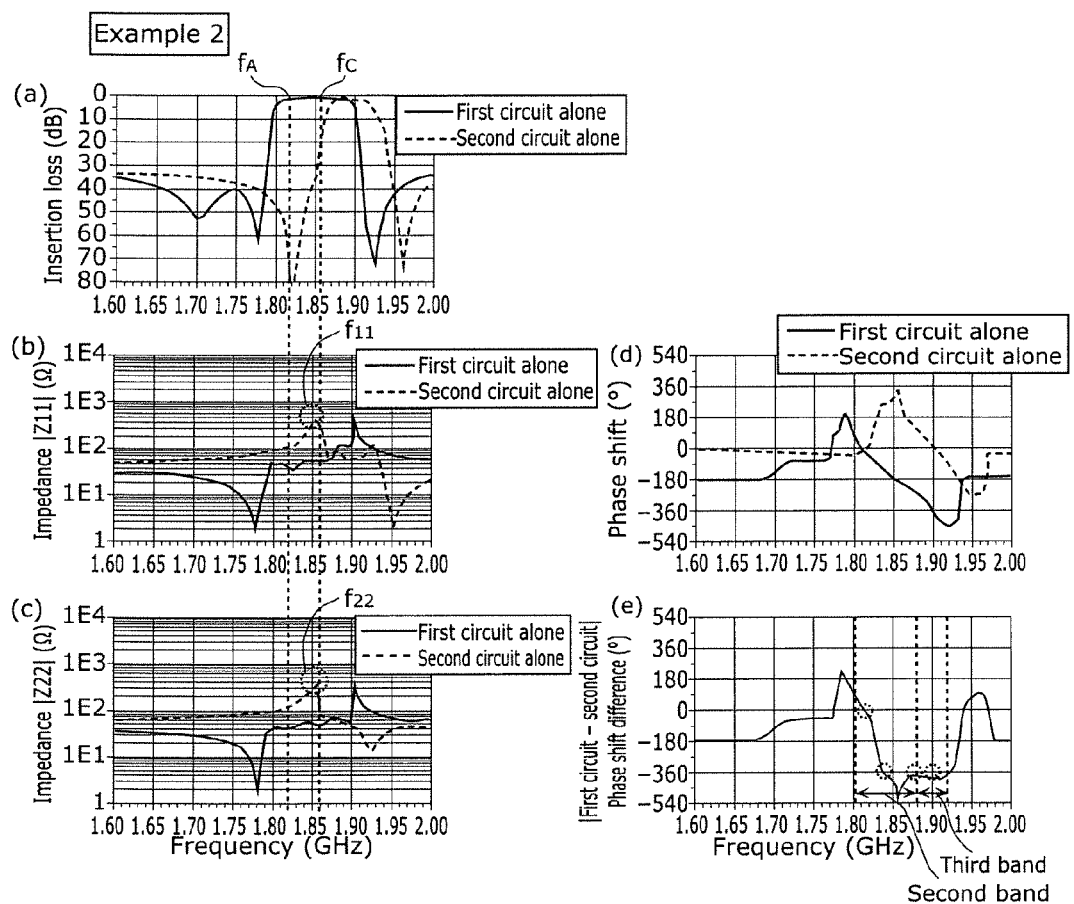
FIG. 18 illustrates graphs for describing a factor of increasing the bandwidth of the radio frequency filter according to Example 2.

FIG. 18 illustrates graphs for describing a factor of increasing the bandwidth of radio frequency filter 20A according to Example 2. Part (a) of FIG. 18 illustrates passing characteristics of the first circuit alone and the second circuit alone between nodes X1 and X2. Part (b) of FIG. 18 illustrates impedance characteristics when the first circuit alone is viewed from node X1 while switch SW1 is conducting, and impedance characteristics when the second circuit alone is viewed from node X1 while switch SW5 is conducting. Part (c) of FIG. 18 illustrates impedance characteristics when the first circuit alone is viewed from node X2 while switch SW2 is conducting, and impedance characteristics when the second circuit alone is viewed from node X2 while switch SW6 is conducting. Part (d) of FIG. 18 illustrates phase shift characteristics of the first circuit alone and the second circuit alone between nodes X1 and X2. Part (e) of FIG. 18 illustrates a difference between phase shifts caused by the first circuit and the second circuit.

In radio frequency filter 20A according to Example 2, the phase shifts caused by phase shifters 21 and 22 are adjusted so as to include, in a frequency range from lower edge frequency $f_A$ of the second band to lower cutoff frequency $f_C$ of the passband of filter 12A, frequency $f_{11}$ at which impedance $|Z11|$ when the second circuit alone is viewed from node X1 is highest out of frequencies at singular points at each of which impedance $|Z11|$ has a local maximum value. The phase shifts caused by phase shifters 21 and 22 are adjusted so as to include, in a frequency range from lower edge frequency $f_A$ of the second band to lower cutoff frequency $f_C$ of the passband of filter 12A, frequency $f_{22}$ at which impedance $|Z22|$ when the second circuit alone is viewed from node X2 is highest out of frequencies at singular points at each of which impedance $|Z22|$ has a local maximum value.

A phase shift change is great at frequency $f_A$ of the attenuation pole of filter 12A, and an amplitude difference between filters 11A and 12A increases with an increase in a difference between phase shifts caused thereby. Accordingly, frequencies $f_{11}$ and $f_{22}$ at which impedance is highest out of frequencies at singular points at each of which the second circuit has local maximum impedance are caused to fall within a frequency range from frequency $f_A$ to cutoff frequency $f_C$ by adjusting phase shifts caused by phase shifters 21 and 22, so that a radio frequency signal having a frequency in the frequency range can be prevented from flowing into filter 12A of the second circuit, as much as possible. Thus, a signal can be prevented, as much as possible, from sneaking into the second circuit in a frequency band in which a signal passing through the second circuit is attenuated. Accordingly, a ripple in the first band of radio frequency filter 20A is decreased, and thus insertion loss can be reduced.

Furthermore, radio frequency signals each having a frequency in the first band do not cancel out each other after passing through the first circuit and the second circuit, by adjusting phase shifts caused by phase shifters 21 and 22 to be the same in a frequency range in which an amplitude difference between the first circuit and the second circuit is small. Accordingly, a ripple in the first band can be decreased and insertion loss can be reduced.

As described above, when radio frequency filter 20A has a passband that is the first band due to switches SW1, SW2, SW5, and SW6 being in the conducting state, insertion loss in the first band can be reduced.

In this example, as illustrated in (e) of FIG. 18, when the second circuit alone is viewed from nodes X1 and X2 while switches SW5 and SW6 are conducting, the second band may include at least one frequency at which phase shifts caused by the first circuit and the second circuit are the same (0° or −360°) (circles indicated by the dashed lines in (e) of FIG. 18: three frequencies), and the third band may include at least one frequency at which phase shifts caused by the first circuit and the second circuit are the same (0° or −360°) (a circle indicated by the dashed line in (e) of FIG. 18: one frequency).

According to the above configuration, in frequency-tunable radio frequency filter 20A that can switch among the first band, the second band, and the third band, a ripple in the first band can be decreased, and insertion loss can be reduced.

[2.4 Filter Characteristics of Radio Frequency Filter 30 According to Example 3]

Figure 19:
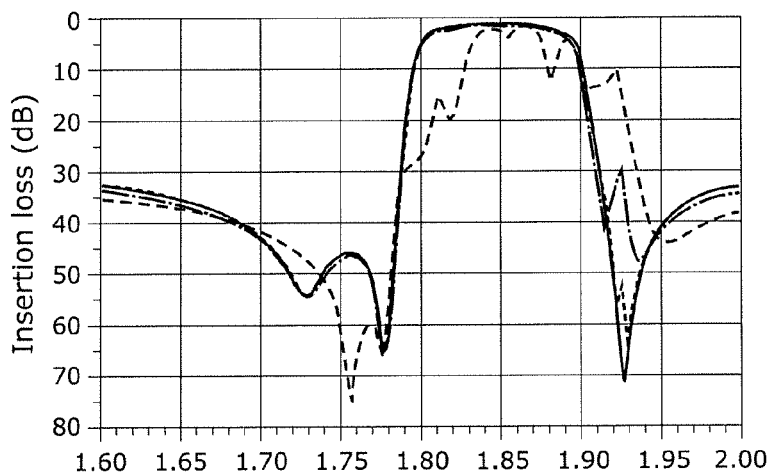
FIG. 19 illustrates graphs showing passing characteristics when off capacitance of switches of the radio frequency filter according to Example 2 is changed.
Figure 19:
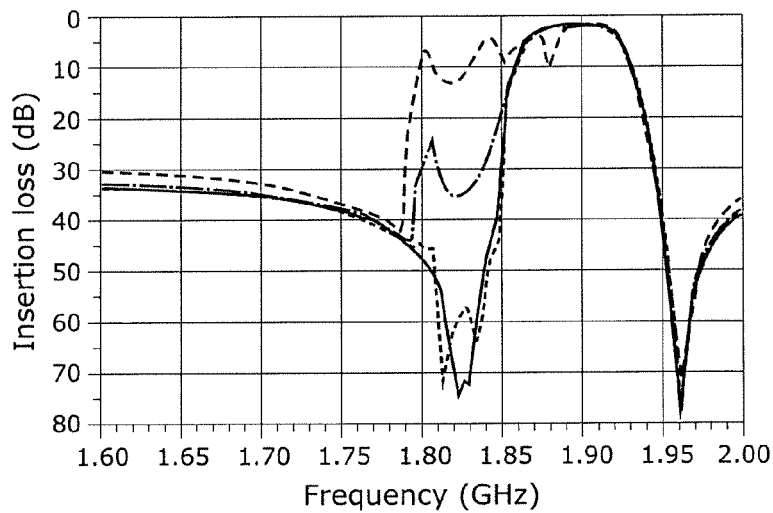

FIG. 19 illustrates graphs showing passing characteristics when off capacitance $C_{off}$ of switches of radio frequency filter 20A according to Example 2 is changed. When a switch element is non-conducting, impedance of the switch element is ideally infinite, yet in practice, a switch element in the non-conducting state has a capacity component due to parasitic capacitance of a semiconductor element (such as an FET) included in the switch element. The impedance of the switch element decreases with an increase in off capacitance $C_{off}$.

Accordingly, as illustrated in (a) of FIG. 19, characteristics of the passband (second band) of the first circuit and an attenuation band near the passband high-frequency side deteriorate due to the influence of the second circuit that includes switches SW5 and SW6 in the off state. More specifically, when filter 11 having a passband that is the second band is selected by causing switches SW1 and SW2 to be conducting and switches SW5 and SW6 to be non-conducting, a signal sneaks into the second circuit more as off capacitance $C_{off}$ increases. Accordingly, attenuation characteristics on a higher frequency side relative to the second band deteriorate, and also insertion loss increases due to the occurrence of a ripple in the second band.

As illustrated in (b) of FIG. 19, characteristics of the passband (third band) of the second circuit and an attenuation band near the passband low-frequency side deteriorate due to the influence of the first circuit that includes switches SW1 and SW2 in the off state. More specifically, when filter 12 having a passband that is the third band is selected by causing switches SW1 and SW2 to be non-conducting and switches SW5 and SW6 to be conducting, a signal sneaks into the first circuit more as off capacitance $C_{off}$ increases. Accordingly, attenuation characteristics on the lower frequency side relative to the third band deteriorate, and also insertion loss increases due to the occurrence of a ripple in the third band.

Note that there is no influence of off capacitance $C_{off}$ when all of switches SW1, SW2, SW5, and SW6 are conducting, and thus such a case is not mentioned herein.

Figure 20:
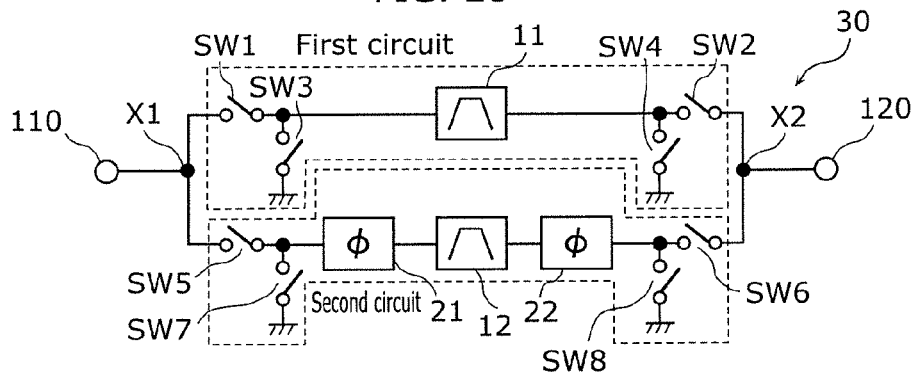
FIG. 20 is a circuit block diagram of a radio frequency filter according to Example 3.

The configuration illustrated in FIG. 20 is an example of a configuration of reducing such deterioration of filter characteristics due to off capacitance $C_{off}$ of the switch elements.

FIG. 20 is a circuit block diagram of radio frequency filter 30 according to Example 3. Radio frequency filter 30 illustrated in FIG. 20 includes filters 11 and 12, phase shifters 21 and 22, switches SW1, SW2, SW3, SW4, SW5, SW6, SW7, and SW8, and input/output terminals 110 and 120. Radio frequency filter 30 is different from radio frequency filter 20 according to Embodiment 2 in that switches SW3, SW4, SW7, and SW8 are disposed in the configuration. In the following, description of common points of radio frequency filter 30 according to this example to those of radio frequency filter 20 according to Embodiment 2 is omitted, and different points are mainly described.

The first circuit further includes switches SW3 and SW4.

The second circuit further includes switches SW7 and SW8.

Switch SW3 is a third switch element connected to the ground and a connection node of filter 11 and switch SW1, and switches SW1 and SW3 are switched between conducting and non-conducting states mutually exclusively from each other. Switch SW4 is a fourth switch element connected to the ground and a connection node of filter 11 and switch SW2, and switches SW2 and SW4 are switched between conducting and non-conducting states mutually exclusively from each other. Switch SW7 is a seventh switch element connected to the ground and a connection node of phase shifter 21 and switch SW5, and switches SW5 and SW7 are switched between conducting and non-conducting states mutually exclusively from each other. Switch SW8 is an eighth switch element connected to the ground and a connection node of phase shifter 22 and switch SW6, and switches SW6 and SW8 are switched between conducting and non-conducting states mutually exclusively from each other.

Radio frequency filter 30 includes two filters, namely, filter 11 having the second band that is the Band 3 receiving passband, and filter 12 having the third band that is the Band 39 passband. Phase shifter 21 is disposed between filter 12 and node X1, and phase shifter 22 is disposed between filter 12 and node X2.

Figure 21:
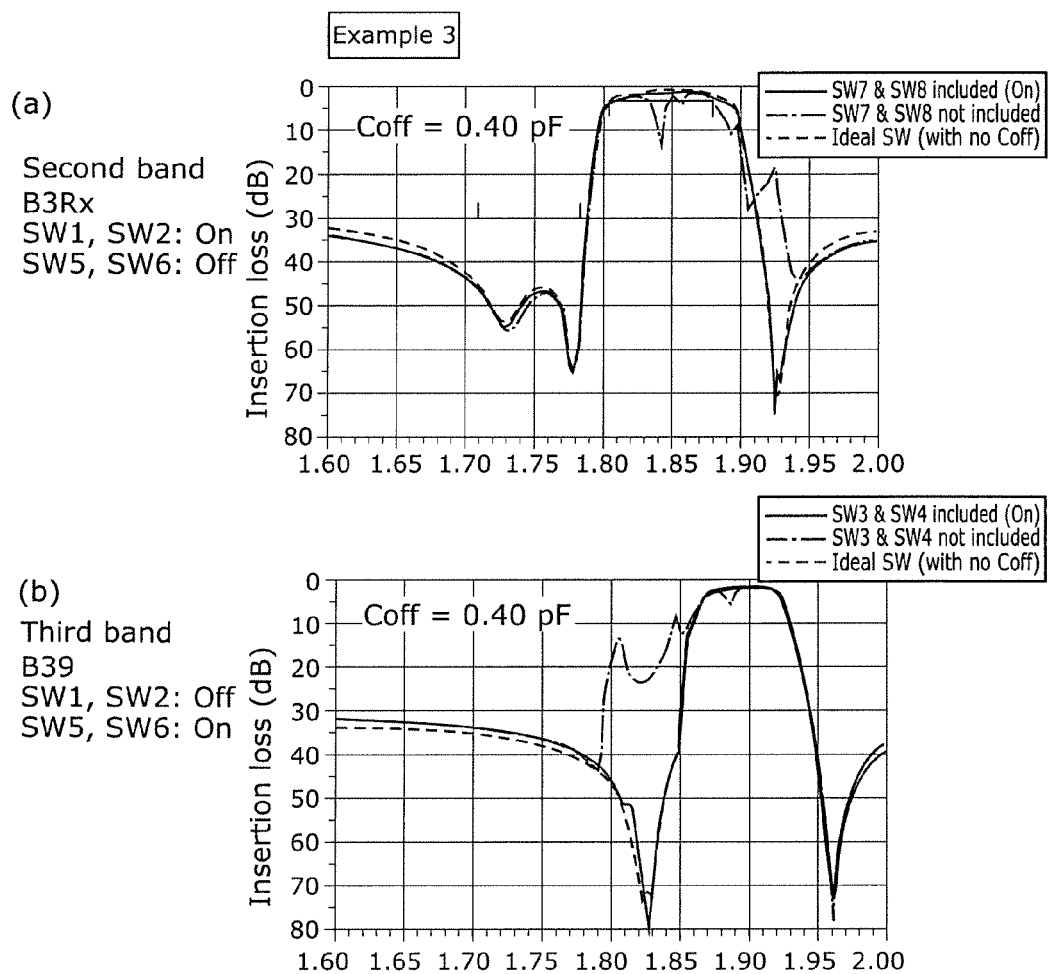
FIG. 21 illustrates graphs showing passing characteristics of the radio frequency filter according to Example 3.

FIG. 21 illustrates graphs showing passing characteristics of radio frequency filter 30 according to Example 3.

As illustrated in (a) of FIG. 21, even if switches SW5 and SW6 are off, switches SW7 and SW8 are on, and thus a signal can be prevented from sneaking into the second circuit as much as possible. Accordingly, radio frequency filter 30 (that includes switches SW7 & SW8) in which switches SW7 and SW8 are disposed has passing characteristics equivalent to those of an ideal SW (with no $C_{off}$). Specifically, the influence of the second circuit in which switches SW5 and SW6 are non-conducting is reduced and a ripple in the second band is decreased, thus reducing insertion loss, and furthermore attenuation characteristics near the second band can be improved.

As illustrated in (b) of FIG. 21, even if switches SW1 and SW2 are off, switches SW3 and SW4 are on, and thus a signal can be prevented from sneaking into the first circuit as much as possible. Accordingly, radio frequency filter 30 (that includes switches SW3 & SW4) in which switches SW3 and SW4 are disposed has passing characteristics equivalent to those of an ideal SW (with no $C_{off}$). Specifically, the influence of the first circuit in which switches SW1 and SW2 are non-conducting is reduced and a ripple in the third band is decreased, thus reducing insertion loss, and furthermore attenuation characteristics near the third band can be improved.

[2.5 Example of Circuit Configuration of Phase Shifters 21 and 22]

Phase shifters 21 and 22 are ideal elements in Examples 1 and 2, yet here, examples of a specific configuration of phase shifters 21 and 22 are to be described.

Figure 22A:
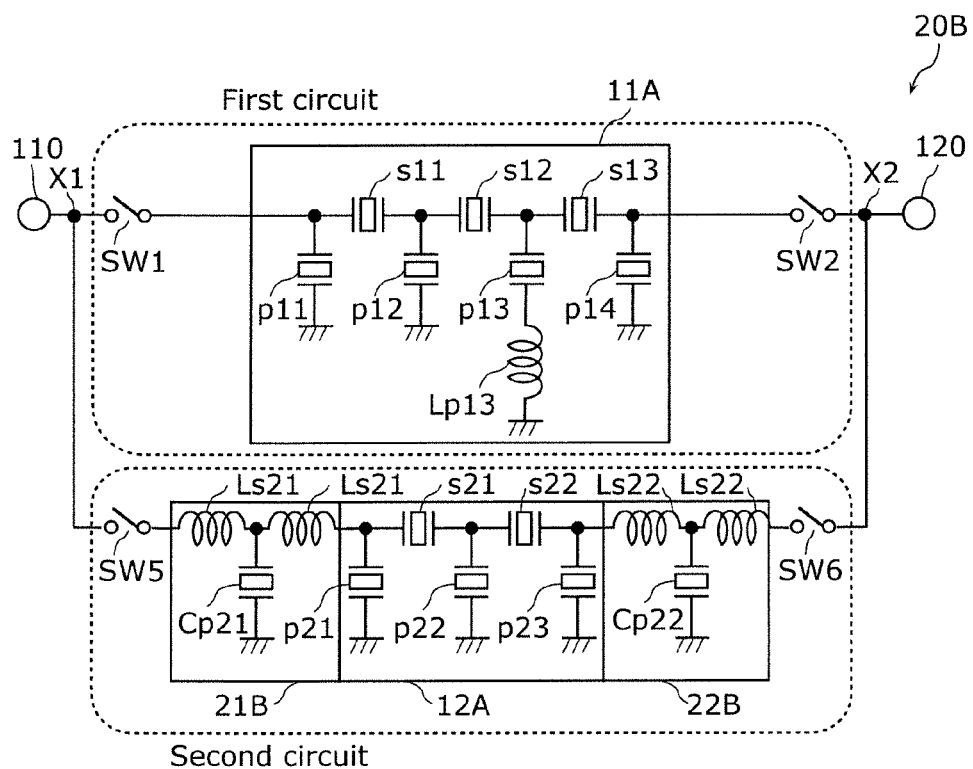
FIG. 22A illustrates a circuit configuration of a radio frequency filter according to Variation 1 of Embodiment 2.

FIG. 22A illustrates a circuit configuration of radio frequency filter 20B according to Variation 1 of Embodiment 2. Radio frequency filter 20B illustrated in FIG. 22A includes filters 11A and 12A, phase shifters 21B and 22B, switches SW1, SW2, SW5 and SW6, and input/output terminals 110 and 120. Radio frequency filter 20B according to this variation is different from radio frequency filter 20A according to Example 2 in that specific circuit configurations of the phase shifters are illustrated. In the following, description of the common points of radio frequency filter 20B according to this variation to those of radio frequency filter 20A according to Example 2 is omitted, and different points are mainly described.

Phase shifter 21B is a T first phase shifter that includes two inductors Ls21 disposed on a series-arm path that connects node X1 and one terminal of filter 12A, and capacitor Cp21 connected to the ground and a node on the series-arm path. Phase shifter 22B is a T second phase shifter that includes two inductors Ls22 disposed on a series-arm path that connects node X2 and the other terminal of filter 12A, and capacitor Cp22 connected to the ground and a node on the series-arm path. Phase shifter 21B and phase shifter 22B are each included in a low-pass filter circuit (LPF phase shifter). Note that two inductors Ls21 may have different inductance values. Further, two inductors Ls21 may not be disposed and rather, one inductor may be disposed.

Figure 22B:
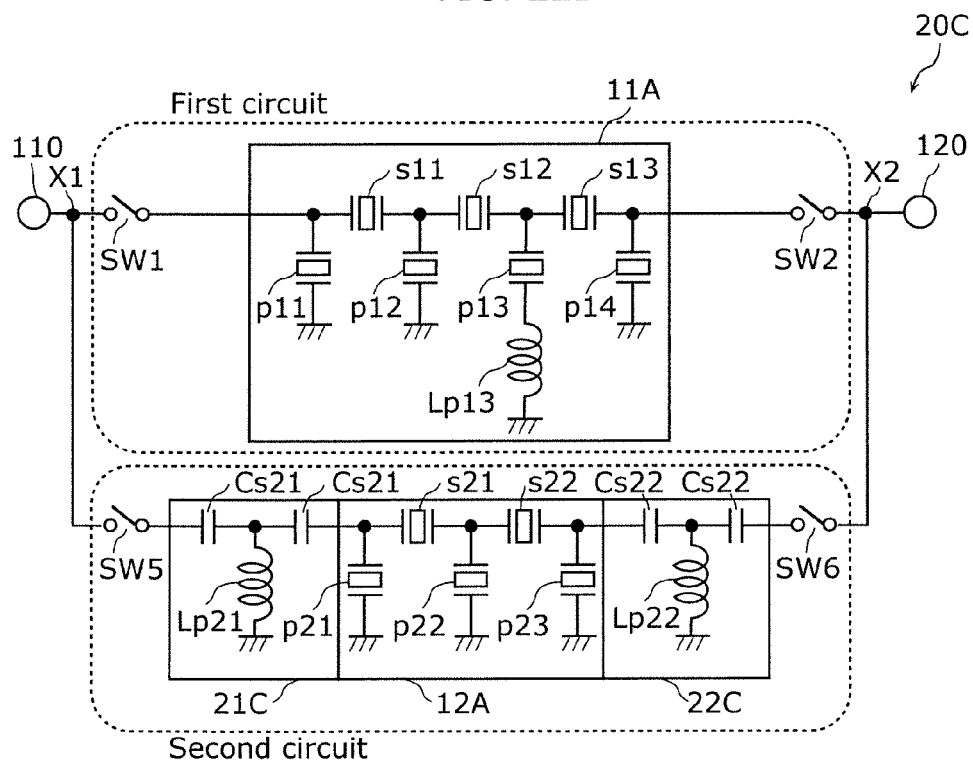
FIG. 22B illustrates a circuit configuration of a radio frequency filter according to Variation 2 of Embodiment 2.

FIG. 22B illustrates a circuit configuration of radio frequency filter 20C according to Variation 2 of Embodiment 2. Radio frequency filter 20C illustrated in FIG. 22B includes filters 11A and 12A, phase shifters 21C and 22C, switches SW1, SW2, SW5 and SW6, and input/output terminals 110 and 120. Radio frequency filter 20C according to this variation is different from radio frequency filter 20A according to Example 2 in that specific circuit configurations of the phase shifters are illustrated. In the following, description of the common points of radio frequency filter 20C according to this variation to those of radio frequency filter 20A according to Example 2 is omitted, and different points are mainly described.

Phase shifter 21C is a T first phase shifter that includes two capacitors Cs21 disposed on a series-arm path that connects node X1 and one terminal of filter 12A, and inductor Lp21 connected to the ground and a node on the series-arm path. Phase shifter 22C is a T second phase shifter that includes two capacitors Cs22 disposed on a series-arm path that connects node X2 and the other terminal of filter 12A, and inductor Lp22 connected to the ground and a node on the series-arm path. Phase shifter 21C and phase shifter 22C are each included in a high-pass filter circuit (HPF phase shifter). Note that two capacitors Cs21 may have different capacitance values. Further, two capacitors Cs21 may not be disposed and rather, one capacitor Cs21 may be disposed.

Also in radio frequency filter 20B according to Variation 1 and radio frequency filter 20C according to Variation 2, passband characteristics similar to those of radio frequency filter 20A according to Example 2 in which phase shifters 21 and 22 are achieved by ideal elements can be obtained. Specifically, phase shifts caused by phase shifters 21B and 22B in the second circuit and phase shifters 21C and 22C in the second circuit are adjusted to locate a frequency at which impedance is highest in the second band, in a range from an attenuation band of the second circuit on a lower frequency side relative to the third band which is a frequency range of the first band in which the amplitude difference is great, namely from the lowest frequency of the attenuation pole in the second circuit to a lower 10-dB cutoff frequency of the second band.

Figure 23:
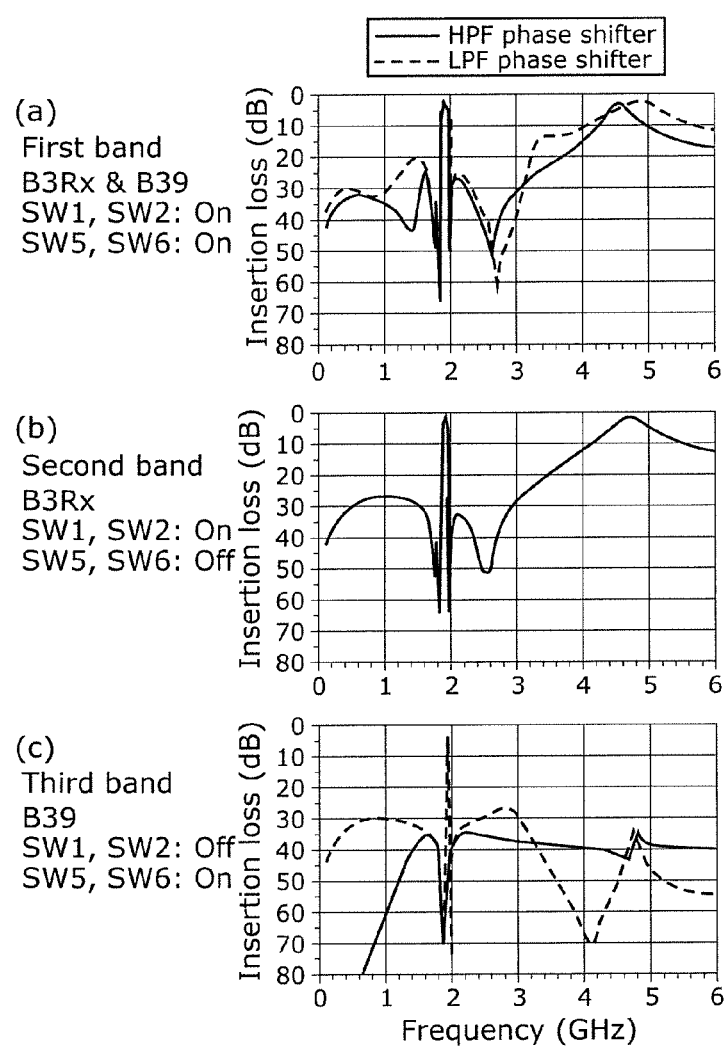
FIG. 23 illustrates graphs showing comparisons of passing characteristics between the radio frequency filters according to Variations 1 and 2 of Embodiment 2.

FIG. 23 illustrates graphs showing comparisons of passing characteristics between the radio frequency filters according to Variations 1 and 2 of Embodiment 2.

When a high-pass filter circuit is applied as a phase shifter, attenuation characteristics on the passband low-frequency side improve when the first band and the third band are selected as illustrated in (a) and (c) of FIG. 23.

On the other hand, when a low-pass filter circuit is applied as a phase shifter, attenuation characteristics improve on the passband high-frequency side (for example, at a frequency that is twice or 3 times the center frequency) when the first band and the third band are selected, as illustrated in (a) and (c) of FIG. 23.

According to the radio frequency filters according to Variations 1 and 2, the circuit configuration of a phase shifter can be selected as appropriate according to characteristics of a radio frequency filter that the filter is to have.

Note that in radio frequency filter 20B according to Variation 1 and radio frequency filter 20C according to Variation 2, one of the first phase shifter and the second phase shifter may be a low-pass filter circuit, and the other may be a high-pass filter circuit.

In Examples 1 and 2, the phase shifters are T phase shifters, but may be n phase shifters in each of which a series-arm circuit includes one of a capacitor and an inductor, and a parallel-arm circuit includes the other of a capacitor and an inductor. Specifically, the first phase shifter and the second phase shifter may include at least two elements (two arms). The first phase shifter and the second phase shifter may be delay lines each including a stripline or a microstrip line.

Embodiment 3

The present embodiment describes a radio frequency filter in which a circuit that includes a third filter and switch elements are connected to nodes X1 and X2, in addition to the first circuit and the second circuit.

[3.1 Circuit Configuration of Radio Frequency Filter 40A According to Example 4]

Figure 24A:
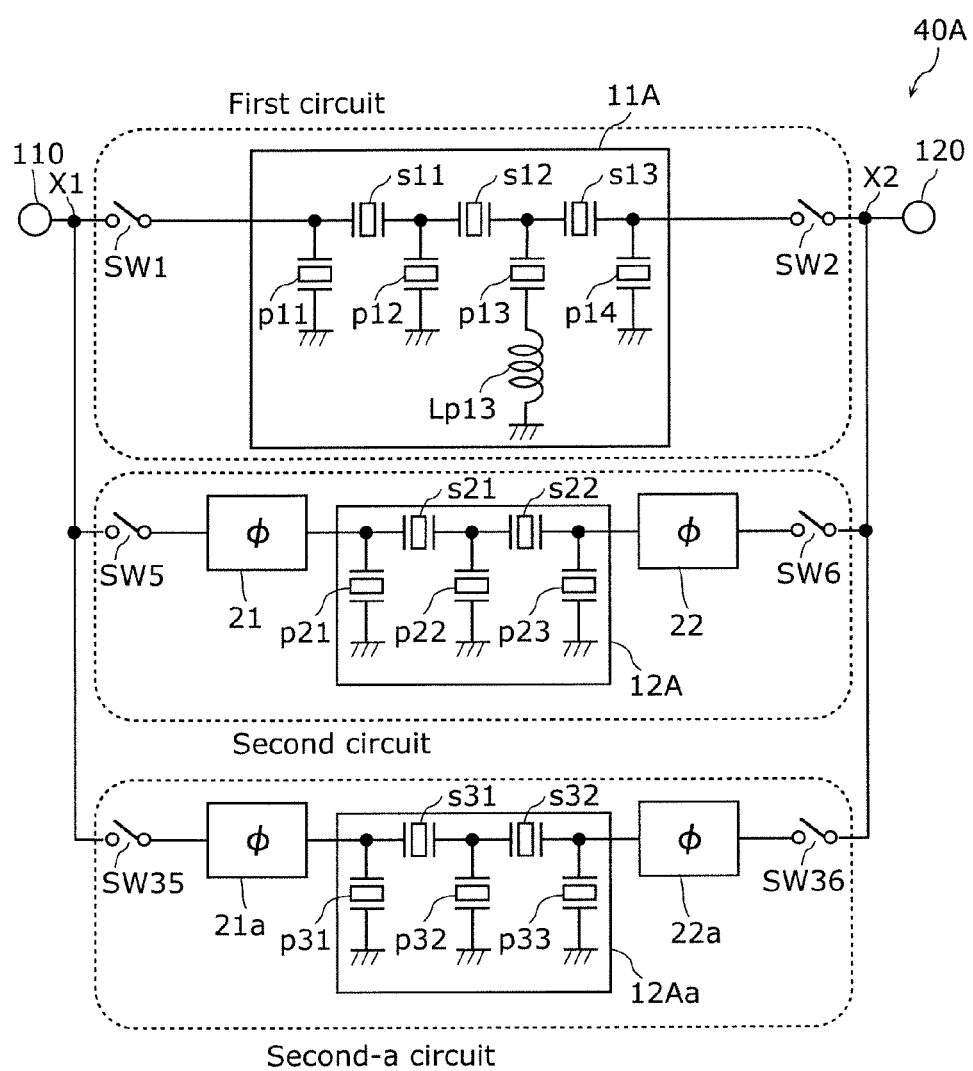
FIG. 24A illustrates a circuit configuration of a radio frequency filter according to Example 4.

FIG. 24A illustrates a circuit configuration of radio frequency filter 40A according to Example 4. Radio frequency filter 40A illustrated in FIG. 24A includes filters 11A, 12A, and 12Aa, phase shifters 21, 22, 21a, and 22a, switches SW1, SW2, SW5, SW6, SW35, and SW36, and input/output terminals 110 and 120. Radio frequency filter 40A according to this example is different from radio frequency filter 20A according to Example 2 in that a second-a circuit (third circuit) that includes filter 12Aa and switches SW35 and SW36 is added in parallel between node X1 and node X2 in the configuration. In the following, description of the common points of radio frequency filter 40A according to this example to those of radio frequency filter 20A according to Example 2 is omitted, and different points are mainly described.

Filter 12Aa is a third filter that constitutes the second-a circuit together with, for instance, phase shifters 21a and 22a.

Switch SW35 is a switch element connected between node X1 and phase shifter 21a. Switch SW36 is a switch element connected between node X2 and phase shifter 22a.

The second-a circuit that includes filter 12Aa, phase shifters 21a and 22a, and switches SW35 and SW36 is connected to nodes X1 and X2.

Phase shifter 21a is a third phase shifter connected to one terminal of filter 12Aa. Phase shifter 22a is a fourth phase shifter connected to the other terminal of filter 12Aa. Specifically, switch SW35, phase shifter 21a, filter 12Aa, phase shifter 22a, and switch SW36 are connected in series in this order between nodes X1 and X2.

Filter 12Aa includes series-arm resonators s31 and s32 disposed on a path that connects nodes X1 and X2, and parallel-arm resonators p31, p32, and p33 each disposed between a node on the path and the ground. Accordingly, this makes filter 12Aa a ladder bandpass filter. Filter 12Aa has a passband that is a third-a band (fifth band) that includes a portion of a frequency range of a first-a band (fourth band) having a different frequency range from that of the first band, has a narrower bandwidth than that of the first-a band, has a higher frequency range than the center frequency of the second band, and has a different frequency range from that of the third band.

Table 3 shows circuit parameters of radio frequency filter 40A according to Example 4.

TABLE 3

| Example 4 | | Resonant frequency fr (MHz) | Antiresonant frequency fa (MHz) | Resonance fractional BW (%) | Electrostatic cap C0 (pF) | L (nH) | Phase shift (°) |
|---|---|---|---|---|---|---|---|
| Filter 11A | s11 | 1875.0 | 1940.6 | 3.5 | 5.35 | | |
| | s12 | 1857.4 | 1922.4 | 3.5 | 0.83 | | |
| | s13 | 1859.5 | 1924.6 | 3.5 | 0.72 | | |
| | p11 | 1780.7 | 1843.1 | 3.5 | 1.24 | | |
| | p12 | 1769.2 | 1831.1 | 3.5 | 0.13 | | |
| | p13 | 1797.5 | 1860.5 | 3.5 | 3.12 | | |
| | p14 | 1780.6 | 1842.9 | 3.5 | 1.34 | | |
| | Lp13 | | | | | 1.50 | |

TABLE 3-continued

| Example 4 | | Resonant frequency fr (MHz) | Antiresonant frequency fa (MHz) | Resonance fractional BW (%) | Electrostatic cap C0 (pF) | L (nH) | Phase shift (°) |
|---|---|---|---|---|---|---|---|
| Filter 12A | s21 | 1898.0 | 1964.5 | 3.5 | 1.39 | | |
| | s22 | 1894.8 | 1961.1 | 3.5 | 0.69 | | |
| | p21 | 1850.3 | 1915.1 | 3.5 | 0.45 | | |
| | p22 | 1825.1 | 1889.0 | 3.5 | 6.14 | | |
| | p23 | 1830.6 | 1894.7 | 3.5 | 4.67 | | |
| Phase shifter 21 | | | | | | | 87.6 |
| Phase shifter 22 | | | | | | | 101.7 |
| Filter 12Aa | s31 | 1906.4 | 1992.2 | 4.5 | 0.82 | | |
| | s32 | 1898.5 | 1983.9 | 4.5 | 2.67 | | |
| | p31 | 1839.9 | 1922.7 | 4.5 | 2.51 | | |
| | p32 | 1821.1 | 1903.1 | 4.5 | 3.17 | | |
| | p33 | 1843.8 | 1926.8 | 4.5 | 1.62 | | |
| Phase shifter 21a | | | | | | | 101.4 |
| Phase shifter 22a | | | | | | | 98.6 |

In the following, in the radio frequency filter according to Example 4, the second band is the LTE Band 3 receiving passband (1805 to 1880 MHz), the third band is the LTE Band 39 passband (1880 to 1920 MHz), the third-a band ranges from 1880 to 1950 MHz, the first band is a combination of the Band 3 receiving passband and the Band 39 passband (1805 to 1920 MHz), and the first-a band ranges from 1805 to 1950 MHz.

[3.2 Filter Characteristics of Radio Frequency Filter 40A According to Example 4]

Figure 24B:
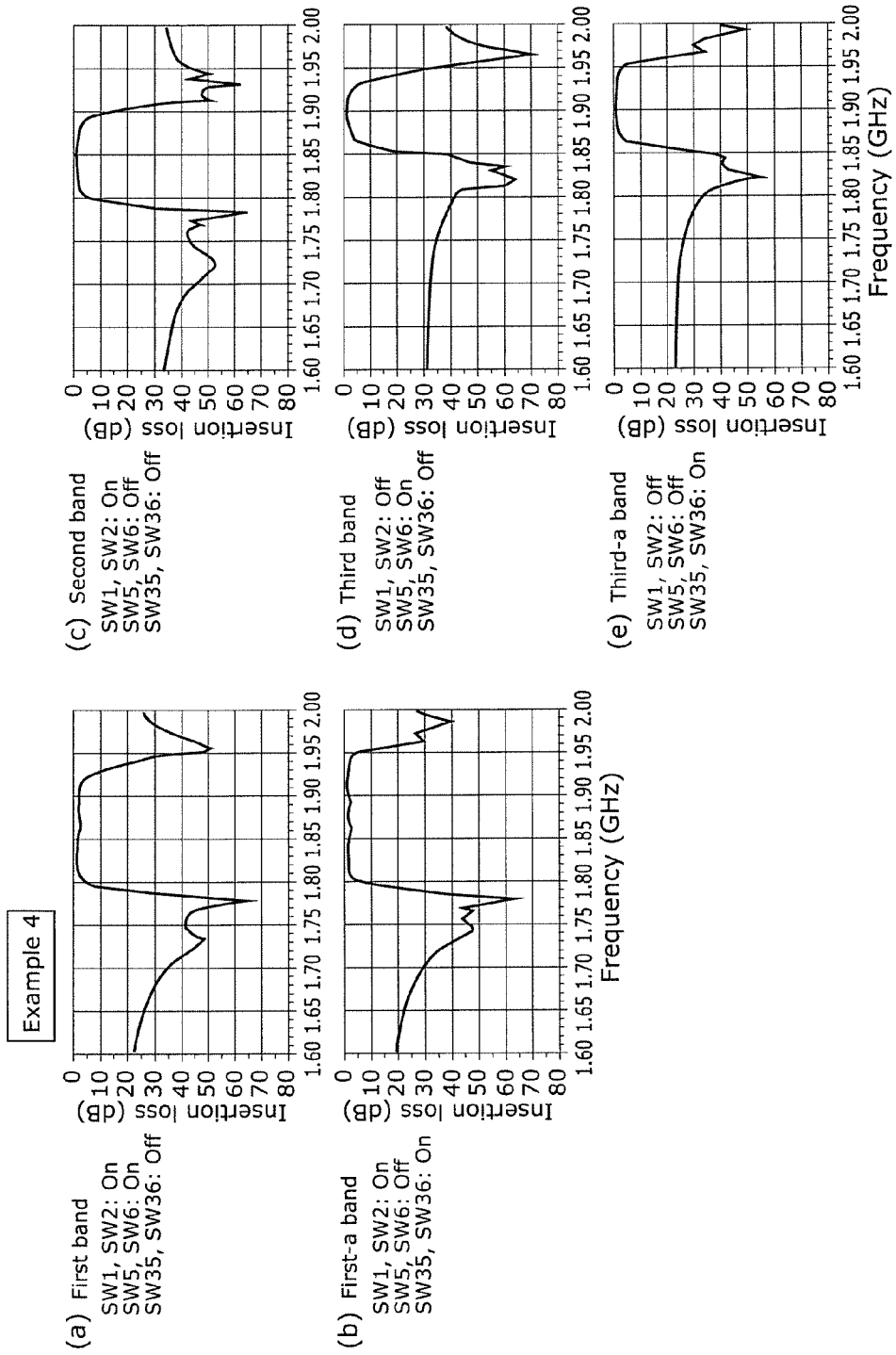
FIG. 24B illustrates graphs showing change in passing characteristics caused by switching between on and off of switches of the radio frequency filter according to Example 4.

FIG. 24B illustrates graphs showing change in passing characteristics caused by switching between on and off of the switches of radio frequency filter 40A according to Example 4. Radio frequency filter 40A is a frequency-tunable radio frequency filter that can be changed to a filter having a plurality of bandwidths by switching as appropriate between the conducting and non-conducting states of switches SW1, SW2, SW5, SW6, SW35, and SW36. Note that in this example, five bandwidths can be switched from one to another.

As illustrated in (a) of FIG. 24B, radio frequency filter 40A has a passband that is the first band when switches SW1, SW2, SW5, and SW6 are conducting and switches SW35 and SW36 are non-conducting. As illustrated in (b) of FIG. 24B, radio frequency filter 40A has a passband that is the first-a band when switches SW1, SW2, SW35, and SW36 are conducting and switches SW5 and SW6 are non-conducting. As illustrated in (c) of FIG. 24B, radio frequency filter 40A has a passband that is the second band when switches SW1 and SW2 are conducting and switches SW5, SW6, SW35, and SW36 are non-conducting. As illustrated in (d) of FIG. 24B, radio frequency filter 40A has a passband that is the third band when switches SW5 and SW6 are conducting and switches SW1, SW2, SW35, and SW36 are non-conducting. As illustrated in (e) of FIG. 24B, radio frequency filter 40A has a passband that is the third-a band when switches SW35 and SW36 are conducting and switches SW1, SW2, SW5, and SW6 are non-conducting.

In radio frequency filter 40A according to Example 4, since phase shifters 21 and 22 are connected to the input/output terminals of filter 12A, and phase shifters 21a and 22a are connected to the input/output terminals of filter 12Aa, ripples are decreased in the first band and the first-a band of radio frequency filter 40A, thus decreasing insertion loss.

The following describes a factor that allows radio frequency filter 40A according to Example 4 to decrease ripples and insertion loss in the first band and the first-a band.

Figure 25:
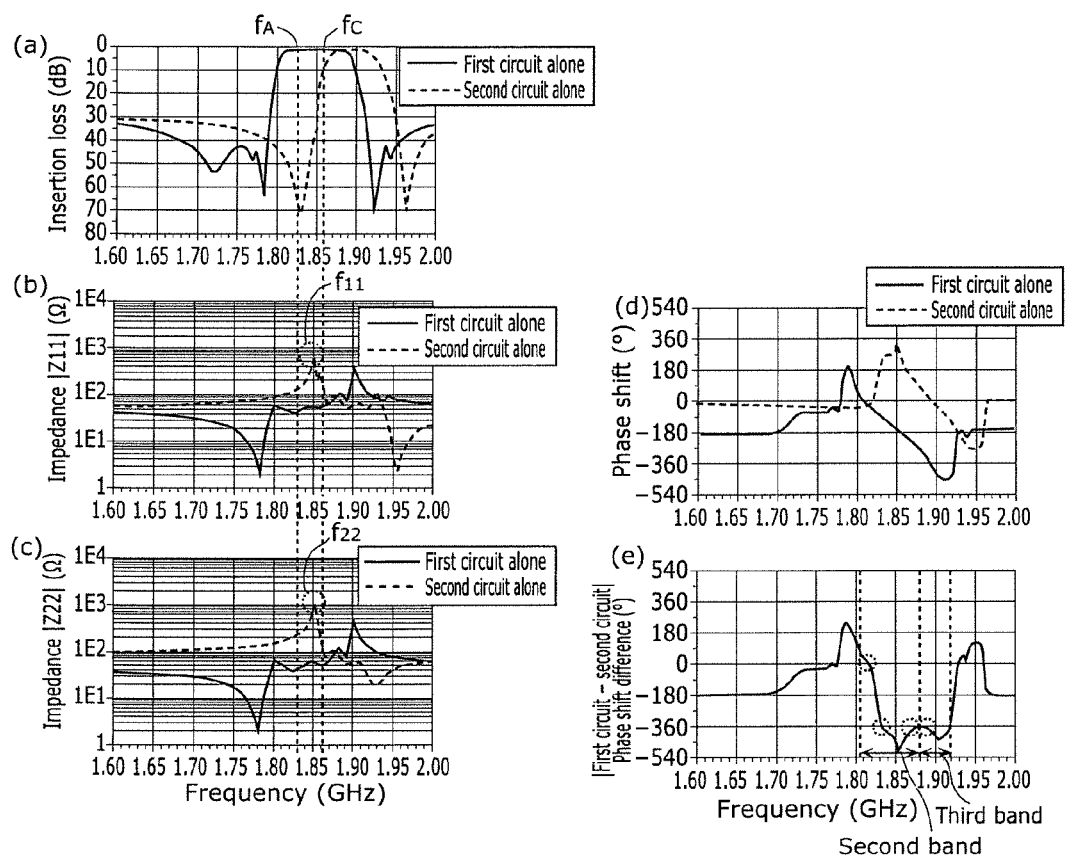
FIG. 25 illustrates graphs for describing a factor of increasing the width of a first band of the radio frequency filter according to Example 4.

FIG. 25 illustrates graphs for describing a factor of increasing the width of the first band of radio frequency filter 40A according to Example 4. Note that when the first band is selected as a passband of radio frequency filter 40A, switches SW1, SW2, SW5, and SW6 are conducting and switches SW35 and SW36 are non-conducting. Part (a) of FIG. 25 illustrates passing characteristics of the first circuit alone and the second circuit alone between nodes X1 and X2. Part (b) of FIG. 25 illustrates impedance characteristics when the first circuit alone is viewed from node X1 while switch SW1 is conducting, and impedance characteristics when the second circuit alone is viewed from node X1 while switch SW5 is conducting. Part (c) of FIG. 25 illustrates impedance characteristics when the first circuit alone is viewed from node X2 while switch SW5 is conducting, and impedance characteristics when the second circuit alone is viewed from node X2 while switch SW6 is conducting. Part (d) of FIG. 25 illustrates phase shift characteristics of the first circuit alone and the second circuit alone between nodes X1 and X2. Part (e) of FIG. 25 illustrates a difference between phase shifts caused by the first circuit and the second circuit.

In radio frequency filter 40A according to Example 4, when the first band is selected, phase shifts caused by phase shifters 21 and 22 are adjusted to include, in a frequency range from lower edge frequency $f_A$ of the second band to lower cutoff frequency $f_C$ of the passband of filter 12A, frequency $f_{11}$ at which impedance |Z11| when the second circuit alone is viewed from node X1 is highest out of frequencies at singular points at each of which impedance |Z11| has a local maximum value. Further, phase shifts caused by phase shifters 21 and 22 are adjusted to include, in a frequency range from lower edge frequency $f_A$ of the second band to lower cutoff frequency $f_C$ of the passband of filter 12A, frequency $f_{22}$ at which impedance |Z22| when the second circuit alone is viewed from node X2 is highest out of frequencies at singular points at each of which impedance |Z22| has a local maximum value.

A change in phase shift is great at frequency $f_A$ of the attenuation pole of filter 12A, and an amplitude difference between filters 11A and 12A increases with an increase in a difference between phase shifts caused thereby. Accordingly, by adjusting phase shifts caused by phase shifters 21 and 22, a singular point at which the second circuit has local maximum impedance is caused to fall within a frequency range from frequency $f_A$ of the attenuation pole on the passband low-frequency side of filter 12A to lower 10-dB cutoff frequency $f_C$, and thus a radio frequency signal having a frequency in the frequency range can be prevented from flowing into filter 12A of the second circuit as much as possible. Specifically, a signal can be prevented, as much as possible, from sneaking into the second circuit in a frequency band in which a signal passing through the second circuit is attenuated. Accordingly, a ripple in the first band of radio frequency filter 40A can be decreased, and insertion loss can be reduced.

Furthermore, phase shifts caused by the first circuit and the second circuit are adjusted to be the same in a frequency range in which an amplitude difference between the first circuit and the second circuit is small by adjusting the phase shifts caused by phase shifters 21 and 22, and thus radio frequency signals each having a frequency in the first band do not cancel out each other after passing through the first circuit and the second circuit. Accordingly, at a frequency in the first band of radio frequency filter 40A, a ripple in the first band can be decreased and insertion loss can be reduced.

In this example, as illustrated in (e) of FIG. 25, when the second circuit alone is viewed from nodes X1 and X2 while switches SW5 and SW6 are conducting, the second band may include at least one frequency at which phase shifts caused by the first circuit and the second circuit are the same (0° or −360°) (circles indicated by the dashed-lines in (e) of FIG. 25: three frequencies), and the third band may include at least one frequency at which phase shifts caused by the first circuit and the second circuit are the same (0° or −360°) (a circle indicated by the dashed-line in (e) of FIG. 25: one frequency).

According to the above configuration, a ripple in the first band can be decreased in frequency-tunable radio frequency filter 40A that can switch the first band, the second band, and the third band from one to another.

Figure 26:
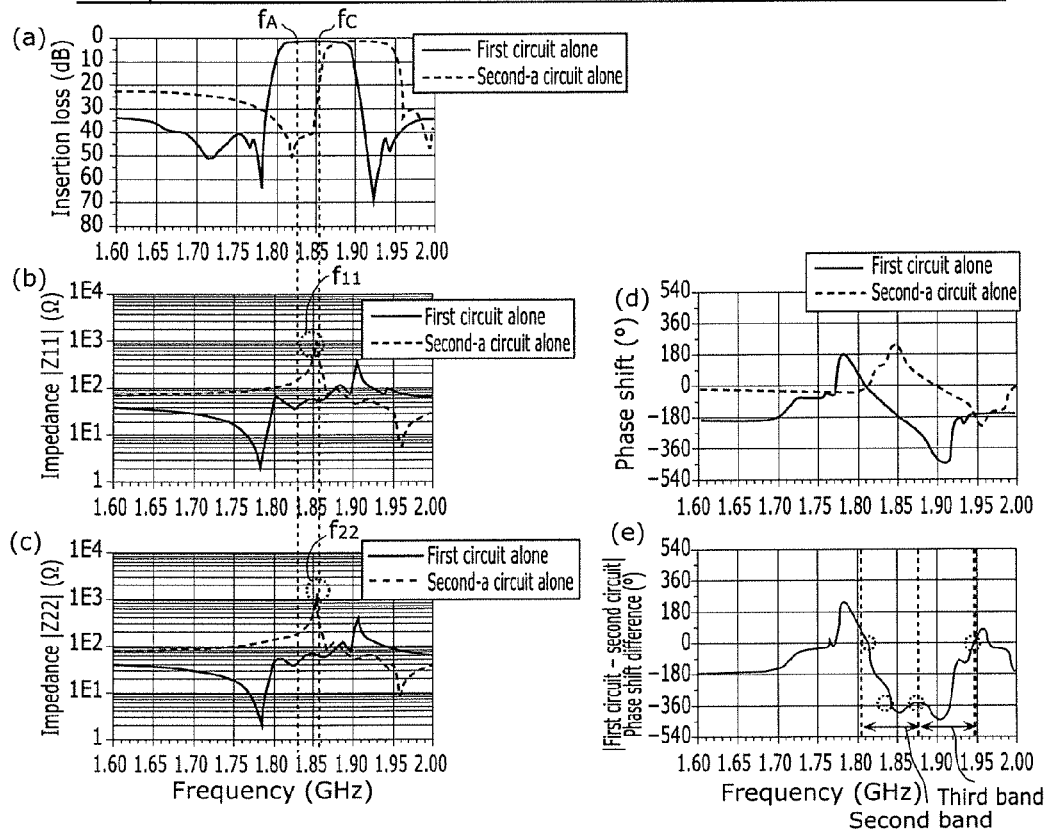
FIG. 26 illustrates graphs for describing a factor of increasing the width of a first-a band of the radio frequency filter according to Example 4.

FIG. 26 illustrates graphs for describing a factor of increasing the width of the first-a band of radio frequency filter 40A according to Example 4. Note that when the first-a band is selected as a passband of radio frequency filter 40A, switches SW1, SW2, SW35, and SW36 are conducting, and switches SW5 and SW6 are non-conducting. Part (a) of FIG. 26 illustrates passing characteristics of the first circuit alone and the second-a circuit alone between nodes X1 and X2. Part (b) of FIG. 26 illustrates impedance characteristics when the first circuit alone with switch SW1 conducting and the second-a circuit alone with switch SW35 conducting are viewed from node X1. Part (c) of FIG. 26 illustrates impedance characteristics when the first circuit alone with switch SW2 conducting and the second-a circuit alone with switch SW36 conducting are viewed from node X2. Part (d) of FIG. 26 illustrates phase shift characteristics of the first circuit alone and the second-a circuit alone between nodes X1 and X2. Part (e) of FIG. 26 illustrates a difference between phase shifts caused by the first circuit and the second-a circuit.

In radio frequency filter 40A according to Example 4, when the first-a band is selected, the phase shifts caused by phase shifters 21a and 22a are adjusted to include, in a frequency range from lower edge frequency $f_A$ of the second band to lower cutoff frequency $f_C$ of the passband of filter 12A, frequency $f_{11}$ at which impedance |Z11| when the second-a circuit alone is viewed from node X1 is highest out of frequencies at singular points at each of which impedance |Z11| has a local maximum value. The phase shifts caused by phase shifters 21a and 22a are adjusted to include, in a frequency range from lower edge frequency $f_A$ of the second band to lower cutoff frequency $f_C$ of the passband of filter 12A, frequency $f_{22}$ at which impedance |Z22| when the second-a circuit alone is viewed from node X2 is highest out of frequencies at singular points at each of which impedance |Z22| has a local maximum value.

A change in phase shift is great at frequency $f_A$ of the attenuation pole of filter 12Aa, so that a difference between phase shifts caused by filter 12Aa and filter 11A is great and an amplitude difference therebetween is also great. Accordingly, by adjusting phase shifts caused by phase shifters 21a and 22a, a singular point at which the second-a circuit has local maximum impedance is caused to fall within a frequency range from frequency $f_A$ of the attenuation pole on the passband low-frequency side of filter 12Aa to lower 10-dB cutoff frequency $f_C$, so that a radio frequency signal having a frequency in the frequency range can be prevented, as much as possible, from flowing into filter 12Aa of the second-a circuit. Specifically, a signal can be prevented, as much as possible, from sneaking into the second-a circuit in a frequency band in which a signal passing through the second-a circuit is attenuated. Accordingly, a ripple in the first-a band of radio frequency filter 40A can be decreased, and insertion loss can be reduced.

Furthermore, phase shifts caused by the first circuit and the second-a circuit are adjusted to be the same in a frequency range in which an amplitude difference between the first circuit and the second-a circuit is small by adjusting phase shifts caused by phase shifters 21a and 22a, and thus radio frequency signals each having a frequency in the first-a band do not cancel out each other after passing through the first circuit and the second-a circuit. Accordingly, a ripple in the first-a band can be decreased and insertion loss can be reduced at a frequency in the first-a band of radio frequency filter 40A.

In this example, as illustrated in (e) of FIG. 26, when the second-a circuit alone is viewed from nodes X1 and X2 while switches SW35 and SW36 are conducting, the second band may include at least one frequency at which phase shifts caused by the first circuit and the second-a circuit are the same (0° or −360°) (circles indicated by the dashed-lines in (e) of FIG. 26: three frequencies), and the third band may include at least one frequency at which phase shifts caused by the first circuit and the second-a circuit are the same (0° or −360°) (a circle indicated by the dashed-line in (e) of FIG. 26: one frequency).

According to the above configuration, a ripple in the first-a band can be decreased in frequency-tunable radio frequency filter 40A that can switch the first-a band, the second band, and the third band from one to another.

According to radio frequency filter 40A according to this example, while increasing variations of switching among passbands, ripples in the first band and the first-a band can be decreased, and insertion loss can be reduced.

Embodiment 4

The present embodiment describes a radio frequency filter that includes a filter that includes a longitudinally coupled resonator.

[4.1 Configuration of Radio Frequency Filter 50A According to Example 5]

Figure 27A:
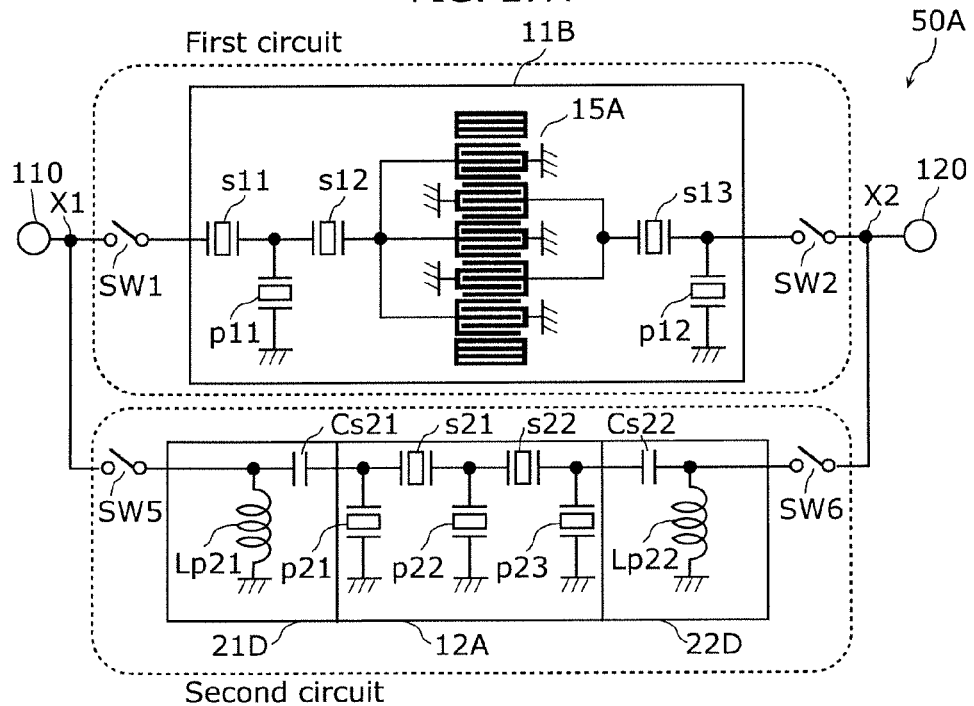
FIG. 27A illustrates a circuit configuration of a radio frequency filter according to Example 5.

FIG. 27A illustrates a circuit configuration of radio frequency filter 50A according to Example 5. Radio frequency filter 50A illustrated in FIG. 27A includes filters 11B and 12A, phase shifters 21D and 22D, switches SW1, SW2, SW5 and SW6, and input/output terminals 110 and 120. Radio frequency filter 50A according to this example is different from radio frequency filter 20A according to Example 2 in the circuit configurations of the first circuit and the phase shifters. In the following, description of the common points of radio frequency filter 50A according to this example to those of radio frequency filter 20A according to Example 2 is omitted, and different points are mainly described.

Filter 11B includes series-arm resonators s11, s12, and s13 disposed on a first path that connects nodes X1 and X2, parallel-arm resonators p11 and p12 each disposed between a node on the first path and the ground, and longitudinally coupled resonator 15A connected to series-arm resonators s12 and s13. Accordingly, this makes filter 11B a bandpass filter. Longitudinally coupled resonator 15A includes five IDT electrodes, and reflectors disposed at the ends of the direction in which the five IDT electrodes are disposed. Note that the number of IDT electrodes of the longitudinally coupled resonator may be two or more.

Phase shifter 21D is a first phase shifter connected to one terminal of filter 12A. Phase shifter 22D is a second phase shifter connected to the other terminal of filter 12A. Specifically, phase shifter 21D, filter 12A, and phase shifter 22D are connected in series in this order between nodes X1 and X2.

Phase shifter 21D includes one capacitor Cs21 disposed on a series-arm path that connects node X1 and one terminal of filter 12A, and one inductor Lp21 connected to the ground and a node on the series-arm path. Phase shifter 22D includes one capacitor Cs22 disposed on a series-arm path that connects node X2 and the other terminal of filter 12A, and one inductor Lp22 connected to the ground and a node on the series-arm path.

Table 4 shows circuit parameters of radio frequency filter 50A according to Example 5.

5. As illustrated in (a) of FIG. 27B, radio frequency filter 50A has a passband that is the first band (a combination of the Band 3 receiving passband and the Band 39 passband) when all switches SW1, SW2, SW5, and SW6 are conducting. As illustrated in (b) of FIG. 27B, radio frequency filter 50A has a passband that is the second band (Band 3 receiving passband) when switches SW1 and SW2 are conducting and switches SW5 and SW6 are non-conducting. As illustrated in (c) of FIG. 27B, radio frequency filter 50A has a passband that is the third band (Band 39 passband) when switches SW1 and SW2 are non-conducting and switches SW5 and SW6 are conducting.

Note that this example has adopted a circuit configuration in which switches SW1 and SW2 are disposed in the first circuit, and switches SW5 and SW6 are disposed in the second circuit, but may adopt a configuration in which the switches are connected only in the first circuit or a configuration in which the switches are connected only in the second circuit. In the case of the configuration in which the switches are connected only in the first circuit, the radio frequency filter is a filter that switches between the first band and the third band. In the case of the configuration in which the switches are connected only in the second circuit, the radio frequency filter is a filter that switches between the first band and the second band.

Also in radio frequency filter 50A according to Example 5, phase shifters 21D and 22D are connected to the input/output terminals of filter 12A similarly to radio frequency filter 20A according to Example 2, and thus, insertion loss is reduced in the first band of radio frequency filter 50A by decreasing a ripple.

TABLE 4

| Example 5 | | Resonant frequency fr (MHz) | Antiresonant frequency fa (MHz) | Resonance fractional BW (%) | Electrostatic cap C0 (pF) | C (pF) | L (nH) |
|---|---|---|---|---|---|---|---|
| Filter 11B | s11 | 1827.6 | 1897.0 | 3.8 | 2.66 | | |
| | s12 | 1841.5 | 1911.4 | 3.8 | 1.54 | | |
| | s13 | 1833.9 | 1903.6 | 3.8 | 3.85 | | |
| | p11 | 1756.2 | 1822.9 | 3.8 | 1.49 | | |
| | p12 | 1782.6 | 1850.3 | 3.8 | 1.14 | | |
| Filter 12A | s21 | 1890.8 | 1962.7 | 3.8 | 1.49 | | |
| | s22 | 1888.7 | 1960.5 | 3.8 | 1.53 | | |
| | p21 | 1850.0 | 1920.3 | 3.8 | 0.10 | | |
| | p22 | 1834.3 | 1904.0 | 3.8 | 4.92 | | |
| | p23 | 1850.0 | 1920.3 | 3.8 | 1.06 | | |
| Phase shifter 21D | Cs21 | | | | | 1.90 | |
| | Lp21 | | | | | | 5.67 |
| Phase shifter 22D | Cs22 | | | | | 1.73 | |
| | Lp22 | | | | | | 4.73 |

In this example, filter 11B includes longitudinally coupled resonator 15A, and thus has filter characteristics advantageous to attenuation characteristics. Accordingly, phase shifters 21D and 22D do not need to have high attenuation characteristics. From this viewpoint, phase shifters 21D and 22D can be each provided with a single capacitor and a single inductor.

Note that the circuit configuration of phase shifters 21D and 22D is not limited to the above configuration. A plurality of capacitors and inductors may be disposed, and the connection configurations such as T connection and π connection are also arbitrarily determined.

[4.2 Filter Characteristics of Radio Frequency Filter 50A According to Example 5]

Figure 27B:
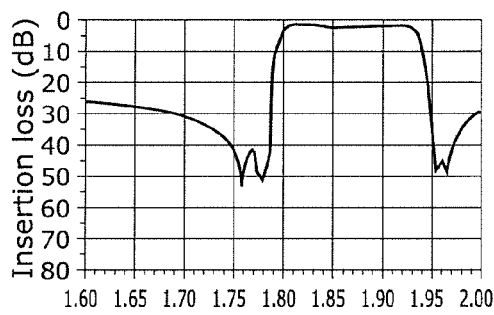
FIG. 27B illustrates graphs showing change in passing characteristics caused by switching between on and off of switches of the radio frequency filter according to Example 5.
Figure 27B:
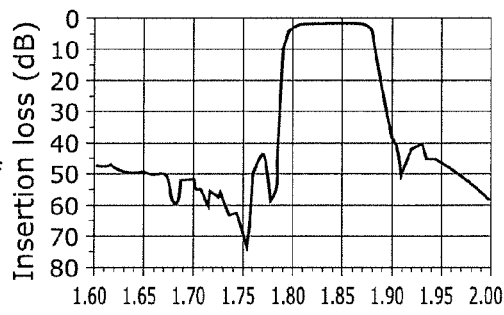
Figure 27B:
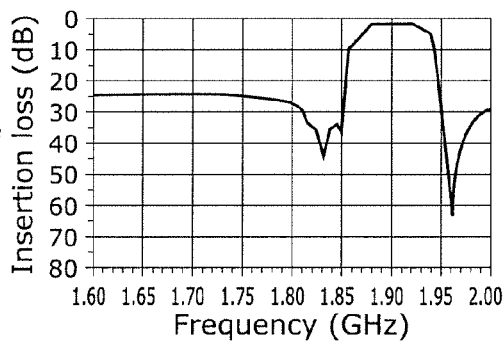

FIG. 27B illustrates graphs showing change in passing characteristics by switching between on and off of the switches of radio frequency filter 50A according to Example The following describes a factor of decreasing a ripple and insertion loss in the first band of radio frequency filter 50A according to Example 5.

Figure 28:
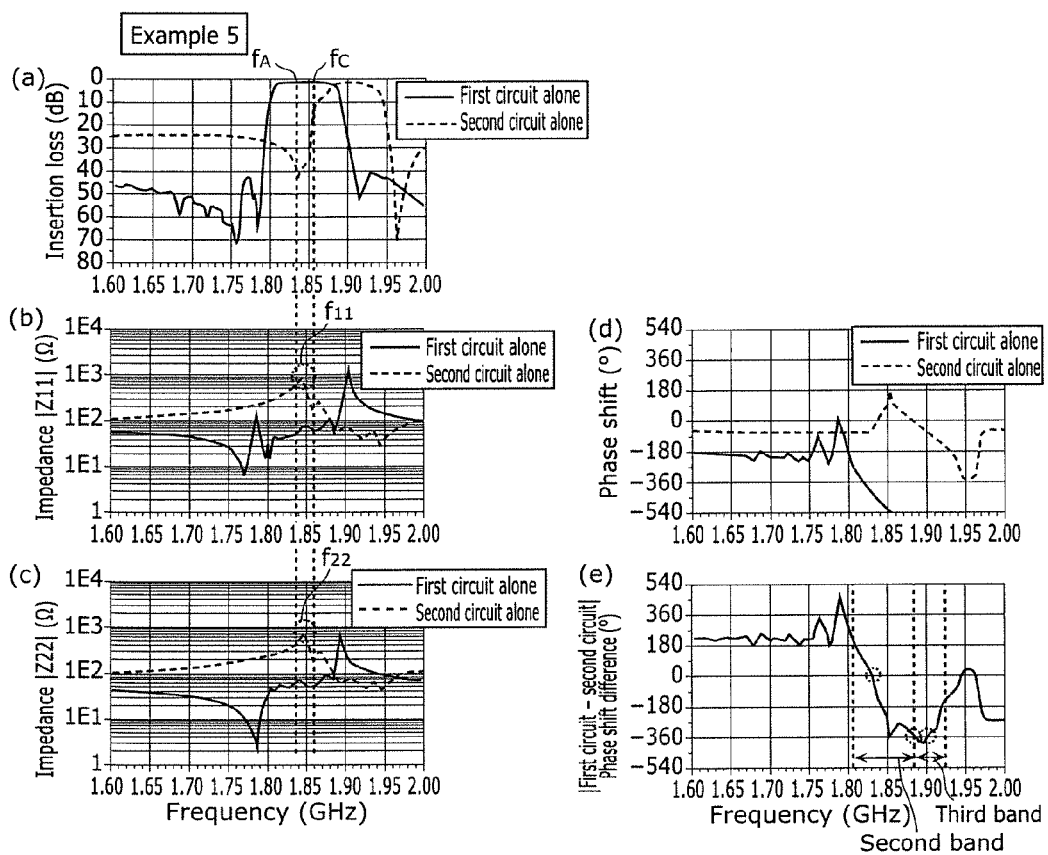
FIG. 28 illustrates graphs for describing a factor of increasing the bandwidth of the radio frequency filter according to Example 5.

FIG. 28 illustrates graphs for describing a factor of increasing the bandwidth of radio frequency filter 50A according to Example 5. Part (a) of FIG. 28 illustrates passing characteristics of the first circuit alone and the second circuit alone between nodes X1 and X2. Part (b) of FIG. 28 illustrates impedance characteristics when the first circuit alone is viewed from node X1 while switch SW1 is conducting, and impedance characteristics when the second circuit alone is viewed from node X1 while switch SW5 is conducting. Part (c) of FIG. 28 illustrates impedance characteristics when the first circuit alone is viewed from node X2 while switch SW2 is conducting, and impedance characteristics when the second circuit alone is viewed from node X2 while switch SW6 is conducting. Part (d) of FIG.

28 illustrates phase shift characteristics of the first circuit alone and the second circuit alone between nodes X1 and X2. Part (e) of FIG. 28 illustrates a difference between phase shifts caused by the first circuit and the second circuit.

In radio frequency filter 50A according to Example 5, the phase shifts caused by phase shifters 21D and 22D are adjusted to include, in a frequency range from lower edge frequency $f_A$ of the second band to lower cutoff frequency $f_C$ of the passband of filter 12A, frequency $f_{11}$ at which impedance |Z11| when the second circuit alone is viewed from node X1 is highest out of frequencies at singular points at each of which impedance |Z11| has a local maximum value. The phase shifts caused by phase shifters 21D and 22D are adjusted to include, in a frequency range from lower edge frequency $f_A$ of the second band to lower cutoff frequency $f_C$ of the passband of filter 12A, frequency $f_{22}$ at which impedance |Z22| when the second circuit alone is viewed from node X2 is highest out of frequencies at singular points at each of which impedance |Z22| has a local maximum value.

A change in phase shift is great at frequency $f_A$ of the attenuation pole of filter 12A, so that a difference between phase shifts caused by filters 12A and 11B is great and an amplitude difference therebetween is also great. Accordingly, by adjusting phase shifts caused by phase shifters 21D and 22D, frequencies $f_{11}$ and $f_{22}$ at each of which impedance is highest, out of frequencies at singular points at each of which the second circuit has local maximum impedance, are caused to fall within the frequency range from frequency $f_A$ of the attenuation pole on the passband low-frequency side of filter 12A to lower 10-dB cutoff frequency $f_C$, so that a radio frequency signal having a frequency in the frequency range can be prevented, as much as possible, from flowing into filter 12A of the second circuit. Specifically, a signal can be prevented, as much as possible, from sneaking into the second circuit in a frequency band in which a signal passing through the second circuit is attenuated. Accordingly, a ripple in the first band of radio frequency filter 50A can be decreased, and insertion loss can be reduced.

Furthermore, phase shifts caused by the first circuit and the second circuit are adjusted to be the same in a frequency range in which an amplitude difference between the first circuit and the second circuit is small by adjusting phase shifts caused by phase shifters 21D and 22D, and thus radio frequency signals each having a frequency in the first band do not cancel out each other after passing through the first circuit and the second circuit. Accordingly, a ripple in the first band can be decreased and insertion loss can be reduced at a frequency in the first band of radio frequency filter 50A.

As described above, when radio frequency filter 50A has a passband that is the first band according to switches SW1, SW2, SW5, and SW6 in the conducting state, insertion loss in the first band can be reduced.

In this example, as illustrated in (e) of FIG. 28, the second circuit alone is viewed from nodes X1 and X2 while switches SW5 and SW6 are conducting, the second band may include at least one frequency at which phase shifts caused by the first circuit and the second circuit are the same (0° or −360°) (circles indicated by the dashed-lines in (e) of FIG. 28: two frequencies), and the third band may include at least one frequency at which phase shifts caused by the first circuit and the second circuit are the same (0° or −360°) (a circle indicated by the dashed-line in (e) of FIG. 28: one frequency).

According to the above configuration, a ripple in the first band can be decreased in frequency-tunable radio frequency filter 50A that can switch the first band, the second band, and the third band from one to another. Filter 11B includes longitudinally coupled resonator 15A, and thus the attenuation can be increased on the passband low-frequency side of radio frequency filter 50A while steepness is increased.

Embodiment 5

The present embodiment describes a radio frequency filter that includes a first filter and a second filter each including parallel-arm circuits to each of which an impedance circuit that includes a switch element is added.

[5.1 Configuration of Radio Frequency Filter 60A According to Example 6]

Figure 29A:
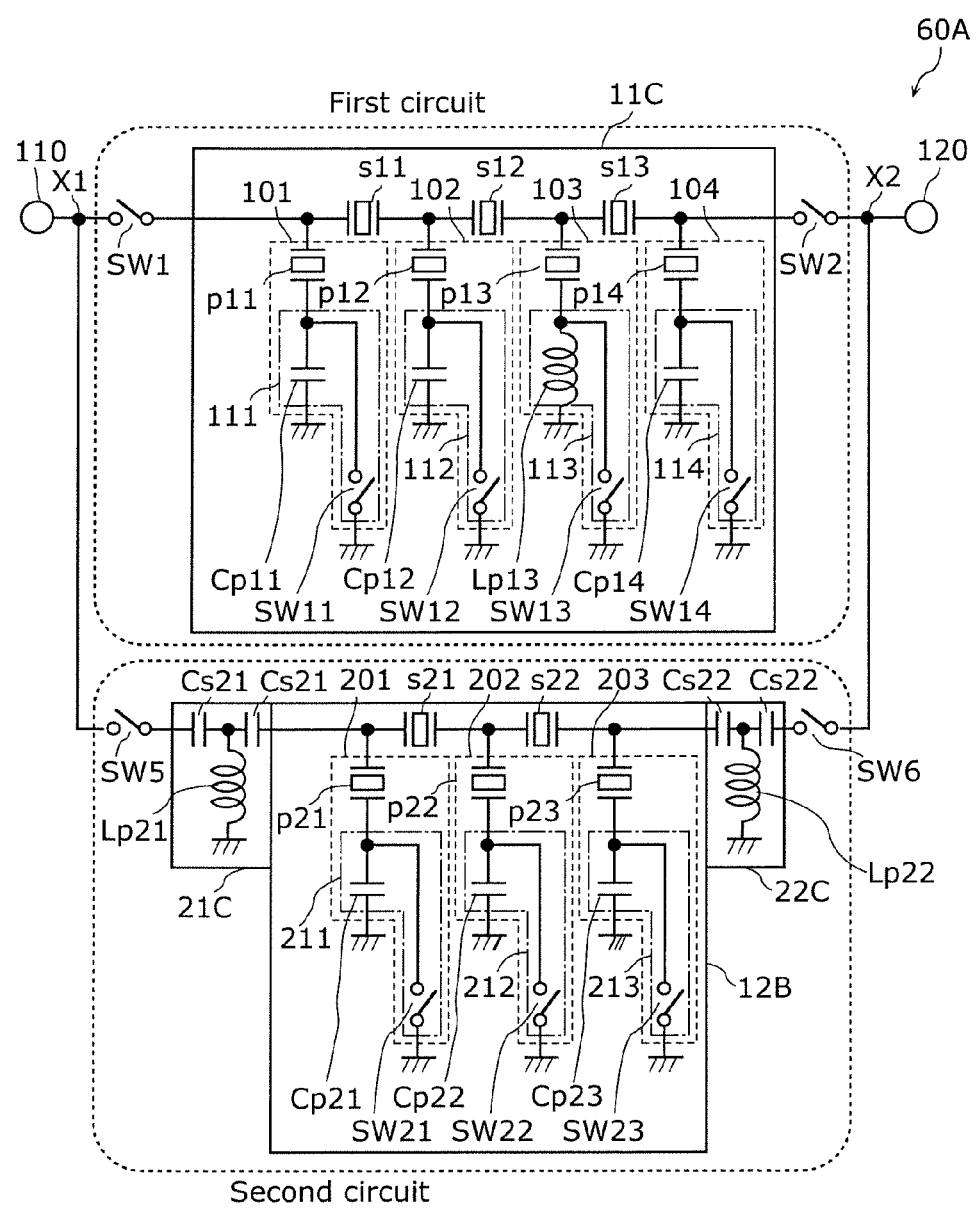
FIG. 29A illustrates a circuit configuration of a radio frequency filter according to Example 6.

FIG. 29A illustrates a circuit configuration of radio frequency filter 60A according to Example 6. Radio frequency filter 60A illustrated in FIG. 29A includes filters 11C and 12B, phase shifters 21C and 22C, switches SW1, SW2, SW5 and SW6, and input/output terminals 110 and 120. Radio frequency filter 60A according to this example is different from radio frequency filter 20C according to Variation 2 of Embodiment 2 in the circuit configurations of the first filter and the second filter. In the following, description of the common points of radio frequency filter 60A according to this example to those of radio frequency filter 20C according to Variation 2 of Embodiment 2 is omitted, and different points are mainly described.

Filter 11C includes three series-arm circuits (series-arm resonators s11, s12, and s13) and parallel-arm circuits 101, 102, 103, and 104.

Series-arm resonators s11 to s13 are disposed on a first path that connects nodes X1 and X2.

Each of parallel-arm circuits 101 to 104 is connected to the ground and a node on the first path that connects nodes X1 and X2.

Parallel-arm circuit 101 includes parallel-arm resonator p11 and impedance circuit 111 connected in series to parallel-arm resonator p11. Impedance circuit 111 includes capacitor Cp11 and switch SW11. Switch SW11 is a ninth switch element connected in parallel to capacitor Cp11. Impedance circuit 111 includes a circuit in which capacitor Cp11 and switch SW11 are connected in parallel, and thus the resonant frequency of parallel-arm circuit 101 is switched to a higher frequency by switching switch SW11 from the conducting state to the non-conducting state.

Parallel-arm circuit 102 includes parallel-arm resonator p12 and impedance circuit 112 connected in series to parallel-arm resonator p12. Impedance circuit 112 includes capacitor Cp12 and switch SW12. Switch SW12 is a ninth switch element connected in parallel to capacitor Cp12. Impedance circuit 112 includes a circuit in which capacitor Cp12 and switch SW12 are connected in parallel, and thus the resonant frequency of parallel-arm circuit 102 is switched to a higher frequency by switching switch SW12 from the conducting state to the non-conducting state.

Parallel-arm circuit 104 includes parallel-arm resonator p14 and impedance circuit 114 connected in series to parallel-arm resonator p14. Impedance circuit 114 includes capacitor Cp14 and switch SW14. Switch SW14 is a ninth switch element connected in parallel to capacitor Cp14. Impedance circuit 114 includes a circuit in which capacitor Cp14 and switch SW14 are connected in parallel, and thus the resonant frequency of parallel-arm circuit 104 is switched to a higher frequency by switching switch SW14 from the conducting state to the non-conducting state.

Parallel-arm circuit 103 includes parallel-arm resonator p13 and impedance circuit 113 connected in series to parallel-arm resonator p13. Impedance circuit 113 includes inductor Lp13 and switch SW13. Switch SW13 is a ninth switch element connected in parallel to inductor Lp13. Impedance circuit 113 includes a circuit in which inductor Lp13 and switch SW13 are connected in parallel, and thus the resonant frequency of parallel-arm circuit 103 is switched to a lower frequency by switching switch SW13 from the conducting state to the non-conducting state.

The resonant frequency of a parallel-arm circuit determines the attenuation pole on the passband low-frequency side in a ladder filter, and thus in filter 11C, the degree of steepness on the passband low-frequency side and a lower edge frequency of a passband are changed by switching between the conducting state and the non-conducting state of switches SW11, SW12, SW13, and SW14.

Filter 12B includes two series-arm circuits (series-arm resonators s21 and s22) and parallel-arm circuits 201, 202, and 203.

Series-arm resonators s21 and s22 are disposed on a second path that connects nodes X1 and X2.

Each of parallel-arm circuits 201 to 203 is connected to the ground and a node on the second path that connects nodes X1 and X2.

Parallel-arm circuit 201 includes parallel-arm resonator p21 and impedance circuit 211 connected in series to parallel-arm resonator p21. Impedance circuit 211 includes capacitor Cp21 and switch SW21. Switch SW21 is a ninth switch element connected in parallel to capacitor Cp21. Impedance circuit 211 includes a circuit in which capacitor Cp21 and switch SW21 are connected in parallel, and thus the resonant frequency of parallel-arm circuit 201 is switched to a higher frequency by switching switch SW21 from the conducting state to the non-conducting state.

Parallel-arm circuit 202 includes parallel-arm resonator p22 and impedance circuit 212 connected in series to parallel-arm resonator p22. Impedance circuit 212 includes capacitor Cp22 and switch SW22. Switch SW22 is a ninth switch element connected in parallel to capacitor Cp22. Impedance circuit 212 includes a circuit in which capacitor Cp22 and switch SW22 are connected in parallel, and thus the resonant frequency of parallel-arm circuit 202 is switched to a higher frequency by switching switch SW22 from the conducting state to the non-conducting state.

Parallel-arm circuit 203 includes parallel-arm resonator p23 and impedance circuit 213 connected in series to parallel-arm resonator p23. Impedance circuit 213 includes capacitor Cp23 and switch SW23. Switch SW23 is a ninth switch element connected in parallel to capacitor Cp23. Impedance circuit 213 includes a circuit in which capacitor Cp23 and switch SW23 are connected in parallel, and thus the resonant frequency of parallel-arm circuit 203 is switched to a higher frequency by switching switch SW23 from the conducting state to the non-conducting state.

In filter 12B, the degree of steepness on the passband low-frequency side and a lower edge frequency of a passband are changed by switching between the conducting state and the non-conducting state of switches SW21, SW22, and SW23.

Table 5 illustrates circuit parameters of radio frequency filter 60A according to Example 6.

TABLE 5

| Example 6 | | Resonant frequency fr (MHz) | Antiresonant frequency fa (MHz) | Resonance fractional BW (%) | Electrostatic cap C0 (pF) | C (pF) | L (nH) |
|---|---|---|---|---|---|---|---|
| Filter 11C | s11 | 1854.5 | 1919.4 | 3.5 | 3.04 | | |
| | s12 | 1861.1 | 1926.2 | 3.5 | 0.94 | | |
| | s13 | 1863.6 | 1928.9 | 3.5 | 0.77 | | |
| | p11 | 1777.3 | 1839.5 | 3.5 | 1.41 | | |
| | p12 | 1785.4 | 1847.9 | 3.5 | 0.26 | | |
| | p13 | 1800.7 | 1863.7 | 3.5 | 2.95 | | |
| | p14 | 1791.2 | 1843.6 | 3.5 | 1.38 | | |
| | Cp11 | | | | | 3.00 | |
| | Cp12 | | | | | 3.00 | |
| | Lp13 | | | | | | 1.50 |
| | Cp14 | | | | | 2.00 | |
| Filter 12B | s21 | 1897.4 | 1963.8 | 3.5 | 1.20 | | |
| | s22 | 1894.4 | 1960.7 | 3.5 | 0.69 | | |
| | p21 | 1850.1 | 1914.8 | 3.5 | 0.88 | | |
| | p22 | 1823.5 | 1887.3 | 3.5 | 6.15 | | |
| | p23 | 1830.9 | 1894.9 | 3.5 | 4.73 | | |
| | Cp21 | | | | | 5.00 | |
| | Cp22 | | | | | 3.00 | |
| | Cp23 | | | | | 5.00 | |
| Phase shifter 21C | Cs21 | | | | | 2.00 | |
| | Lp21 | | | | | | 4.13 |
| Phase shifter 22C | Cs22 | | | | | 1.73 | |
| | Lp22 | | | | | | 4.18 |

[5.2 Filter Characteristics of Radio Frequency Filter 60A According to Example 6]

Figure 29B:
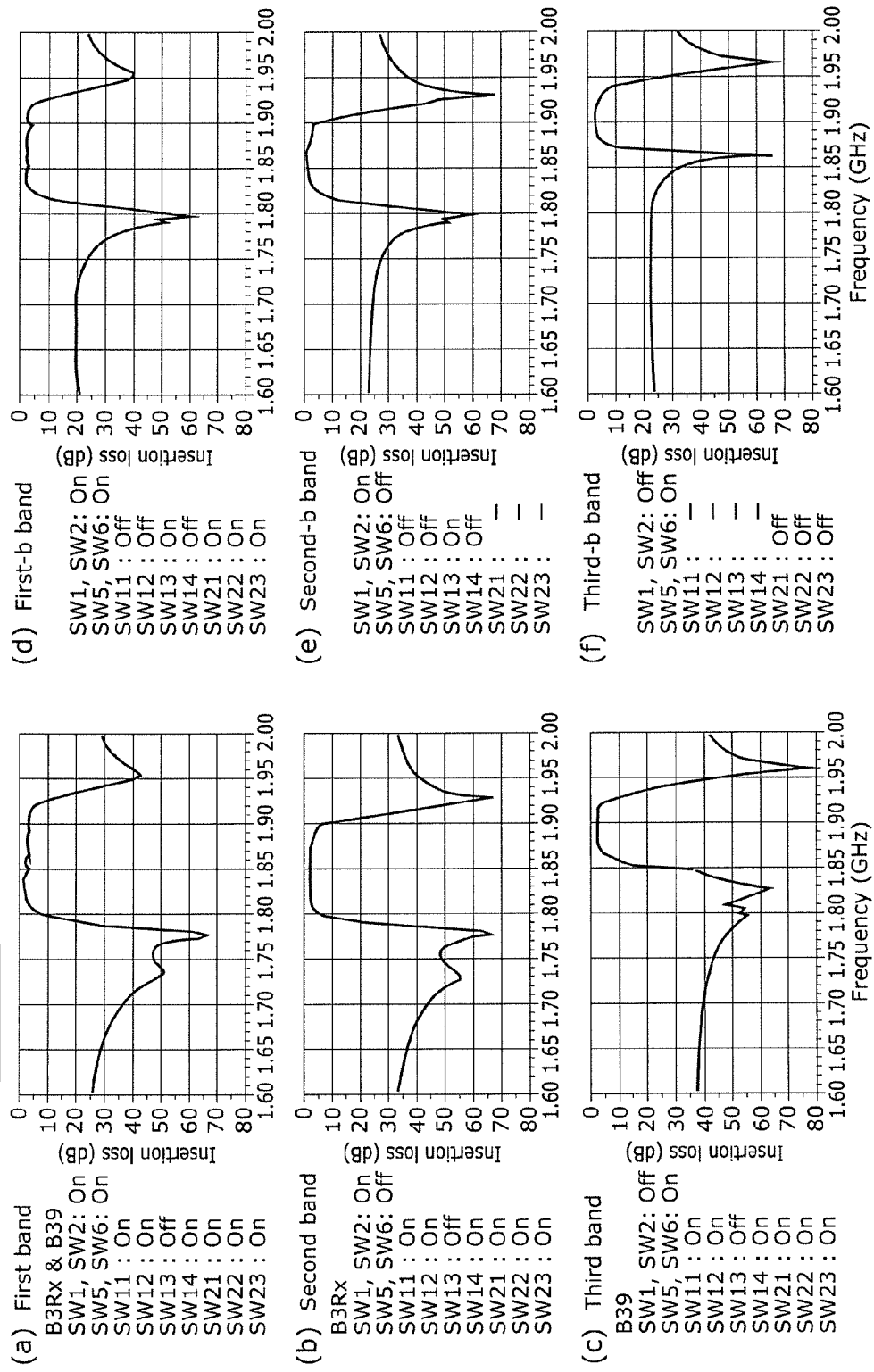
FIG. 29B illustrates graphs showing change in passing characteristics caused by switching between on and off of switches of the radio frequency filter according to Example 6.

FIG. 29B illustrates graphs showing change in passing characteristics by switching between on and off of the switches of radio frequency filter 60A according to Example 6. Radio frequency filter 60A is a frequency-tunable radio frequency filter that can be changed to a filter having a plurality of bandwidths by switching as appropriate between the conducting and non-conducting states of switches SW1, SW2, SW5, SW6, SW11 to SW14, and SW21 to SW23. Note that in this example, six passbands can be switched from one to another.

As illustrated in (a) of FIG. 29B, radio frequency filter 60A has a passband that is the first band (a combination of the Band 3 receiving passband and the Band39 passband) when switches SW1, SW2, SW11, SW12, SW14, and SW21 to SW23 are conducting, and switch SW13 is non-conducting. As illustrated in (b) of FIG. 29B, when switches SW1, SW2, SW11, SW12, SW14, and SW21 to SW23 are conducting, and switches SW5, SW6, and SW13 are non-conducting, radio frequency filter 60A has a passband that is the second band (Band 3 receiving passband). As illustrated in (c) of FIG. 29B, when switches SW5, SW6, SW11, SW12, SW14, and SW21 to SW23 are conducting and switches SW1, SW2, and SW13 are non-conducting, radio frequency filter 60A has a passband that is the third band (Band 39 passband). As illustrated in (d) of FIG. 29B, when switches SW1, SW2, SW5, SW6, SW13, and SW21 to SW23 are conducting and switches SW11, SW12, and SW14 are non-conducting, radio frequency filter 60A has a passband that is the first-b band as a result of the attenuation pole on the passband low-frequency side and a passband low-frequency edge shifting to have higher frequencies relative to the first band. Note that in this case, the second circuit is not selected, and thus whether switches SW21 to SW23 are conducting or non-conducting does not affect filter characteristics. As illustrated in (e) of FIG. 29B, when switches SW1, SW2, and SW13 are conducting and switches SW5, SW6, SW11, SW12, and SW14 are non-conducting, radio frequency filter 60A has a passband that is the second-b band as a result of the attenuation pole on the passband low-frequency side and a passband low-frequency edge shifting to have higher frequencies relative to the second band. Note that in this case, the first circuit is not selected, and thus whether switches SW11 to SW14 are conducting or non-conducting does not affect filter characteristics. As illustrated in (f) of FIG. 29B, when switches SW5 and SW6 are conducting and switches SW1, SW2, and SW21 to SW23 are non-conducting, radio frequency filter 60A has a passband that is the third-b band in which the attenuation pole on the passband low-frequency side and a passband low-frequency edge are shifted to have higher frequencies relative to the third band.

In radio frequency filter 60A according to Example 6, phase shifters 21C and 22C are connected to the input/output terminals of filter 12B, so that in the first band and the first-b band of radio frequency filter 60A, insertion loss is reduced by decreasing a ripple.

The following describes a factor that allows radio frequency filter 60A according to Example 6 to decrease ripples and insertion loss in the first band and the first-b band.

Figure 30:
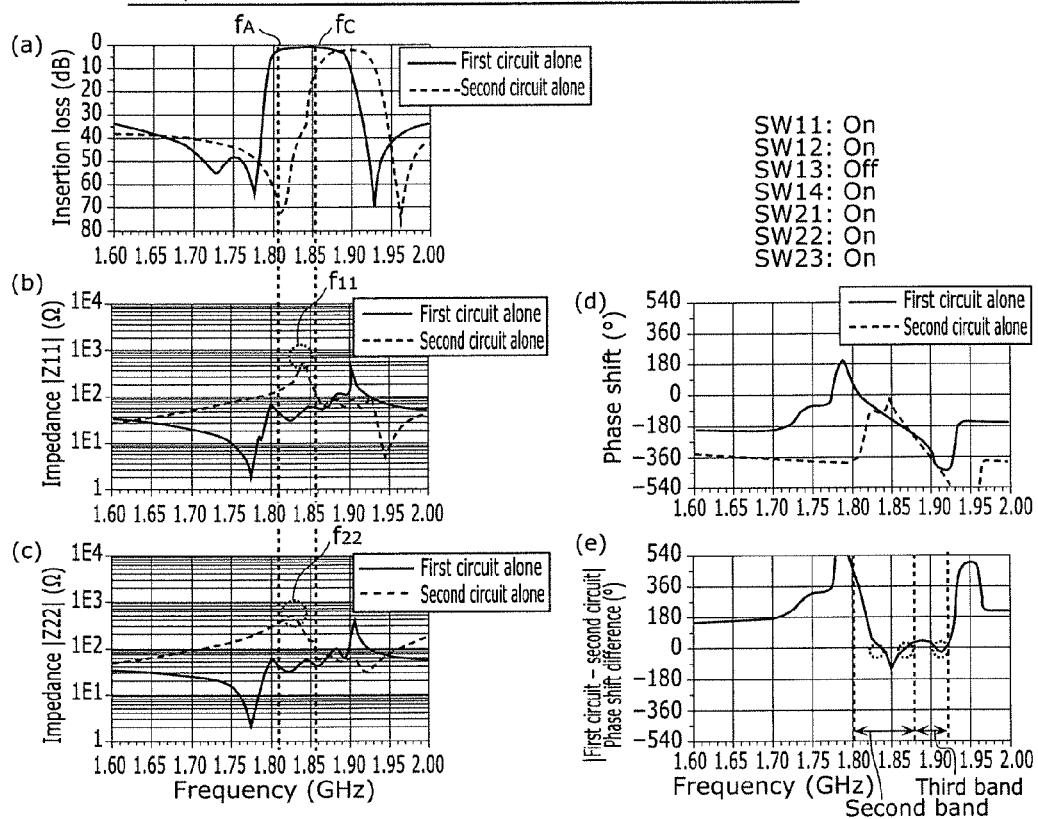
FIG. 30 illustrates graphs for describing a factor of increasing the width of a first band of the radio frequency filter according to Example 6.

FIG. 30 illustrates graphs for describing a factor of increasing the width of the first band of radio frequency filter 60A according to Example 6. Part (a) of FIG. 30 illustrates passing characteristics of the first circuit alone and the second circuit alone between nodes X1 and X2. Part (b) of FIG. 30 illustrates impedance characteristics when the first circuit alone is viewed from node X1 while switch SW1 is conducting, and impedance characteristics when the second circuit alone is viewed from node X1 while switch SW5 is conducting. Part (c) of FIG. 30 illustrates impedance characteristics when the first circuit alone is viewed from node X2 while switch SW2 is conducting, and impedance characteristics when the second circuit alone is viewed from node X2 while switch SW6 is conducting. Part (d) of FIG. 30 illustrates phase shift characteristics of the first circuit alone and the second circuit alone between nodes X1 and X2. Part (e) of FIG. 30 illustrates a phase difference between the first circuit and the second circuit.

In radio frequency filter 60A according to Example 6, when the first band is selected, the phase shifts caused by phase shifters 21C and 22C are adjusted to include, in a frequency range from lower edge frequency $f_A$ of the second band to lower cutoff frequency $f_C$ of the passband of filter 12B, frequency $f_{11}$ at which impedance $|Z11|$ when the second circuit alone is viewed from node X1 is highest out of frequencies at singular points at each of which impedance $|Z11|$ has a local maximum value. The phase shifts caused by phase shifters 21C and 22C are adjusted to include, in a frequency range from lower edge frequency $f_A$ of the second band to lower cutoff frequency $f_C$ of the passband of filter 12B, frequency $f_{22}$ at which impedance $|Z22|$ when the second circuit alone is viewed from node X2 is highest out of frequencies at singular points at each of which impedance $|Z22|$ has a local maximum value.

A change in phase shift is great at frequency $f_A$ of the attenuation pole of filter 12B, so that a difference between phase shifts caused by filters 11C and 12B is great and an amplitude difference therebetween is also great. Accordingly, by adjusting phase shifts caused by phase shifters 21C and 22C, frequencies $f_{11}$ and $f_{22}$ at each of which impedance is highest out of frequencies at singular points at each of which the second circuit has local maximum impedance are caused to fall within a frequency range from frequency $f_A$ to cutoff frequency $f_C$, so that a radio frequency signal having a frequency in the frequency range can be prevented from flowing into filter 12B of the second circuit, as much as possible. Specifically, a signal can be decreased from sneaking into the second circuit in a frequency band in which a signal passing through the second circuit is attenuated. Accordingly, a ripple in the first band of radio frequency filter 60A can be decreased, and insertion loss can be reduced.

As described above, when radio frequency filter 60A has a passband that is the first band according to the conducting state of switches SW1, SW2, SW5, and SW6, insertion loss in the first band can be reduced.

Furthermore, phase shifts caused by the first circuit and the second circuit are adjusted to be the same in a frequency range in which an amplitude difference between the first circuit and the second circuit is small by adjusting phase shifts caused by phase shifters 21C and 22C, radio frequency signals each having a frequency in the first band do not cancel out each other after passing through the first circuit and the second circuit. Accordingly, a ripple in the first band can be decreased and insertion loss can be reduced.

In this example, as illustrated in (e) of FIG. 30, when the second circuit alone is viewed from nodes X1 and X2 of the second circuit, the second band may include at least one frequency at which phase shifts caused by the first circuit and the second circuit are the same (0° or −360°) (circles indicated by the dashed-lines in (e) of FIG. 30: two frequencies), and the third band may include at least one frequency at which phase shifts caused by the first circuit and the second circuit are the same (0° or −360°) (a circle indicated by the dashed-line in (e) of FIG. 30: one frequency).

According to the above configuration, a ripple in the first band can be decreased in frequency-tunable radio frequency filter 60A that can switch the first band, the second band, and the third band from one to another.

Figure 31:
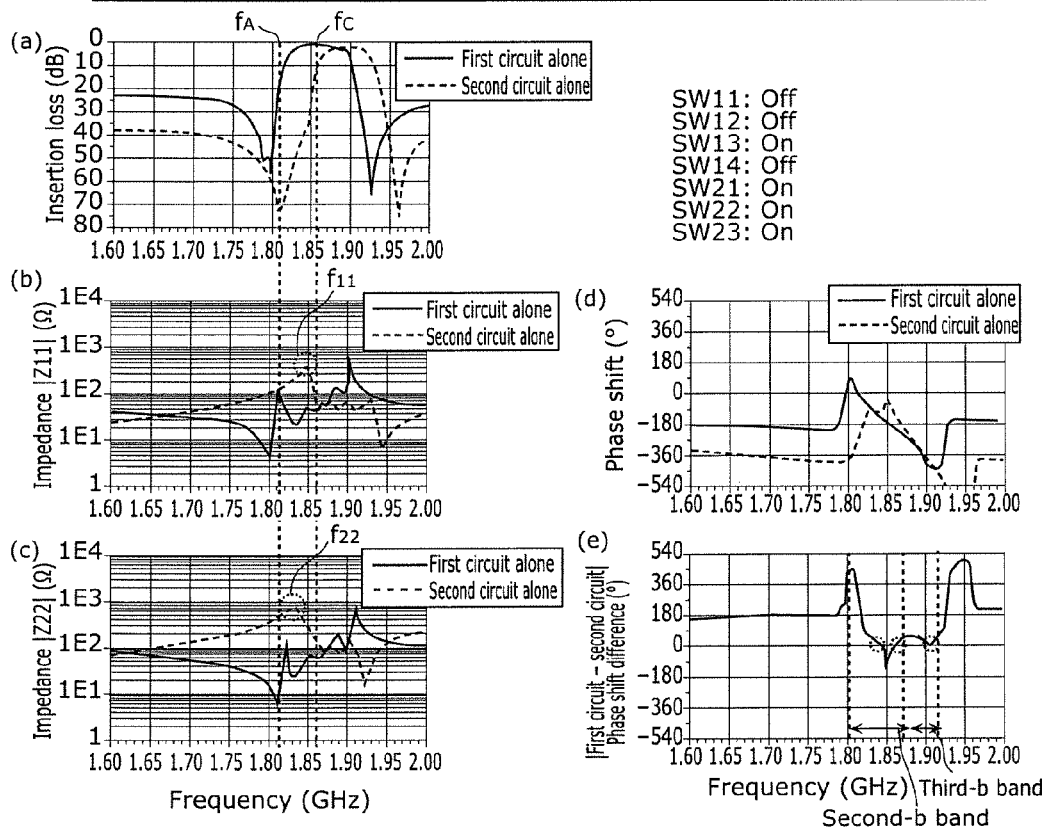
FIG. 31 illustrates graphs for describing a factor of increasing the width of a first-b band of the radio frequency filter according to Example 6.

FIG. 31 illustrates graphs for describing a factor of increasing the width of the first-b band of radio frequency filter 60A according to Example 6. Part (a) of FIG. 31 illustrates passing characteristics of the first circuit alone and the second circuit alone between nodes X1 and X2. Part (b) of FIG. 31 illustrates impedance characteristics when the first circuit alone is viewed from node X1 while switch SW1 is conducting, and impedance characteristics when the second circuit alone is viewed from node X1 while switch SW5 is conducting. Part (c) of FIG. 31 illustrates impedance characteristics when the first circuit alone is viewed from node X2 while switch SW2 is conducting, and impedance characteristics when the second circuit alone is viewed from node X2 while switch SW6 is conducting. Part (d) of FIG. 31 illustrates phase shift characteristics of the first circuit alone and the second circuit alone between nodes X1 and X2. Part (e) of FIG. 31 illustrates a difference between phase shifts caused by the first circuit and the second circuit.

In radio frequency filter 60A according to Example 6, when the first-b band is selected, the phase shifts caused by phase shifters 21C and 22C are adjusted to include, in a frequency range from lower edge frequency $f_A$ of the second band to lower cutoff frequency $f_C$ of the passband of filter 12B, frequency $f_{11}$ at which impedance |Z11| when the second circuit alone is viewed from node X1 is highest out of frequencies at singular points at each of which impedance |Z11| has a local maximum value. The phase shifts caused by phase shifters 21C and 22C are adjusted to include, in a frequency range from lower edge frequency $f_A$ of the second band to lower cutoff frequency $f_C$ of the passband of filter 12B, frequency $f_{22}$ at which impedance |Z22| when the second circuit alone is viewed from node X2 is highest out of frequencies at singular points at each of which impedance |Z22| has a local maximum value.

A change in phase shift is great at frequency $f_A$ of the attenuation pole of filter 12B, so that a difference between phase shifts caused by filters 11C and 12B is great and an amplitude difference therebetween is also great. Accordingly, by adjusting phase shifts caused by phase shifters 21C and 22C, frequency $f_{11}$ and $f_{22}$ at each of which impedance is highest out of frequencies at singular points at each of which the second circuit has local maximum impedance are caused to fall within a frequency range from frequency $f_A$ to cutoff frequency $f_C$, so that a radio frequency signal having a frequency in the frequency range can be prevented from flowing into filter 12B of the second circuit, as much as possible. Specifically, a signal can be prevented, as much as possible, from sneaking into the second circuit in a frequency band in which a signal passing through the second circuit is attenuated. Accordingly, a ripple in the first-b band of radio frequency filter 60A can be decreased, and insertion loss can be reduced.

As described above, when radio frequency filter 60A has a passband that is the first-b band according to the conducting state of switches SW1, SW2, SW5, and SW6, insertion loss in the first-b band can be reduced.

Furthermore, phase shifts caused by the first circuit and the second circuit are adjusted to be the same in a frequency range in which an amplitude difference between the first circuit and the second circuit is small by adjusting phase shifts caused by phase shifters 21C and 22C, radio frequency signals each having a frequency in the first-b band do not cancel out each other after passing through the first circuit and the second circuit. Accordingly, a ripple in the first-b band can be decreased and insertion loss can be reduced.

In this example, as illustrated in (e) of FIG. 31, when the second circuit alone is viewed from nodes X1 and X2 of the second circuit, the second-b band may include at least one frequency at which phase shifts caused by the first circuit and the second circuit are the same (0° or −360°) (circles indicated by the dashed-lines in (e) of FIG. 31: two frequencies), and the third-b band may include at least one frequency at which phase shifts caused by the first circuit and the second circuit are the same (0° or −360°) (a circle indicated by the dashed-line in (e) of FIG. 31: one frequency).

According to the above configuration, a ripple in the first-b band can be decreased in frequency-tunable radio frequency filter 60A that can switch the first-b band, the second-b band, and the third-b band from one to another.

According to radio frequency filter 60A according to this example, while increasing variations of switching between passbands, ripples in the first band and the first-b band can be decreased, and insertion loss can be reduced.

Note that the number of series-arm resonators and the number of parallel-arm circuits are determined as appropriate according to the requirement specification of filter characteristics. Instead of series-arm resonators, circuit elements such as an inductor and a capacitor may be disposed.

In radio frequency filter 60A according to this example, variations of a unit circuit that includes one series-arm resonator and one parallel-arm circuit connected to the one series-arm resonator and that is included in each of filters 11C and 12B are as illustrated in FIGS. 32A to 32D and FIGS. 33A to 33G.

Figure 32A:
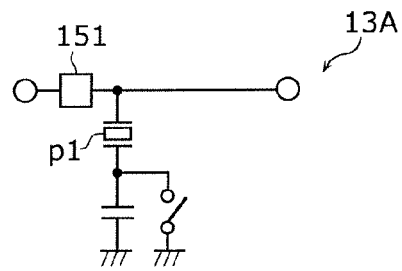
FIG. 32A illustrates a circuit configuration according to Variation 1 of filters included in the radio frequency filter according to Example 6.

FIG. 32A illustrates a circuit configuration according to Variation 1 of the filters included in radio frequency filter 60A according to Example 6. Filter 13A illustrated in FIG. 32A includes series-arm circuit 151 and a parallel-arm circuit. The parallel-arm circuit includes parallel-arm resonator p1 and an impedance circuit connected in series to each other. The impedance circuit includes a switch (ninth switch element) and a capacitor connected in parallel to each other. The resonant frequency of the parallel-arm circuit is switched to another frequency by switching between the conducting and non-conducting states of the switch.

Figure 32B:
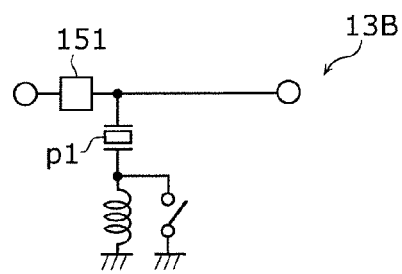
FIG. 32B illustrates a circuit configuration according to Variation 2 of the filters included in the radio frequency filter according to Example 6.

FIG. 32B illustrates a circuit configuration according to Variation 2 of the filters included in radio frequency filter 60A according to Example 6. Filter 13B illustrated in FIG. 32B includes series-arm circuit 151 and a parallel-arm circuit. The parallel-arm circuit includes parallel-arm resonator p1 and an impedance circuit connected in series to each other. The impedance circuit includes a switch (ninth switch element) and an inductor connected in parallel to each other. The resonant frequency of the parallel-arm circuit is switched to another frequency by switching between the conducting and non-conducting states of the switch.

Figure 32C:
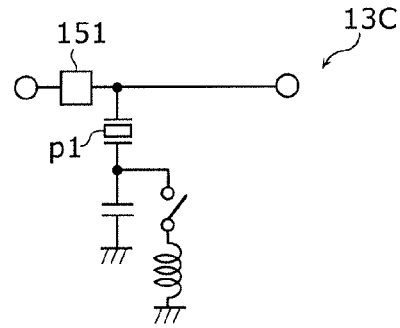
FIG. 32C illustrates a circuit configuration according to Variation 3 of the filters included in the radio frequency filter according to Example 6.

FIG. 32C illustrates a circuit configuration according to Variation 3 of the filters included in radio frequency filter 60A according to Example 6. Filter 13C illustrated in FIG. 32C includes series-arm circuit 151 and a parallel-arm circuit. The parallel-arm circuit includes parallel-arm resonator p1 and an impedance circuit connected in series to each other. The impedance circuit includes a series circuit in which a switch (ninth switch element) and an inductor connected in series to each other, and a capacitor connected in parallel to the series circuit. The resonant frequency of the parallel-arm circuit is switched to another frequency by switching between the conducting and non-conducting states of the switch.

Figure 32D:
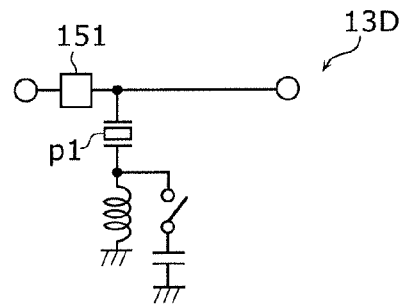
FIG. 32D illustrates a circuit configuration according to Variation 4 of the filters included in the radio frequency filter according to Example 6.

FIG. 32D illustrates a circuit configuration according to Variation 4 of the filters included in radio frequency filter 60A according to Example 6. Filter 13D illustrated in FIG. 32D includes series-arm circuit 151 and a parallel-arm circuit. The parallel-arm circuit includes parallel-arm resonator p1 and an impedance circuit connected in series to each other. The impedance circuit includes a series circuit in which a switch (ninth switch element) and a capacitor are connected in series, and an inductor connected in parallel to the series circuit. The resonant frequency of the parallel-arm circuit is switched to another frequency by switching between the conducting and non-conducting states of the switch.

Figure 33A:
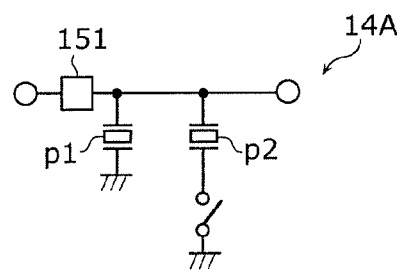
FIG. 33A illustrates a circuit configuration according to Variation 5 of the filters included in the radio frequency filter according to Example 6.

FIG. 33A illustrates a circuit configuration according to Variation 5 of the filters included in radio frequency filter 60A according to Example 6. Filter 14A illustrated in FIG. 33A includes series-arm circuit 151 and a parallel-arm circuit. The parallel-arm circuit includes parallel-arm resonator p1, and parallel-arm resonator p2 and a switch (ninth switch element) connected in series to each other. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. Switching between the conducting and non-conducting states of the switch switches at least one of the resonant frequency or the antiresonant frequency of the parallel-arm circuit to another frequency.

Figure 33B:
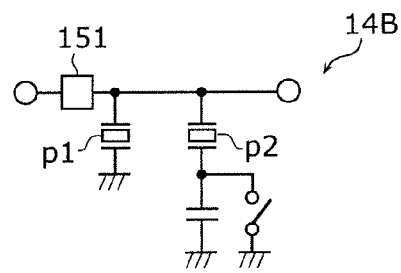
FIG. 33B illustrates a circuit configuration according to Variation 6 of the filters included in the radio frequency filter according to Example 6.

FIG. 33B illustrates a circuit configuration according to Variation 6 of the filters included in radio frequency filter 60A according to Example 6. Filter 14B illustrated in FIG. 33B includes series-arm circuit 151 and a parallel-arm circuit. The parallel-arm circuit includes parallel-arm resonator p1, and parallel-arm resonator p2 and an impedance circuit connected in series to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. The impedance circuit includes a switch (ninth switch element) and a capacitor connected in parallel to each other. The parallel-arm circuit has two resonant frequencies and two antiresonant frequencies, and at least one of the resonant frequencies of the parallel-arm circuit and at least one of the antiresonant frequencies of the parallel-arm circuit are switched by switching between the conducting and non-conducting states of the switch.

Figure 33C:
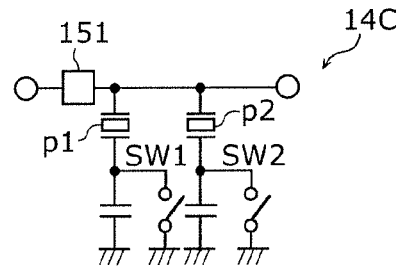
FIG. 33C illustrates a circuit configuration according to Variation 7 of the filters included in the radio frequency filter according to Example 6.

FIG. 33C illustrates a circuit configuration according to Variation 7 of the filters included in radio frequency filter 60A according to Example 6. Filter 14C illustrated in FIG. 33C includes series-arm circuit 151 and a parallel-arm circuit. The parallel-arm circuit includes parallel-arm resonator p1 and a first impedance circuit connected in series to each other, and parallel-arm resonator p2 and a second impedance circuit connected in series to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. The first impedance circuit includes switch SW1 (ninth switch element) and a capacitor connected in parallel to each other. The second impedance circuit includes switch SW2 (ninth switch element) and a capacitor connected in parallel to each other. The parallel-arm circuit has two resonant frequencies and two antiresonant frequencies, and at least one of the resonant frequencies and at least one of the antiresonant frequencies of the parallel-arm circuit are switched to other frequencies by switching between the conducting and non-conducting states of the switches.

Figure 33D:
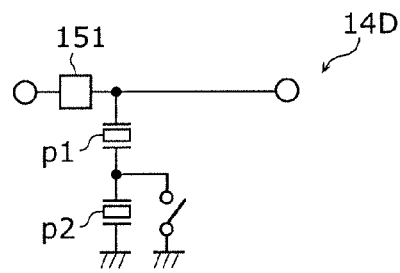
FIG. 33D illustrates a circuit configuration according to Variation 8 of the filters included in the radio frequency filter according to Example 6.

FIG. 33D illustrates a circuit configuration according to Variation 8 of the filters included in radio frequency filter 60A according to Example 6. Filter 14D illustrated in FIG. 33D includes series-arm circuit 151 and a parallel-arm circuit. The parallel-arm circuit includes parallel-arm resonator p1 and an impedance circuit connected in series to each other. The impedance circuit includes switch SW1 (ninth switch element) and parallel-arm resonator p2 connected in parallel to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. By switching between the conducting and non-conducting states of the switch, the resonant frequency and the antiresonant frequency of a parallel-arm circuit are changed to other frequencies and the numbers of resonant frequencies and antiresonant frequencies are changed.

Figure 33E:
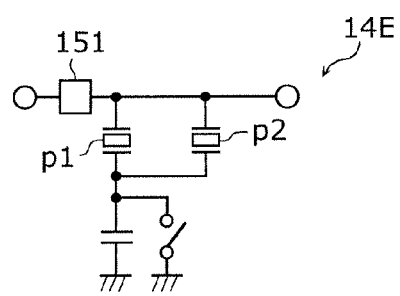
FIG. 33E illustrates a circuit configuration according to Variation 9 of the filters included in the radio frequency filter according to Example 6.

FIG. 33E illustrates a circuit configuration according to Variation 9 of the filters included in radio frequency filter 60A according to Example 6. Filter 14E illustrated in FIG. 33E includes series-arm circuit 151 and a parallel-arm circuit. The parallel-arm circuit has a configuration in which a circuit constituted by parallel-arm resonators p1 and p2 connected in parallel and an impedance circuit are connected in series. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. The impedance circuit includes switch SW1 (ninth switch element) and a capacitor connected in parallel to each other. The parallel-arm circuit has two resonant frequencies and two antiresonant frequencies, and the two resonant frequencies of the parallel-arm circuit are switched by switching between the conducting and non-conducting states of the switch.

Figure 33F:
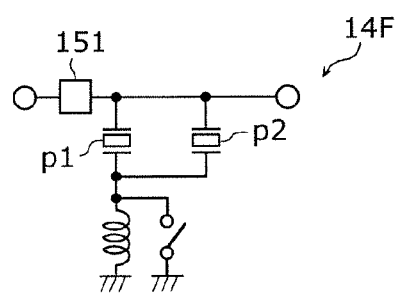
FIG. 33F illustrates a circuit configuration according to Variation 10 of the filters included in the radio frequency filter according to Example 6.

FIG. 33F illustrates a circuit configuration according to Variation 10 of the filters included in radio frequency filter 60A according to Example 6. Filter 14F illustrated in FIG. 33F includes series-arm circuit 151 and a parallel-arm circuit. The parallel-arm circuit has a configuration in which a circuit constituted by parallel-arm resonators p1 and p2 connected in parallel and an impedance circuit are connected in series. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. The impedance circuit includes switch SW1 (ninth switch element) and an inductor connected in parallel to each other. The parallel-arm circuit has two resonant frequencies and two antiresonant frequencies, and the two resonant frequencies of the parallel-arm circuit are switched by switching between the conducting and non-conducting states of the switch.

Figure 33G:
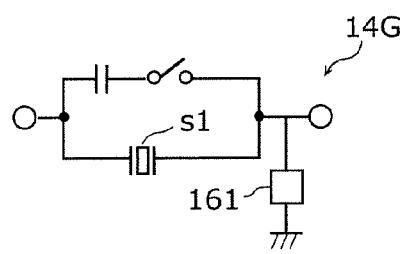
FIG. 33G illustrates a circuit configuration according to Variation 11 of the filters included in the radio frequency filter according to Example 6.

FIG. 33G illustrates a circuit configuration according to Variation 11 of the filters included in radio frequency filter 60A according to Example 6. Filter 14G illustrated in FIG. 33G includes a series-arm circuit and parallel-arm circuit 161. The series-arm circuit has a configuration in which series-arm resonator s1 and a series circuit constituted by a capacitor and a switch (ninth switch element) connected in series are connected in parallel. The antiresonant frequency of the series-arm circuit is switched to another frequency by switching between the conducting and non-conducting states of the switch.

Embodiment 6

The radio frequency filters described in Embodiments 1 to 6 above are applicable to a multiplexer and a radio frequency front-end circuit for a system in which a large number of bands are used. In view of this, in the present embodiment, such a multiplexer, such a radio frequency front-end circuit, and a communication device are to be described.

Figure 34:
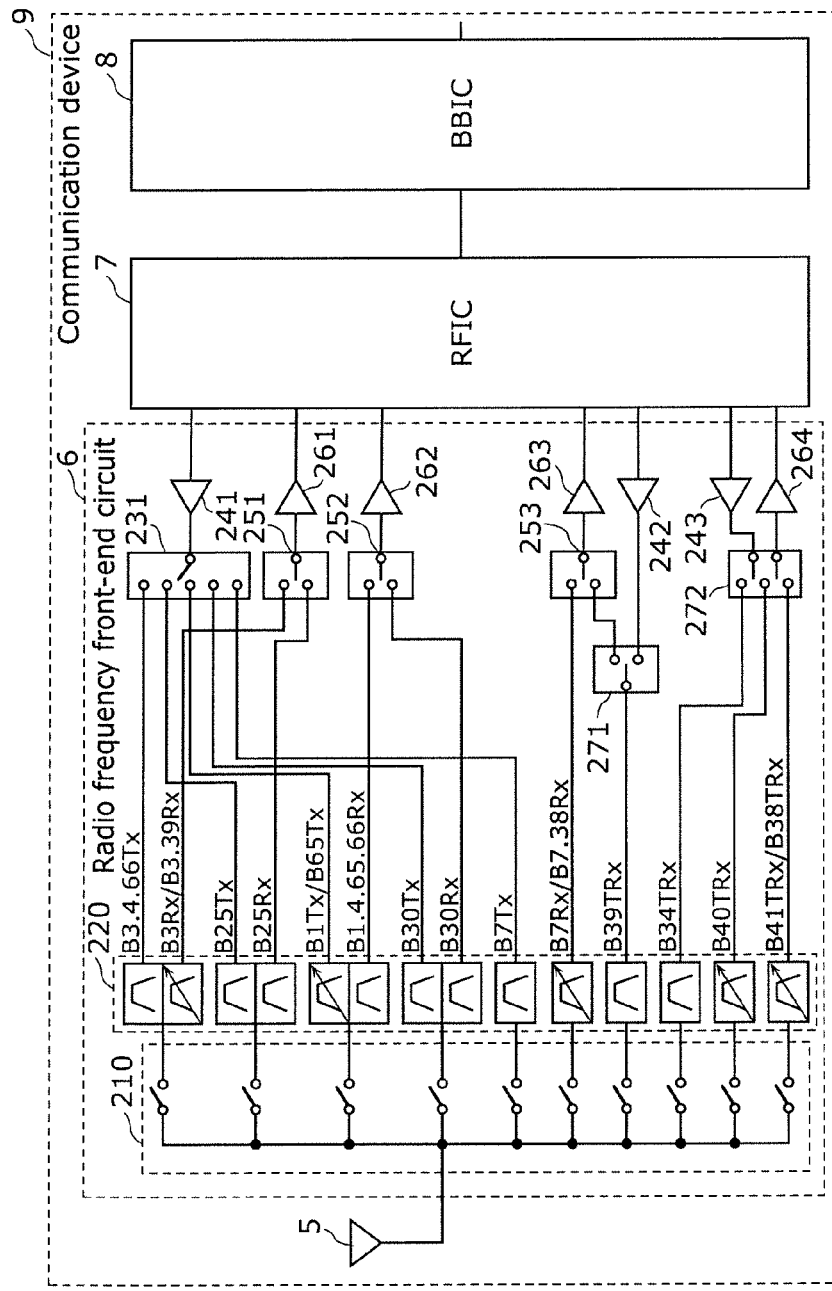
FIG. 34 illustrates a configuration of a communication device according to Embodiment 6.

FIG. 34 illustrates a configuration of communication device 9 according to Embodiment 6.

As illustrated in FIG. 34, communication device 9 includes switch group 210 that includes a plurality of switches, filter group 220 that includes a plurality of filters, transmitter switch 231, receiver switches 251, 252, and 253, switches 271 and 272, transmission amplifier circuits 241, 242, and 243, receiving amplifier circuits 261, 262, 263, and 264, radio frequency (RF) signal processing circuit (RF integrated circuit (RFIC)) 7, baseband signal processing circuit (baseband integrated circuit (BBIC)) 8, and antenna element 5.

Switch group 210 connects antenna element 5 and a signal path corresponding to a predetermined band, according to a control signal from a controller (not illustrated), and includes a plurality of single pole single throw (SPST) switches, for example. Note that not only one signal path but also a plurality of signal paths may be connected to antenna element 5. Specifically, communication device 9 may support carrier aggregation.

Filter group 220 includes a plurality of filters (including a duplexer) having the following passbands, for example. Specifically, the passbands are as follows: (i-Tx) transmission bands of Bands 3, 4, and 66; (i-Rx) a receiving band of Band 3 or receiving bands of Bands 3 and 39; (ii-Tx) a transmission band of Band 25; (ii-Rx) a receiving band of Band 25; (iii-Tx) a transmission band of Band 1 or 65; (iii-Rx) receiving bands of Bands 1, 4, 65, and 66; (iv-Tx) a transmission band of Band 30; (iv-Rx) a receiving band of Band 30; (v) a transmission band of Band 7; (vi) a receiving band of Band 7 or receiving bands of Bands 7 and 38; (vii) transmission and receiving bands of Band 39; (viii) transmission and receiving bands of Band 34; (ix) transmission and receiving bands of Band 40; and (x) transmission and receiving bands of Band 41 or 38.

Transmitter switch 231 is a switch circuit that includes a plurality of selection terminals connected to a plurality of transmitter signal paths on a low band side where the center frequency of filter group 220 is low, and a common terminal connected to transmission amplifier circuit 241.

Receiver switch 251 is a switch circuit that includes a plurality of selection terminals connected to a plurality of receiver signal paths, and a common terminal connected to receiving amplifier circuit 261. Receiver switch 252 is a switch circuit that includes a plurality of selection terminals connected to a plurality of receiver signal paths, and a common terminal connected to receiving amplifier circuit 262. Receiver switch 253 is a switch circuit that includes a plurality of selection terminals connected to a receiver signal path and a selection terminal of switch 271, and a common terminal connected to receiving amplifier circuit 263.

Receiver switch 271 is a switch circuit that includes a common terminal connected to a transmitting and receiving path for a predetermined band (here, Band 39), and two selection terminals connected to one of the selection terminals of switch 253 and transmission amplifier circuit 242. Switch 272 is a switch circuit that includes a plurality of selection terminals connected to a plurality of transmitting and receiving paths, and two selection terminals connected to transmission amplifier circuit 243 and receiving amplifier circuit 264.

These switches are disposed downstream from filter group 220 (here, downstream of the receiver signal paths), and the connected states thereof are changed according to control signals from the controller (not illustrated).

Transmission amplifier circuits 241, 242, and 243 are power amplifiers each of which amplifies power of a radio frequency signal to be transmitted, which has a predetermined frequency band.

Receiving amplifier circuits 261, 262, 263, and 264 are low-noise amplifiers each of which amplifies power of a received radio frequency signal having a predetermined frequency band.

RF signal processing circuit (RFIC) 7 processes radio frequency signals transmitted and received by antenna element 5. Specifically, RF signal processing circuit (RFIC) 7 processes a radio frequency signal (here, a radio frequency signal received) input through a receiver signal path from antenna element 5 by down-conversion, for instance, and outputs a received signal generated by being processed to baseband signal processing circuit (BBIC) 8. RF signal processing circuit (RFIC) 7 processes a signal to be transmitted which is input from baseband signal processing circuit (BBIC) 8 by up-conversion, for instance, and outputs a radio frequency signal (here, a radio frequency signal to be transmitted) generated by being processed to a transmitter signal path.

Communication device 9 having such a configuration includes the filter according to one of Embodiments 1 to 5 as at least one of the filters each having one of passbands (i-Tx) to (x) above.

Note that out of the elements in communication device 9, switch group 210, filter group 220, transmitter switch 231, receiver switches 251, 252, and 253, switches 271 and 272, transmission amplifier circuits 241, 242, and 243, receiving amplifier circuits 261, 262, 263, and 264, and the controller are included in radio frequency front-end circuit 6. Switch group 210 and filter group 220 are included in a multiplexer. Note that the multiplexer according to the present disclosure may have a configuration in which filter group 220 is connected to a common terminal through switch group 210 as in the present embodiment, or a plurality of filters according to Embodiments 1 to 5 are directly connected to a common terminal.

Here, although not illustrated in FIG. 34, the controller may be included in the RF signal processing circuit (RFIC) or constitute a switch IC together with, for instance, the switches that the controller controls.

According to radio frequency front-end circuit 6 and communication device 9 having such configurations, the filter according to one of Embodiments 1 to 5 above is included, and thus the radio frequency front-end circuit and the communication device in each of which a ripple (insertion loss deviation) in a passband is decreased, loss is reduced, and the bandwidth is increased can be achieved.

Radio frequency front-end circuit 6 according to the present embodiment includes transmitter switch 231 and receiver switches 251, 252, and 253, and switches 271 and 272 (switch circuits) disposed upstream/downstream of filter group 220 (radio frequency filters). Accordingly, portions of signal paths through which radio frequency signals are conveyed can be shared. Thus, for example, transmission amplifier circuits 241, 242, and 243 and receiving amplifier circuits 261, 262, 263, and 264 (amplifier circuits) for radio frequency filters can be shared. Consequently, the radio frequency front-end circuit can be miniaturized, and cost therefor can be reduced.

Note that it is sufficient if at least one of the switches, namely transmitter switch 231, receiver switches 251, 252, and 253, and switches 271 and 272, is included. The number of transmitter switches and the number of receiver switches are not limited to the numbers in the above description and, for example, one transmitter switch and one receiver switch may be provided. Also, the number of selection terminals of a transmitter switch and the number of selection terminals of a receiver switch, for instance, are not limited to the numbers in the present embodiment, and the transmitter switch and the receiver switch may each include two selection terminals.

Other Embodiments

The above has described the radio frequency filter, the multiplexer, the radio frequency front-end circuit, and the communication device according to the present disclosure, using Embodiments 1 to 6, yet the present disclosure is not limited to the above embodiments. The present disclosure also encompasses another embodiment achieved by combining arbitrary elements in the above embodiments, variations as a result of applying, to the embodiments, various modifications that may be conceived by those skilled in the art without departing from the scope of the present disclosure, and various devices that include the radio frequency filter, the multiplexer, the radio frequency front-end circuit, and the communication device according to the present disclosure.

For example, Embodiments 1 to 6 above have described examples in which the LTE Band 3 receiving passband (1805 to 1880 MHz) is applied to the second band, the LTE Band 39 passband (1880 to 1920 MHz) is applied to the third band, and a band (1805 to 1920 MHz) that includes the Band 3 receiving passband and the Band 39 passband is applied to the first band, but the present disclosure is not limited thereto.

The LTE Band 28A receiving passband (758 to 788 MHz) may be applied to the second band, the LTE Band 20 receiving passband (791 to 821 MHz) may be applied to the third band, and a band (758 to 821 MHz) that includes the Band 28A receiving passband and the Band 20 receiving passband may be applied to the first band.

The LTE Band 38 passband (2570 to 2620 MHz) may be applied to the second band, the LTE Band 7 receiving passband (2620 to 2690 MHz) may be applied to the third band, and a band (2570 to 2690 MHz) that includes the Band 38 passband and the Band 7 receiving passband may be applied to the first band.

Each of the series-arm resonators and the parallel-arm resonators included in the filters may not be limited to a single resonator, but may be achieved by a plurality of split resonators obtained by splitting one resonator.

The phase shifters described in Embodiments 1 to 6 also have an impedance conversion function in addition to the phase shifting function, and may be read as an "impedance converter".

For example, the controller may be disposed outside RF signal processing circuit (RFIC) 7, and may be disposed in radio frequency front-end circuit 6, for example. Specifically, the configuration of radio frequency front-end circuit 6 is not limited to the configuration described above, and may include a radio frequency filter according to any of Embodiments 1 to 5, and a controller that controls on and off of a switch element included in the radio frequency filter.

For example, in radio frequency front-end circuit 6 or communication device 9, an inductor or a capacitor may be connected between elements. Note that the inductor may include a line inductor achieved by a line that connects elements.

Examples of the switch elements included in the radio frequency filter according to one of Embodiments 1 to 5 include a field effect transistor (FET) switch made of GaAs or complementary metal oxide semiconductor (CMOS), and a diode switch. Such switches are small, and thus the radio frequency filters according to Embodiments 1 to 5 can be miniaturized.

The series-arm resonator and the parallel-arm resonator included in the radio frequency filter according to Embodiments 1 to 5 are acoustic wave resonators that use acoustic waves and, for example, are resonators that use surface acoustic waves (SAWs), resonators that use bulk acoustic waves (BAWs), and film bulk acoustic resonators (FBARs), for instance. Note that SAWs include not only surface waves, but also boundary waves. Furthermore, parallel-arm resonators may be resonators or circuits represented by equivalent circuit models (such as Butterworth Van-Dyke (BVD) models, for example) that include inductance components and capacitance components, and may be resonators or circuits having resonant and antiresonant frequencies.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a low-loss filter having a wide bandwidth, a multiplexer, a front-end circuit, and a communication device.

The invention claimed is:

1. A radio frequency filter having a first passband, the radio frequency filter comprising:
a first circuit connected to a first node disposed on a path that connects a first input/output terminal and a second input/output terminal, and a second node disposed between the first node on the path and the second input/output terminal; and
a second circuit connected to the first node and the second node, wherein
the first circuit includes a first filter having a second passband that includes a portion of a frequency range of the first passband and a bandwidth narrower than a bandwidth of the first passband, and the second circuit includes
a second filter having a third passband that includes a portion of a frequency range of the first passband and has a bandwidth narrower than the bandwidth of the first passband, wherein the second passband and the third passband at least partially overlap;
a first phase shifter connected to a first terminal of the second filter; and
a second phase shifter connected to a second terminal of the second filter,
wherein when the second circuit is viewed from at least one of the first node or the second node, a phase shift caused by the first phase shifter and a phase shift caused by the second phase shifter are adjusted to include, in a range from a lower edge frequency of the second passband to a lower cutoff frequency of the second passband, a frequency at which impedance is highest out of frequencies at singular points at each of which the second circuit has local maximum impedance.

2. The radio frequency filter of claim 1, wherein the third passband has a higher frequency range than a center frequency of the second passband.

3. The radio frequency filter of claim 2, wherein a phase shift caused by the first phase shifter and a phase shift caused by the second phase shifter are adjusted to cause a sum total to be at least 312° and at most 362° at a lower edge frequency of the third passband, the sum total being a total of (i) a difference between a phase shift caused by the first filter and a phase shift caused by the second filter and (ii) a sum of the phase shift caused by the first phase shifter and the phase shift caused by the second phase shifter.

4. The radio frequency filter according to claim 1, wherein when the second circuit is viewed from at least one of the first node or the second node, the second passband includes at least one frequency at which a phase shift caused by the first circuit and a phase shift caused by the second circuit are identical, and the third passband includes at least one frequency at which a phase shift caused by the first circuit and a phase shift caused by the second circuit are identical.

5. The radio frequency filter of claim 1, wherein the path includes
a first path that extends through the first node, the first circuit, and the second node; and
a second path that extends through the first node, the second circuit, and the second node,
the first filter includes
a first series-arm circuit disposed on the first path; and
a first parallel-arm circuit connected to a node on the first path and a ground,
the second filter includes
a second series-arm circuit disposed on a portion of the second path that connects the first phase shifter and the second phase shifter; and
a second parallel-arm circuit connected to a node on the portion of the second path and the ground,
one or more of the first series-arm circuit, the first parallel-arm circuit, the second series-arm circuit, and the second parallel-arm circuit include one or more acoustic wave resonators,
at least one of the one or more acoustic wave resonators includes
an interdigital transducer (IDT) electrode formed on a piezoelectric substrate; and
a reflector, and
when λ denotes a wavelength of an acoustic wave determined by a cyclic pattern of the IDT electrode in the at least one of the one or more acoustic wave resonators, a pitch between the IDT electrode and the reflector is at least 0.42λ and less than 0.50λ.

6. The radio frequency filter of claim 1, wherein
the first circuit further includes
a first switch element connected between the first node and the first filter; and
a second switch element connected between the second node and the first filter, and
the first passband and the third passband are switched by switching between conducting and non-conducting states of the first switch element and the second switch element.

7. The radio frequency filter of claim 6, wherein
the first circuit further includes
a third switch element connected between a ground and a connection node between the first switch element and the first filter; and
a fourth switch element connected between the ground and a connection node between the second switch element and the first filter,
the first switch element and the third switch element are switched between conducting and non-conducting states mutually exclusively from each other, and
the second switch element and the fourth switch element are switched between conducting and non-conducting states mutually exclusively from each other.

8. The radio frequency filter of claim 1, wherein
the second circuit further includes
a first switch element connected between the first node and the first phase shifter; and
a second switch element connected between the second node and the second phase shifter, and
the first passband and the second passband are switched by switching between conducting and non-conducting states of a fifth switch element and a sixth switch element.

9. The radio frequency filter according to claim 8, wherein
the second circuit further includes
a third switch element connected between a ground and a connection node between the first switch element and the first phase shifter; and
a fourth switch element connected between the ground and a connection node between the second switch element and the second phase shifter,
the first switch element and the third switch element are switched between conducting and non-conducting states mutually exclusively from each other, and
the second switch element and the fourth switch element are switched between conducting and non-conducting states mutually exclusively from each other.

10. The radio frequency filter of claim 8, further comprising:
a third circuit connected to the first node and the second node, wherein the third circuit includes
a third filter having a fourth passband that includes a portion of a frequency range of a fifth passband that is different from the first passband, has a bandwidth narrower than a bandwidth of the fifth passband, and is different from the third passband;
a third phase shifter connected to a first terminal of the third filter; and
a fourth phase shifter connected to a second terminal of the third filter.

11. The radio frequency filter of claim 10, wherein
the fourth passband has a higher frequency range than a center frequency of the second passband.

12. The radio frequency filter of claim 1, wherein the first phase shifter is one of:
a low-pass filter circuit that includes one or more inductors disposed on a series-arm path that connects the first node and the first terminal of the second filter, and a capacitor connected between a node on the series-arm path and a ground; and
a high-pass filter circuit that includes one or more capacitors disposed on the series-arm path, and an inductor connected to a node on the series-arm path and the ground.

13. The radio frequency filter of claim 1, wherein the second phase shifter is one of:
a low-pass filter circuit that includes one or more inductors disposed on a series-arm path that connects the second node and the second terminal of the second filter, and a capacitor connected to a node on the series-arm path and a ground; and
a high-pass filter circuit that includes one or more capacitors disposed on the series-arm path, and an inductor connected to a node on the series-arm path and the ground.

14. The radio frequency filter of claim 1, wherein
the first phase shifter and the second phase shifter are impedance elements each including at least one of a capacitor or an inductor.

15. The radio frequency filter of claim 14, wherein
at least one of the first filter or the second filter includes a longitudinally coupled resonator.

16. The radio frequency filter of claim 15, wherein
a phase shift caused by the first phase shifter is different from a phase shift caused by the second phase shifter.

17. The radio frequency filter of claim 1, wherein
at least one of the first filter or the second filter includes
 a series-arm circuit disposed on a portion of the path that connects the first node and the second node; and
 a parallel-arm circuit connected to a node on the portion of the path and a ground,
at least one of the series-arm circuit or the parallel-arm circuit includes a resonator and a switch element, and
at least one of a resonant frequency or an antiresonant frequency of at least one of the series-arm circuit or the parallel-arm circuit is switched to another frequency by switching between conducting and non-conducting states of the switch element.

18. The radio frequency filter of claim 1, wherein
at least one of the first filter or the second filter is one of a surface acoustic wave filter, a boundary acoustic wave filter, and an acoustic wave filter that uses a bulk acoustic wave (BAW).

19. A radio frequency filter having a first passband, the radio frequency filter comprising:
 a first circuit connected to a first node disposed on a path that connects a first input/output terminal and a second input/output terminal, and a second node disposed between the first node on the path and the second input/output terminal; and
 a second circuit connected to the first node and the second node, wherein
 the first circuit includes a first filter having a second passband that includes a portion of a frequency range of the first passband and a bandwidth narrower than a bandwidth of the first passband, and the second circuit includes
  a second filter having a third passband that includes a portion of a frequency range of the first passband and has a bandwidth narrower than the bandwidth of the first passband, wherein the second passband and the third passband at least partially overlap;
  a first phase shifter connected to a first terminal of the second filter; and
  a second phase shifter connected to a second terminal of the second filter,
 wherein when the second circuit is viewed from at least one of the first node or the second node, the second passband includes at least one frequency at which a phase shift caused by the first circuit and a phase shift caused by the second circuit are identical, and the third passband includes at least one frequency at which a phase shift caused by the first circuit and a phase shift caused by the second circuit are identical.

20. A radio frequency filter having a first passband, the radio frequency filter comprising:
 a first circuit connected to a first node disposed on a path that connects a first input/output terminal and a second input/output terminal, and a second node disposed between the first node on the path and the second input/output terminal; and
 a second circuit connected to the first node and the second node, wherein
 the first circuit includes a first filter having a second passband that includes a portion of a frequency range of the first passband and a bandwidth narrower than a bandwidth of the first passband, and the second circuit includes
  a second filter having a third passband that includes a portion of a frequency range of the first passband and has a bandwidth narrower than the bandwidth of the first passband, wherein the second passband and the third passband at least partially overlap;
  a first phase shifter connected to a first terminal of the second filter; and
  a second phase shifter connected to a second terminal of the second filter,
 wherein the third passband has a higher frequency range than a center frequency of the second passband,
 wherein a phase shift caused by the first phase shifter and a phase shift caused by the second phase shifter are adjusted to cause a sum total to be at least 312° and at most 362° at a lower edge frequency of the third passband, the sum total being a total of (i) a difference between a phase shift caused by the first filter and a phase shift caused by the second filter and (ii) a sum of the phase shift caused by the first phase shifter and the phase shift caused by the second phase shifter.

* * * * *